(12) United States Patent
Takita et al.

(10) Patent No.: US 7,668,675 B2
(45) Date of Patent: Feb. 23, 2010

(54) SEMICONDUCTOR INTEGRATED CIRCUIT AND INFORMATION PROCESSING SYSTEM

(75) Inventors: Toshio Takita, Osaka (JP); Jun Ogawa, Kyoto (JP); Yoshihiro Tamura, Kyoto (JP)

(73) Assignee: Panasonic Corporation, Osaka (JP)

( * ) Notice: Subject to any disclaimer, the term of this patent is extended or adjusted under 35 U.S.C. 154(b) by 4 days.

(21) Appl. No.: 12/129,179

(22) Filed: May 29, 2008

(65) Prior Publication Data

US 2008/0297202 A1 Dec. 4, 2008

(30) Foreign Application Priority Data

Jun. 1, 2007 (JP) .............................. 2007-147048

(51) Int. Cl.
*G01R 25/04* (2006.01)
(52) U.S. Cl. .............................. 702/79; 702/78; 702/81; 702/82
(58) Field of Classification Search .................... 702/63, 702/64, 79–81, 117, 124, 125, 176–178, 702/182, 183; 318/490; 326/80; 713/300, 713/500

See application file for complete search history.

(56) References Cited

U.S. PATENT DOCUMENTS

| 6,675,311 | B2 * | 1/2004 | Hotta et al. ................. 713/500 |
| 6,754,840 | B2 | 6/2004 | Poisner |
| 7,065,668 | B2 * | 6/2006 | Kosuda et al. .............. 713/500 |
| 7,467,307 | B2 * | 12/2008 | Kano ........................ 713/300 |

FOREIGN PATENT DOCUMENTS

JP  3-95606  4/1991

* cited by examiner

*Primary Examiner*—Eliseo Ramos Feliciano
*Assistant Examiner*—Felix E Suarez
(74) *Attorney, Agent, or Firm*—McDermott Will & Emery LLP

(57) ABSTRACT

In a semiconductor integrated circuit, a counter counts the number of high-speed clock signals that have been generated in a predetermined number of clock cycles of a low-speed clock signal. In synchronization with the low-speed clock signal, the semiconductor integrated circuit compares the counter value and a predetermined value, and judges whether the frequency of the high-speed clock signal has reaches a predetermined frequency. Since variations in the frequency become smaller as the oscillation of a high-speed oscillator stabilizes, the semiconductor integrated circuit detects that the oscillation is stable when the semiconductor integrated circuit has judged affirmatively a plurality of times.

29 Claims, 19 Drawing Sheets

SEMICONDUCTOR INTEGRATED CIRCUIT AND INFORMATION PROCESSING SYSTEM

This application is based on application No. 2007-147048 filed in Japan, the content of which is hereby incorporated by reference.

BACKGROUND OF THE INVENTION

1. Field of the Invention

The present invention relates to technology for early detection of the stable generation of a high-speed clock signal by a high-speed oscillator.

2. Description of the Related Art

Currently, information processing systems that switch between a high-speed clock signal and a low-speed clock signal while operating in order to reduce power consumption are widely used. Specifically, such information processing systems have two operation modes, namely, a normal mode and a standby mode. Normal mode is a mode in which in the information processing system operates with use of a high-speed clock signal supplied by a high-speed oscillator. Standby mode is a mode in which the information processing system stops the oscillation of the high-speed oscillator, and operates with use of a low-speed clock signal supplied by a low-speed oscillator.

When switching from standby mode to normal mode, this kind of information processing system must first detect that the oscillation of the high-speed oscillator is stable, that is to say, that the amplitude and frequency of the high-speed clock signal generated by the high-speed oscillator are stable, before completing the switch to normal mode. This is because if the information processing system operates with use of the high-speed clock signal while the oscillation of the high-speed oscillator is not stable, there will be problems such as the information processing system running out of control since an unstable high-speed clock signal is being supplied.

In view of this, there is conventional technology for detecting that the oscillation of the high-speed oscillator is stable by preliminarily estimating the number of high-speed clock signals that are generated before the oscillation becomes stable, and presuming that the oscillation has stabilized once the high-speed oscillator has generated a sufficient number of high-speed clock signals. For example, the high-speed clock signals generated by the high-speed oscillator are successively input to a counter. After the counter has counted a predetermined number of high-speed clock signal inputs, the information processing system completes the switch to normal mode.

However, due to manufacturing variations etc., high-speed oscillators differ between each other in how high-speed clock signals are generated before the oscillation stabilizes. Examples of such differences include the period of time before oscillation stabilizes, and how the frequency of the high-speed clock signal increases before oscillation stabilizes. Also, external factors such as heat can delay the stabilization of the oscillation of the high-speed oscillator.

In view of this, patent document 1 discloses technology for counting only high-speed clock signals whose amplitudes are stable, instead of counting all of the high-speed clock signals that have been generated. Specifically the technology of patent document 1 includes a semiconductor that only passes signals whose amplitude is greater than or equal to a predetermined threshold value, and makes use of the semiconductor to count the number of signals whose amplitude surpasses the threshold value, that is to say, the number of high-speed clock signals whose amplitude is stable.

Patent document 1: Japanese Patent Application Publication No. H03-95606

However, the technology of patent document 1 lacks reliability in the precision of the detection. This is because the technology of patent document 1 cannot actually detect that the frequency of a high-speed clock signal has stabilized. In other words, the fact that a predetermined number of high-speed clock signals has been counted does not necessarily mean that the frequency of the high-speed clock signal has stabilized when the predetermined number is reached. Therefore, there is the risk that the technology of patent document 1 will falsely detect that the oscillation of the high-speed oscillator is stable, even though the frequency of the high-speed clock signal has not actually stabilized.

Also, when a high-speed oscillator begins oscillating, the frequencies of the generated high-speed clock signals rise above and fall below the predetermined frequency of a stable high-speed clock signal, as they gradually converge to the predetermined frequency. Therefore, the fact that the frequency of a generated high-speed clock signal has reached a predetermined frequency does not necessarily mean that the oscillation of the high-speed oscillator has stabilized.

The technology of patent document 1 does not detect that the frequency of the high-speed clock is stable until the predetermined number of clock pulses is counted by the counter, even if the oscillation of the high-speed oscillator has already stabilized. Therefore, even if the frequency of the high-speed clock signal has stabilized, the information processing system cannot switch to normal mode until the predetermined number of clock pulses is counted, thereby causing unnecessary power consumption and delaying the beginning of operation with use of the high-speed clock signal. Particularly in cases in which an information processing system frequently switches between standby mode and normal mode during operation, such as the case of a wireless communication device that performs intermittent reception, there is a desire to minimize the negative effect on battery lifetime that unnecessary power consumption has, the production of heat that accompanies unnecessary power consumption, the delay in processing commencement, etc.

SUMMARY OF THE INVENTION

In view of the above problems, an aim of the present invention is to provide technology for improving reliability in detecting that a high-speed clock signal is being stably generated by a high-speed oscillator, that is to say, provide a semiconductor integrated circuit that performs highly reliable detection and an information processing system including an oscillation stability detector that performs highly reliable detection.

In order to achieve the above aim, the present invention is a semiconductor integrated circuit for detecting that a high-speed clock signal is being stably generated, including: a reception unit operable to periodically receive the high-speed clock signal and a low-speed clock signal; an oscillation cycle judgment unit operable to, each time the low-speed clock signal has been received a predetermined number of times by the reception unit, judge whether a number of times that the high-speed clock signal has been received by the reception unit in a predetermined time period is in a predetermined range, the predetermined time period being based on a reception period during which the low-speed clock signal was received the predetermined number of times; and a signal output unit operable to control output of a stability detection signal in accordance with a number of times that the oscillation cycle judgment unit has judged affirmatively.

Since the frequency of a clock signal refers to how many clock pulses are generated per unit of time, the frequency of the high-speed clock signal is considered to have stabilized when the high-speed clock signal has been generated a predetermined number of times in a predetermined time period.

In the semiconductor integrated circuit having the above structure, the oscillation cycle judgment unit judges whether the number of times that the high-speed clock signal has been generated in the predetermined time period is in the predetermined range. If the number of times is in the predetermined range, the high-speed clock signal is being generated at a predetermined frequency. Therefore, the above structure enables detecting that the frequency of the high-speed clock signal has stabilized, and improving the reliability of detections over conventional technology.

Also, the semiconductor integrated circuit having the above structure includes the signal output unit. The signal output unit outputs the stability detection signal based on the number of times that the oscillation cycle judgment unit has judged affirmatively. The semiconductor integrated circuit can therefore take into consideration whether the frequencies of the high-speed clock signal have converged, when outputting the stability detection signal.

Furthermore, according to the above structure, the predetermined time period for counting the number of times high-speed clock signal has been generated is determined based on the reception interval of the low-speed clock signal. Since the low-speed clock signal is already being stably generated by a low-speed oscillator, the reception interval of the low-speed clock signal is substantially constant. The length of the predetermined time period in the present invention is therefore kept substantially constant. Since the length of the predetermined time period does not vary greatly each time detection processing is performed, detection precision is not affected by manufacturing variations etc. of the high-speed oscillator, or the way in which the high-speed oscillator oscillates.

Also, as described above, the predetermined time period is determined based on the reception interval of the low-speed clock signal. In other words, since the predetermined time period is determined based on the actual reception interval of the received low-speed clock signal, there is no need for a circuit to acquire and store information such as the frequency and clock cycle of the low-speed clock signal in order to determine the predetermined time period. The elimination of the need for such a circuit enables reducing the size of the semiconductor integrated circuit for performing detection, and reduces manufacturing cost.

In conventional technology, in anticipation of a worst case scenario in which the oscillation does not stabilize quickly, the size of the counter for counting the number of times that the high-speed clock signal has been generated must be made large in order to have some amount of leeway. According to the technology of patent document 1, the size of the counter can be reduced since only high-speed clock signals whose amplitude has stabilized are counted. However, the technology of patent document 1 ultimately performs detection by presuming that the oscillation of the high-speed oscillator has stabilized when the high-speed clock signal has been input a predetermined number of times. Such technology therefore still must take into consideration a worst case scenario in which the oscillation does not stabilize quickly, and must have a somewhat large-size counter, which makes reducing the size of the semiconductor integrated circuit difficult.

In view of this, the oscillation cycle judgment unit may include: a counter number setting storage subunit storing therein a set value; a high-speed clock counter operable to count the number of times that the high-speed clock signal has been received by the reception unit in the predetermined time period to generate a high-speed clock counter value; and an oscillation cycle comparison subunit operable to perform the judgment of whether the number of times that the high-speed clock signal has been received by the reception unit in the predetermined time period is in the predetermined range, based on the high-speed clock counter value and the set value.

According to the above structure, the predetermined number of times that is to be counted by the high-speed clock counter is determined based on the length of the predetermined time period and the frequency of the high-speed clock signal when being stably generated. The frequency of the high-speed clock signal when being stably generated is normally known in advance. Since the size of the high-speed clock counter is determined as described above in the present invention, there is no need to have a large-size counter in order to have leeway in consideration of manufacturing variations etc. as in the technology of patent document 1. The present invention therefore facilitates a reduction in the size of the semiconductor integrated circuit.

The above structure may also be as follows.

The oscillation cycle comparison subunit may be further operable to compare a predetermined value and a difference between the high-speed clock counter value and the set value, and if the difference is less than or equal to the predetermined value, the oscillation cycle comparison subunit may judge that the number of times that the high-speed clock signal has been received by the reception unit in the predetermined time period is in the predetermined range. Also, the counter number setting storage subunit may be a register.

According to the above structure, the oscillation cycle comparison subunit can perform judging by the simple operation of acquiring a difference between values and comparing the difference with a predetermined value, thereby eliminating the need for a circuit to perform a complicated operation for judging. The present invention therefore enables reducing the scale of the semiconductor integrated circuit.

Also, the signal output unit may output the stability detection signal if a number of times that the oscillation cycle judgment unit judged affirmatively has reached a fixed number.

When the high-speed oscillator begins oscillating, the frequencies of the generated high-speed clock signal gradually converge to the predetermined frequency. The above structure further increases the reliability of detection by detecting that the frequency of the high-speed clock signal has stabilized if the number of affirmative judgments that the high-speed clock signal is being generated at the predetermined frequency is greater than or equal to a fixed number. Note that if the stabilization of the oscillation of the high-speed oscillator is relatively slow, the fixed number may be set relatively higher. In other words, the fixed number is desirably set flexibly, according to the time period required for stabilization.

Also, according to the above structure, the oscillation cycle judgment unit performs the oscillation cycle judgment when the low-speed clock signal is received the predetermined number of times. This enables early detection of the fact that the frequency of the high-speed clock signal has stabilized when the oscillation of the high-speed oscillator has stabilized. In other words, the present invention enables increasing the possibility of an early detection and reducing power consumption over the technology of patent document 1, and enables operation with use of the high-speed clock signal to begin earlier.

The above semiconductor integrated circuit may be as follows.

The oscillation cycle judgment unit may include: an oscillation cycle comparison subunit operable to perform the judgment of whether the number of times that the high-speed clock signal has been received by the reception unit in the predetermined time period is in the predetermined range, and output an oscillation cycle match signal upon judging affirmatively, and the signal output unit may include: a match counter operable to receive the oscillation cycle match signal output from the oscillation cycle comparison subunit, and count a number of times that the oscillation cycle match signal has been received to generate a match counter value; a judgment number setting storage subunit storing therein a judgment number value; and an oscillation stability judgment subunit operable to compare the match counter value and the judgment number value, and perform the output of the stability detection signal if the match counter value is greater than or equal to the judgment number value.

Also, the oscillation cycle judgment unit may further include: a counter number setting storage subunit storing therein a set value; and a high-speed clock counter operable to count the number of times that the high-speed clock signal has been received by the reception unit in the predetermined time period to generate a high-speed clock counter value, wherein each time the low-speed clock signal has been received the predetermined number of times by the reception unit, the oscillation cycle comparison subunit may perform the judgment of whether the number of times that the high-speed clock signal has been received by the reception unit in the predetermined time period is in the predetermined range, based on the high-speed clock counter value and the set value, and output the oscillation cycle match signal upon judging affirmatively.

Using the counter etc. in this way enables the semiconductor integrated circuit to have a simple structure and reduces manufacturing cost.

When detecting that the oscillation has stabilized upon the oscillation cycle comparison subunit outputting the oscillation cycle match signal a predetermined number of times or more, if the time period during which the oscillation of the high-speed oscillator is unstable is relatively long or longer than normal, there is a possibility of the oscillation being detected as having stabilized even though it has not actually stabilized. In other words, the fact that the oscillation cycle match signal has been output the predetermined number of times does not necessarily mean that the oscillation of the high-speed oscillator has stabilized.

In view of this, the above structure may also be as follows.

In the above semiconductor integrated circuit, the oscillation cycle judgment unit may include: an oscillation cycle comparison subunit operable to perform the judgment of whether the number of times that the high-speed clock signal has been received by the reception unit in the predetermined time period is in the predetermined range, output an oscillation cycle match signal upon judging affirmatively, and output an oscillation cycle mismatch signal upon judging negatively, and the signal output unit may include: a match counter operable to receive the oscillation cycle match signal and the oscillation cycle mismatch signal, and each time a signal is received, one of increment and decrement a match counter value in accordance with which of the oscillation cycle match signal and the oscillation cycle mismatch signal was received; a judgment number setting storage subunit storing therein a judgment number value; and an oscillation stability judgment subunit operable to compare the match counter value and the judgment number value, and control the output of the stability detection signal based on a result of the comparison.

According to the above structure, while the oscillation of the high-speed oscillator has not stabilized, both oscillation cycle match signals and oscillation cycle mismatch signals are output from the oscillation cycle comparison subunit. The match counter increases and decreases the match counter value according to which of the signals is output from the oscillation cycle comparison subunit. Therefore, if the oscillation of the high-speed oscillator is unstable, the match counter value of the match counter is repeatedly increased and decreased. When the oscillation of the high-speed oscillator stabilizes, the oscillation cycle match signal is continuously output and the match counter value is continuously either increased or decreased, and ultimately, the oscillation stability judgment subunit outputs the stability detection signal as a result of the comparison. In other words, the above structure enables reducing the risk of detecting that the oscillation of the high-speed oscillator has stabilized even though it actually has not.

In this case, the above structure may be as follows.

The match counter may increment the match counter value upon receiving the oscillation cycle match signal, and decrement the match counter value upon receiving the oscillation cycle mismatch signal, and the oscillation stability judgment subunit may compare the match counter value and the judgment number value, and perform the output of the stability detection signal if the match counter value has reached the judgment number value.

Also, the oscillation cycle judgment unit may further include: a counter number setting storage subunit storing therein a set value; and a high-speed clock counter operable to count the number of times that the high-speed clock signal has been received by the reception unit in the predetermined time period to generate a high-speed clock counter value, wherein each time the low-speed clock signal has been received the predetermined number of times by the reception unit, the oscillation cycle comparison subunit may (i) perform the judgment of whether the number of times that the high-speed clock signal has been received by the reception unit in the predetermined time period is in the predetermined range, based on the high-speed clock counter value and the set value, (ii) output the oscillation cycle match signal upon judging affirmatively, and (iii) output the oscillation cycle mismatch signal upon judging negatively.

This structure enables raising the reliability of detection performed by the semiconductor integrated circuit.

Also, in order to further improve the precision of detection, the present invention may be as follows.

The present invention is also a semiconductor integrated circuit for detecting that a high-speed clock signal is being stably generated, including: a reception unit operable to periodically receive the high-speed clock signal and a low-speed clock signal; an oscillation cycle judgment unit operable to, each time the low-speed clock signal has been received a predetermined number of times by the reception unit, judge whether a number of times that the high-speed clock signal has been received by the reception unit in a predetermined time period is in a predetermined range, the predetermined time period being based on a reception period during which the low-speed clock signal was received the predetermined number of times; an oscillation stability judgment unit operable to (i) each time the low-speed clock signal has been received the predetermined number of times by the reception unit, store, as a stored value in a history, a number of times that the high-speed clock signal was received by the reception unit in the predetermined time period, and (ii) judge whether the numbers of times indicated in the history satisfy a predetermined condition; and a signal output unit operable to output a stability detection signal if both the oscillation cycle judgment unit and the oscillation stability judgment unit judged affirmatively.

If the number of times that the high-speed clock signal was received is in the predetermined range, the frequency of the generated high-speed clock signal is in a predetermined range. However, the fact that the frequency of the generated high-speed clock signal is in a predetermined range does not necessary mean that the frequency of the high-speed clock signal has stabilized. There are cases in which there is a large amount of variation in the frequency.

In contrast, according to the semiconductor integrated circuit having the above structure, the oscillation stability judgment unit stores a history of the number of times that the high-speed clock signal has been received in the predetermined time period, thereby enabling the semiconductor integrated circuit to know whether the amount of variation between the number of clock pulses in each predetermined time period is large or small. In other words, the above structure enables detecting that the frequency of the high-speed clock signal is in a predetermined range, and furthermore that the amount of variation in the frequency is large or small, thereby further improving detection reliability over conventional technology and enabling earlier detection.

In the above structure, the oscillation stability judgment unit may make the judgment according to the following.

The predetermined condition may be that a difference between a pair of numbers of times indicated in the history is less than or equal to a predetermined value.

Specifically, the above structure may be as follows.

The oscillation stability judgment unit may include: a high-speed clock history storage subunit operable to, each time the low-speed clock signal has been received the predetermined number of times by the reception unit, perform the storing of, as a stored value in the history, a number of times that the high-speed clock signal was received by the reception unit in the predetermined time period; and a difference judgment subunit operable to judge whether a difference between (i) a first stored value stored in the high-speed clock history subunit and (ii) a second stored value stored in the high-speed clock history subunit prior to the first stored value is less than or equal to the predetermined value, and the signal output unit may output the stability detection signal if both the difference judgment subunit and the oscillation cycle judgment unit judge affirmatively.

Also, the above semiconductor integrated circuit may further include: a high-speed clock counter operable to count the number of times that the high-speed clock signal has been received by the reception unit in the predetermined time period to generate a high-speed clock counter value, wherein the high-speed clock history storage subunit may perform the storing by, each time the low-speed clock signal has been received the predetermined number of times by the reception unit, acquiring the high-speed clock counter value of the high-speed clock counter, and storing the acquired high-speed clock counter value as a stored value in the history.

According to this structure, the difference judgment subunit can perform a judgment by the simple operation of calculating a difference between values and comparing the calculated difference and a predetermined value, thereby eliminating the need for a circuit that performs a complicated operation for judging. This structure enables reducing the size of the semiconductor integrated circuit.

In order to further improve the precision of detection, the present invention may be as follows.

The present invention is also a semiconductor integrated circuit for detecting that a high-speed clock signal is being stably generated, including: a reception unit operable to periodically receive the high-speed clock signal and a low-speed clock signal; an oscillation cycle judgment unit operable to, each time the low-speed clock signal has been received a predetermined number of times by the reception unit, judge whether a number of times that the high-speed clock signal has been received by the reception unit in a predetermined time period is in a predetermined range, the predetermined time period being based on a reception period during which the low-speed clock signal was received the predetermined number of times; a low-speed clock counter operable to count a number of times that the low-speed clock signal has been received by the reception unit to generate a low-speed clock counter value; a low-speed clock history storage unit operable to, each time the oscillation cycle judgment unit judges affirmatively, acquire the low-speed clock counter value of the low-speed clock counter at a timing of the affirmative judgment, and store the acquired low-speed clock counter value in a history; a low-speed clock history judgment unit operable to, with reference to the history stored in the low-speed clock history storage unit, judge whether each of a plurality of low-speed clock counter values in the history satisfies a predetermined condition; and a signal output unit operable to output a stability detection signal if a number of times that the low-speed clock history judgment unit judged affirmatively has reached a fixed number.

The above structure may be as follows.

The predetermined condition may be that a difference between (i) a first counter value stored in the low-speed clock history subunit and (ii) a second counter value stored in the low-speed clock history subunit prior to the first counter value is less than or equal to a predetermined value.

When the oscillation of the high-speed oscillator stabilizes, the oscillation cycle judgment unit repeatedly judges affirmatively. Therefore, the number of times that the low-speed clock signal has been received is counted and stored in the history each time the oscillation cycle judgment unit judges affirmatively, and as the oscillation of the high-speed oscillator stabilizes, the differences between the values stored in the history gradually decrease.

For example, if two numbers of times that the low-speed clock signal has been received are stored in the history, when the oscillation of the high-speed clock signal stabilizes, the difference between the two numbers stored in the history will approach 1.

Accordingly, the semiconductor integrated circuit having the above structure stores a history of the number of times that the low-speed clock signal has been received, thereby further improving detection reliability over conventional technology. Also, the above structure includes a low-speed clock counter for counting the number of times that the low-speed clock counter has been received, thereby eliminating the need for a large-size counter. In other words, the above structure enables reducing circuit size while improving detection reliability.

Besides improving operational stability, it is also important to reduce the power consumption of information processing systems.

In view of this, the above semiconductor integrated circuit may further include: a low-speed clock counter operable to count a number of times that the low-speed clock signal has been received by the reception unit after a predetermined timing pertaining to a beginning of operation of the semiconductor integrated circuit, to generate a low-speed clock counter value; an oscillation stabilization timing storage unit storing therein a judgment commencement value; and a start-up timing control unit operable to suppress the judgment performed by the oscillation cycle judgment unit, until the low-speed clock counter value reaches the judgment commencement value.

The above technology for raising detection reliability based on a history the low-speed clock signal may have the following structure.

The low-speed clock counter may count a number of times that the low-speed clock signal has been received by the reception unit after a predetermined timing pertaining to a beginning of operation of the semiconductor integrated circuit, to generate a low-speed clock counter value, and the semiconductor integrated circuit may further include: an oscillation stabilization timing storage unit storing therein a judgment commencement value; and a start-up timing control unit operable to suppress the judgment performed by the oscillation cycle judgment unit, until the low-speed clock counter value reaches the judgment commencement value The above structure enables controlling, with use of the judgment commencement value, the beginning of operation of the oscillation cycle judgment unit after the semiconductor integrated circuit has begun operating. If the approximate period of time from when the high-speed oscillator begins oscillating until the oscillation stabilizes is known in advance, the judgment commencement value may be adjusted so that the beginning of the oscillation cycle judgment performed by the oscillation cycle judgment unit is delayed by the known period of time, thereby reducing the operation time of the oscillation cycle judgment unit over a case in which the start-up timing control unit is not provided. In other words, this structure reduces the power consumption of the semiconductor integrated circuit over a case in which the oscillation cycle judgment unit begins performing the oscillation cycle judgment directly after the high-speed oscillator begins oscillating. In order to maximize the reduction in power consumption while performing early detection, it is desirable to set the judgment commencement value to the number of low-speed clock signals that are generated during the approximate period of time from when the high-speed oscillator begins oscillating until the oscillation stabilizes.

The above structure may be as follows.

The above semiconductor integrated circuit may further include: a low-speed clock counter operable to count a number of times that the low-speed clock signal has been received by the reception unit after a predetermined timing pertaining to a beginning of operation of the semiconductor integrated circuit, to generate a low-speed clock counter value; an oscillation stabilization timing storage unit storing therein a judgment commencement value; and a start-up timing comparison unit, wherein the oscillation stabilization timing storage unit may perform the storing by, when the oscillation cycle judgment unit judges affirmatively, acquiring the low-speed clock counter value of the low-speed clock counter at a timing of the affirmative judgment, and storing the acquired low-speed clock counter value as the judgment commencement value, and if the judgment commencement value is stored in the oscillation stabilization timing storage unit, the start-up timing comparison unit may compare the judgment commencement value and the low-speed clock counter value, suppress the judgment performed by the oscillation cycle judgment unit until the low-speed clock counter value reaches the judgment commencement value, and stop the suppression when the low-speed clock counter value reaches the judgment commencement value.

The above technology for raising detection reliability based on a history the low-speed clock signal may have the following structure.

The low-speed clock counter operable may count a number of times that the low-speed clock signal has been received by the reception unit after a predetermined timing pertaining to a beginning of operation of the semiconductor integrated circuit, to generate a low-speed clock counter value, and the above semiconductor integrated circuit may further include: an oscillation stabilization timing storage unit storing therein a judgment commencement value; and a start-up timing comparison unit, wherein the oscillation stabilization timing storage unit may perform the storing by, when the oscillation cycle judgment unit judges affirmatively, acquiring the low-speed clock counter value of the low-speed clock counter at a timing of the affirmative judgment, and storing the acquired low-speed clock counter value as the judgment commencement value, and if the judgment commencement value is stored in the oscillation stabilization timing storage unit, the start-up timing comparison unit may compare the judgment commencement value and the low-speed clock counter value, suppress the judgment performed by the oscillation cycle judgment unit until the low-speed clock counter value reaches the judgment commencement value, and stop the suppression when the low-speed clock counter value reaches the judgment commencement value.

According to this structure, the semiconductor integrated circuit first acquires the low-speed clock counter value of the low-speed clock counter when the oscillation cycle judgment unit judged affirmatively, and stores the acquired low-speed clock counter value as the judgment commencement value. The semiconductor integrated circuit controls, with use of the stored judgment commencement value, the timing at which the oscillation cycle judgment unit begins performing the oscillation cycle judgment. This structure enables the semiconductor integrated circuit to acquire an optimal judgment commencement timing in view of low power consumption.

This structure realizes low power consumption by delaying the start of the judgment performed by the oscillation cycle judgment unit from when detection processing is started. However, when focus is placed on the fact that the oscillation of the high-speed oscillator gradually stabilizes over time, a further reduction in power consumption can be realized by providing an innovation in the method of performing detection when the oscillation has stabilized.

Specifically, the above semiconductor integrated circuit may further include: a low-speed clock counter operable to count a number of times that the low-speed clock signal has been received by the reception unit after a predetermined timing pertaining to a beginning of operation of the semiconductor integrated circuit, to generate a low-speed clock counter value; an oscillation stabilization timing storage unit storing therein a stabilization timing value; a detection signal reception unit operable to receive the stability detection signal output from the signal output unit; and a hold-for-oscillation-stability control unit operable, (i) when the stability detection signal has been received by the detection signal reception unit, to acquire the low-speed clock counter value of the low-speed clock counter unit at a timing of an affirmative judgment that was performed by the oscillation cycle judgment unit pertaining to the output of the received stability detection signal, and store the acquired low-speed clock counter value in the oscillation stabilization timing storage unit as the stabilization timing value, and, (ii) if the stabilization timing value is stored in the oscillation stabilization timing storage unit, to suppress the judgment performed by the oscillation cycle judgment unit, compare the low-speed clock counter value and the stabilization timing value, and output the stability detection signal when the low-speed clock counter value reaches the stabilization timing value.

The above technology for raising detection reliability based on a history the low-speed clock signal may have the following structure.

The low-speed clock counter operable may count a number of times that the low-speed clock signal has been received by the reception unit after a predetermined timing pertaining to a beginning of operation of the semiconductor integrated circuit, to generate a low-speed clock counter value, and the above semiconductor integrated circuit may further include: an oscillation stabilization timing storage unit storing therein a stabilization timing value; a detection signal reception unit operable to receive the stability detection signal output from the signal output unit; and a hold-for-oscillation-stability control unit operable, (i) when the stability detection signal has been received by the detection signal reception unit, to acquire the low-speed clock counter value of the low-speed clock counter unit at a timing of an affirmative judgment that was performed by the oscillation cycle judgment unit pertaining to the output of the received stability detection signal, and store the acquired low-speed clock counter value in the oscillation stabilization timing storage unit as the stabilization timing value, and, (ii) if the stabilization timing value is stored in the oscillation stabilization timing storage unit, to suppress the judgment performed by the oscillation cycle judgment unit, compare the low-speed clock counter value and the stabilization timing value, and output the stability detection signal when the low-speed clock counter value reaches the stabilization timing value.

According to this structure, once the stability detection signal is output from the signal output unit, the low-speed clock counter value of the low-speed clock counter at that time is acquired and stored. Thereafter, in cases of performing re-detection, detection processing can be performed using only the low-speed clock signal, that is to say, without the oscillation cycle judgment unit performing judging or using the high-speed clock signal. In other words, this structure enables performing re-detection processing without causing the oscillation cycle judgment unit to operate, thereby further reducing power consumption.

However, even after the semiconductor integrated circuit has detected that the high-speed clock signal is being stably generated, if a failure or negative influence such as a disturbance in the high-speed oscillator occurs, the high-speed clock signal will no longer be stably generated.

In view of this, the above semiconductor integrated circuit may further include: an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, wherein after causing the oscillation cycle judgment unit to perform the judgment in accordance with the predetermined timing, the oscillation cycle monitor unit may output an oscillation abnormality detection signal if the stability detection signal has not been output from the signal output unit in a predetermined time period from when the fixed time period began.

Also, the semiconductor integrated circuit may further include: an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, wherein after causing the oscillation cycle judgment unit to perform the judgment in accordance with the predetermined timing, the oscillation cycle monitor unit may output an oscillation abnormality detection signal if the oscillation cycle judgment unit judges negatively.

According to this structure, even after the oscillation of the high-speed oscillator has been detected as having stabilized, re-detection is performed, and the oscillation abnormality detection signal is output if the high-speed clock signal is not being stably generated. This enables notifying the information processing system etc. that the high-speed clock signal is not being stably generated. This structure therefore enables preventing the information processing system from running out of control etc., and increases the operational stability of the information processing system over a case in which detection processing is only performed when switching from standby mode to normal mode.

The above semiconductor integrated circuit may have the following structure.

The oscillation cycle monitor unit may include: a detection signal reception subunit operable to receive the stability detection output from the signal output unit; a suppression subunit operable to, after the semiconductor integrated circuit has begun operating, cause the oscillation cycle judgment unit to perform the judgment until the stability detection signal is received by the detection signal reception subunit, and suppress the judgment after the stability detection signal has been received by the detection signal reception subunit; a judgment control subunit operable to, upon reaching the predetermined timing after the suppression subunit has suppressed the judgment performed by the oscillation cycle judgment unit, for a fixed time period, stop the suppression performed by the suppression subunit and cause the oscillation cycle judgment unit to perform the judgment; and an abnormality detection output subunit operable to output an abnormality detection signal if the stability detection signal has not been received by the detection signal reception subunit in a predetermined time period from when the fixed time period began.

Also, the above semiconductor integrated circuit may further include: an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, and the oscillation cycle monitor unit may include: a detection signal reception subunit operable to receive the oscillation cycle match signal and the stability detection signal; a suppression subunit operable to, after the semiconductor integrated circuit has begun operating, cause the oscillation cycle comparison subunit to perform the judgment until the stability detection signal is received by the detection signal reception subunit, and suppress the judgment after the stability detection signal has been received by the detection signal reception subunit; a judgment control subunit operable to, upon reaching the predetermined timing after the suppression subunit has suppressed the judgment performed by the oscillation cycle comparison subunit, for a fixed time period, stop the suppression performed by the suppression subunit and cause the oscillation cycle comparison subunit to perform the judgment; and an abnormality detection output subunit operable to output an abnormality detection signal if the oscillation cycle match signal has not been received by the detection signal reception subunit in a predetermined time period from when the fixed time period began.

Also, the above semiconductor integrated circuit may further include: an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, and the oscillation cycle monitor unit may include: a detection signal reception subunit operable to receive the oscillation cycle mismatch signal and the stability detection signal; a suppression subunit operable to, after the semiconductor integrated circuit has begun operating, cause the oscillation cycle comparison subunit to perform the judgment until the stability detection signal is received by the detection signal reception subunit, and suppress the judgment after the stability detection signal has been received by the detection signal reception subunit; a judgment control subunit operable to, upon reaching the predetermined timing after the suppression subunit has suppressed the judgment performed by the oscillation cycle comparison subunit, for a fixed time period, stop the suppression performed by the suppression subunit and cause the oscillation cycle comparison subunit to perform the judgment; and an abnormality detection output subunit operable to output an abnormality detection signal if the oscillation cycle mismatch signal has been received by the detection signal reception subunit in a predetermined time period from when the fixed time period began.

Also, the oscillation cycle judgment unit may include an oscillation cycle comparison subunit operable to perform the judgment of whether the number of times that the high-speed clock signal has been received by the reception unit in the predetermined time period is in the predetermined range, and output an oscillation cycle match signal upon judging affirmatively, and the oscillation cycle monitor unit may include: a detection signal reception subunit operable to receive the oscillation cycle mismatch signal and the stability detection signal; a suppression subunit operable to, after the semiconductor integrated circuit has begun operating, cause the oscillation cycle comparison subunit to perform the judgment until the stability detection signal is received by the detection signal reception subunit, and suppress the judgment after the stability detection signal has been received by the detection signal reception subunit; a judgment control subunit operable to, upon reaching the predetermined timing after the suppression subunit has suppressed the judgment performed by the oscillation cycle comparison subunit, for a fixed time period, stop the suppression performed by the suppression subunit and cause the oscillation cycle comparison subunit to perform the judgment; and an abnormality detection output subunit operable to output an abnormality detection signal if the oscillation cycle mismatch signal has been received by the detection signal reception subunit in a predetermined time period from when the fixed time period began.

Note that the semiconductor integrated circuit is operating while the oscillation cycle judgment unit performs judging during re-detection processing, thereby consuming power.

In view of this, the above semiconductor integrated circuit may further include: an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, and the oscillation cycle monitor unit may include: a detection signal reception subunit operable to receive the stability detection output from the signal output unit; a suppression subunit operable to, after the semiconductor integrated circuit has begun operating, cause the oscillation cycle judgment unit to perform the judgment until the stability detection signal is received by the detection signal reception subunit, and suppress the judgment after the stability detection signal has been received by the detection signal reception subunit; a judgment control subunit operable to, upon reaching the predetermined timing after the suppression subunit has suppressed the judgment performed by the oscillation cycle judgment unit, for a fixed time period, stop the suppression performed by the suppression subunit and cause the oscillation cycle judgment unit to perform the judgment; a measurement period determination subunit operable to determine a length of the predetermined time period pertaining to the judgment that is performed by the oscillation cycle judgment unit under control of the judgment control subunit; a set value control subunit operable to cause the counter number setting storage subunit to store the set value, which is in accordance with the length of the predetermined time period determined by the measurement period determination subunit; and an abnormality detection output subunit operable to output an abnormality detection signal if the stability detection signal has not been received by the detection signal reception subunit in a predetermined time period from when the fixed time period began, wherein the judgment control subunit may cause the oscillation cycle judgment unit to perform the judgment in accordance with the length of the predetermined time period determined by the measurement period determination subunit.

This structure enables flexibly extending or shortening the time period for which the oscillation cycle judgment unit operates during re-detection processing, in accordance with the demand for low power consumption etc. Accordingly, the operation time period of the oscillation cycle judgment unit during re-detection processing can be shortened etc., thereby realizing lower power consumption in the semiconductor integrated circuit.

Here, the predetermined time period pertaining to the judgment performed by the oscillation cycle judgment unit may be one clock cycle of the low-speed clock signal.

Also, the predetermined range pertaining to the judgment performed by the oscillation cycle judgment unit may be based on a value indicating a ratio between a clock frequency of the high-speed clock signal and a clock frequency of the low-speed clock signal.

Also, the set value stored in the counter number setting register may be based on a value indicating a ratio between a clock frequency of the high-speed clock signal and a clock frequency of the low-speed clock signal.

This structure enables reducing the size of the high-speed clock counter for counting the number of times that the high-speed clock signal has been received, thereby reducing the size of the semiconductor integrated circuit.

The above structure may be as follows.

The above semiconductor integrated circuit, being for detecting that the high-speed clock signal supplied to a predetermined circuit is being stably generated, may further include: a first clock gating circuit operable to block the supply of the high-speed clock signal to the predetermined circuit until the stability detection signal is output, and stop the blocking after the stability detection signal has been output; and a second clock gating circuit operable to allow the supply of the low-speed clock signal and the high-speed clock signal to the semiconductor integrated circuit until the stability detection signal is output, and block the supply of the low-speed clock signal and the high-speed clock signal after the stability detection signal has been output, wherein the signal output unit may output the stability detection signal to the first clock gating circuit and the second clock gating circuit.

Also, the present invention is an information processing system that switches between operations modes while operating, the operation modes including a normal mode in which the information processing system operates with use of a high-speed clock signal and a standby mode in which the information processing system operates with use of a low-speed clock signal, the information processing system including: a semiconductor integrated circuit operable to, each time the information processing system is to switch from the standby mode to the normal mode, detect whether the high-speed clock signal is being stably generated by a high-speed oscillator, wherein the information processing system completes the switch from the standby mode to the normal mode upon the semiconductor integrated circuit detecting that the high-speed clock signal is being stably generated, and the semiconductor integrated circuit including: a reception unit operable to periodically receive the high-speed clock signal and the low-speed clock signal; an oscillation cycle judgment unit operable to, each time the low-speed clock signal has been received a predetermined number of times by the reception unit, judge whether a number of times that the high-speed clock signal has been received by the reception unit in a predetermined time period is in a predetermined range, the predetermined time period being based on a reception period during which the low-speed clock signal was received the predetermined number of times; and a signal output unit operable to control output of a stability detection signal in accordance with a number of times that the oscillation cycle judgment unit has judged affirmatively.

Also, the present invention is an oscillation stability detection method for detecting that a high-speed clock signal is being stably generated, including the steps of: periodically receiving the high-speed clock signal and a low-speed clock signal; judging, each time the low-speed clock signal has been received a predetermined number of times in the reception step, whether a number of times that the high-speed clock signal has been received in the reception step in a predetermined time period is in a predetermined range, the predetermined time period being based on a reception period during which the low-speed clock signal was received the predetermined number of times; and controlling output of a stability detection signal in accordance with a number of affirmative judgments in the judgment step.

BRIEF DESCRIPTION OF THE DRAWINGS

These and other objects, advantages, and features of the invention will become apparent from the following description thereof taken in conjunction with the accompanying drawings, which illustrate specific embodiments of the present invention.

In the drawings.

DESCRIPTION OF THE PREFERRED EMBODIMENTS

1. Embodiment 1

Below is a description of a semiconductor integrated circuit pertaining to the present invention with reference to the drawings.

1.1. Overview

The following briefly describes an overview of an information processing system including a semiconductor integrated circuit of the present invention.

The information processing system includes a low-speed oscillator that cyclically generates a low-speed clock signal (clock pulse), and a high-speed oscillator that cyclically generates a high-speed clock signal (clock pulse). The information processing system also includes two operation modes, namely a normal mode and a standby mode, and switches between the normal mode and standby mode while operating.

In normal mode, the information processing system operates with use of the high-speed clock signal. In standby mode, the information processing system stops the oscillation of the high-speed oscillator, and operates with use of the low-speed clock signal. Also, in standby mode, a clock signal is not supplied to a portion of the circuitry. This structure realizes low power consumption.

When switching from standby mode to normal mode, the information processing system first causes the high-speed oscillator to begin oscillating, since the oscillation of the high-speed oscillator is stopped during standby mode. The information processing system also includes the semiconductor integrated circuit of the present invention, which is described below. The information processing system uses the semiconductor integrated circuit to detect that the oscillation of the high-speed oscillator has stabilized, and completes the switch to normal mode once the detection has been made.

A description of processing performed after the above detection has been made in an information processing system that switches between a normal mode and standby mode during operation (i.e., processing for completing the switch from the standby mode to normal mode, and processing for switching from normal mode to standby mode) has been omitted since it is conventionally known and is not a main part of the present invention. The following description focuses on technology for detecting that the oscillation of the high-speed oscillator has stabilized.

1.2. Structure of the Semiconductor Integrated Circuit

Figure 1:
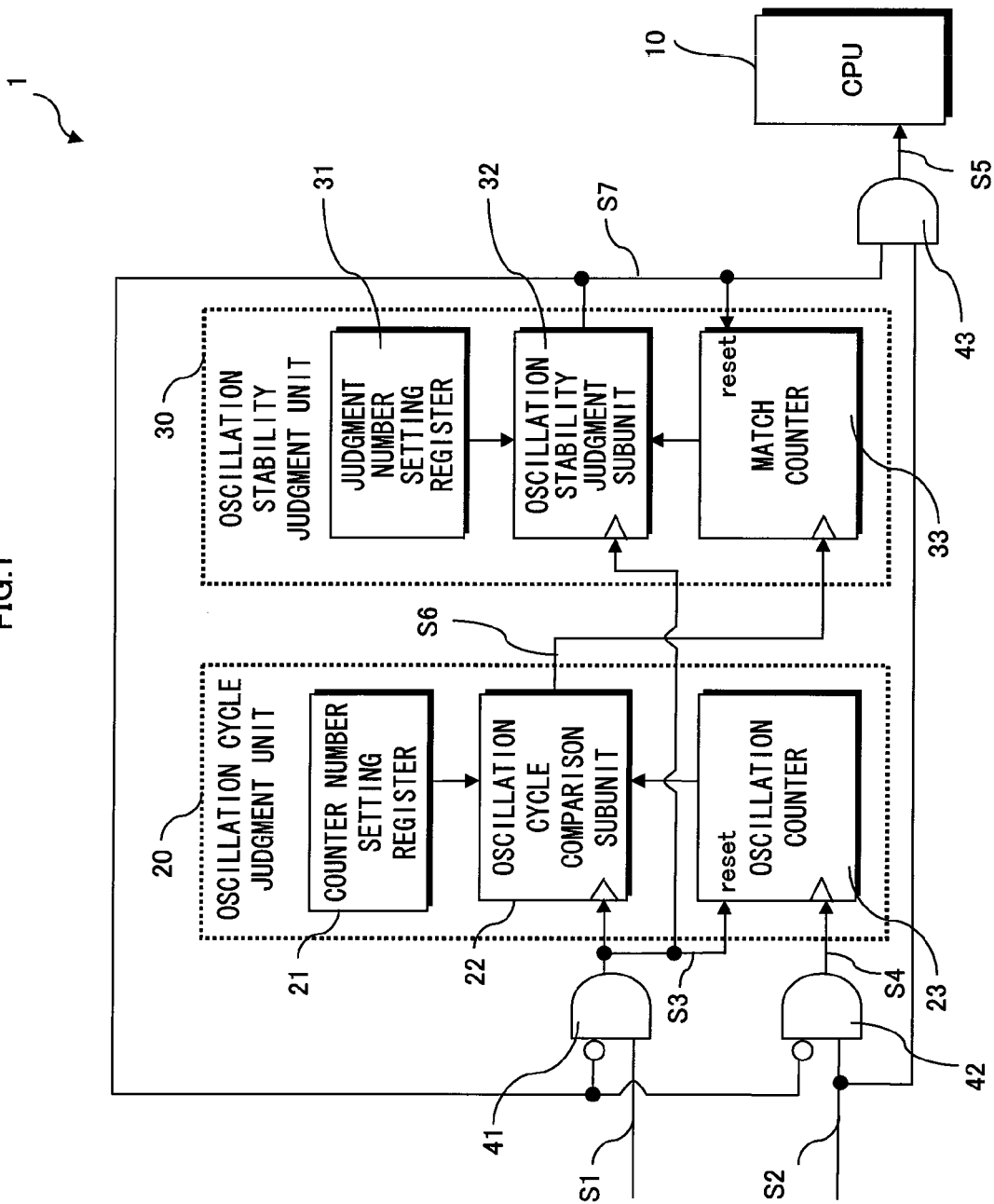
FIG. 1 is a functional block diagram showing a structure of a semiconductor integrated circuit 1 of the present invention.

FIG. 1 is a functional block diagram showing the structure of a semiconductor integrated circuit 1 of the present invention.

As shown in FIG. 1, the semiconductor integrated circuit 1 includes a CPU 10 (Central Processing Unit), a clock gating circuit 41, a clock gating circuit 42, a clock gating circuit 43, an oscillation cycle judgment unit 20, and an oscillation stability judgment unit 30. The oscillation cycle judgment unit 20 includes a counter number setting register 21, an oscillation cycle comparison subunit 22, and an oscillation counter 23. The oscillation stability judgment unit 30 includes a match counter 33, a judgment number setting register 31, and an oscillation stability judgment subunit 32.

The semiconductor integrated circuit 1 receives a low-speed clock signal S1 and a high-speed clock signal S2, and performs detection. Note that the low-speed oscillator has been set so as to generate a low-speed clock signal S1 whose frequency is 32 kHz when oscillation has stabilized, and the high-speed oscillator has been set so as to generate a high-speed clock signal S2 whose frequency is 20 MHz when oscillation has stabilized. In other words, 625 pulses of the high-speed clock signal S2 are generated in one cycle of the low-speed clock signal S1 (20 M/32 k).

Note that the CPU 10 may include constituent elements external to the semiconductor integrated circuit 1. One example is a CPU that controls the operations of the information processing system, and controls the operation modes according to the detection made by the semiconductor integrated circuit 1.

The following describes the functions and specific structures of the aforementioned constituent elements, and the connections therebetween.

1.2.1. Clock Gating Circuit 41

The clock gating circuit 41 receives an input of the low-speed clock signal S1, and controls the output of a low-speed clock G signal S3. Also, the clock gating circuit 41 is connected to the oscillation cycle comparison subunit 22, the oscillation counter 23, and the oscillation stability judgment subunit 32. As shown in FIG. 1, output from the oscillation stability judgment subunit 32 is inverted and input to the clock gating circuit 41. The clock gating circuit 41 is an AND circuit that receives the low-speed clock signal S1 and an inversion of an oscillation stability detection signal S7 output from the oscillation stability judgment subunit 32.

The clock gating circuit 41 supplies the low-speed clock G signal S3 to the oscillation cycle comparison subunit 22, the oscillation counter 23, and the oscillation stability judgment subunit 32 until the oscillation stability detection signal S7 is output from the oscillation stability judgment subunit 32. When the oscillation stability detection signal S7 is output, the clock gating circuit 41 stops supplying the low-speed clock G signal S3 to the oscillation cycle comparison subunit 22, the oscillation counter 23, and the oscillation stability judgment subunit 32.

1.2.2. Clock Gating Circuit 42.

The clock gating circuit 42 receives an input of the high-speed clock signal S2, and controls the output of a high-speed clock G signal S4. Also, the clock gating circuit 42 is connected to the oscillation counter 23 and the oscillation stability judgment subunit 32. As shown in FIG. 1, output from the oscillation stability judgment subunit 32 is inverted and input to the clock gating circuit 42. The clock gating circuit 42 is an AND circuit that receives the high-speed clock signal S2 and an inversion of the oscillation stability detection signal S7 output from the oscillation stability judgment subunit 32.

The clock gating circuit 42 supplies the high-speed clock G signal S4 to the oscillation counter 23 until the oscillation stability detection signal S7 is output from the oscillation stability judgment subunit 32. When the oscillation stability detection signal S7 is output, the clock gating circuit 42 stops supplying the high-speed clock G signal S4 to the oscillation counter 23.

1.2.3. Clock Gating Circuit 43

The clock gating circuit 43 receives an input of the high-speed clock signal S2, and controls the output of a high-speed clock S signal S5. Also, the clock gating circuit 43 is connected to the oscillation stability judgment subunit 32 and the CPU 10.

The clock gating circuit 43 is an AND circuit that receives the high-speed clock signal S2 and the oscillation stability detection signal S7 output from the oscillation stability judgment subunit 32. The clock gating circuit 43 does not supply the high-speed clock S signal S5 to the CPU 10 until the oscillation stability detection signal S7 is output from the oscillation stability judgment subunit 32. When the oscillation stability detection signal S7 is output, the clock gating circuit 43 supplies the high-speed clock S signal S5 to the CPU 10.

1.2.4. Oscillation Cycle Judgment Unit 20

The oscillation cycle judgment unit 20 judges whether the frequency of a high-speed clock signal is in a predetermined range.

The following describes the specific structure of the oscillation cycle judgment unit 20.

1.2.4.1. Counter Number Setting Register 21

The counter number setting register 21 is connected to the oscillation cycle comparison subunit 22.

The counter number setting register 21 is a register in which an arbitrary value can be set. In the present embodiment, the counter number setting register 21 stores 625, which is a value indicating a ratio between a set value indicating the frequency of the high-speed clock signal S2 (20 MHz) and a set value indicating the frequency of the low-speed clock signal S1 (32 kHz).

1.2.4.2. Supplementary Remarks on the Register 21

Note that the value set in the register 21 does not need to equal the ratio between the frequencies of the high-speed and low-speed clock signals. Instead, the value may approximate the ratio, that is to say, the value may be substantially the same as the ratio.

Also, the value stored in the register 21 may be set in advance by a manufacturer or user of the semiconductor integrated circuit 1, or information indicating the frequencies of the clock signals that are to be generated by the high-speed oscillator and low-speed oscillator may be acquired from an external device, and the semiconductor integrated circuit 1 may calculate the value to be set in the register 21 based on the acquired information and set the calculated value in the register 21.

1.2.4.3. Oscillation Counter 23

The oscillation counter 23 is connected to the clock gating circuit 41, the clock gating circuit 42, and the oscillation cycle comparison subunit 22.

The oscillation counter 23 receives the high-speed clock G signal S4 from the clock gating circuit 42, and counts up the high-speed clock G signal S4. In other words, the oscillation counter 23 counts the number of received high-speed clock G signals S4. Also, upon receiving an input of the low-speed clock G signal S3 from the clock gating circuit 41 and detecting a rising edge of the low-speed clock G signal S3, the oscillation counter 23 clears (erases) the counter value (the number of high-speed clock G signals S4). Alternatively, the oscillation counter 23 may clear the counter value using a falling edge as a reference. Although the operations of the functional blocks are mainly started using a rising edge as a reference in the following description, needless to say, a falling edge may be used as a reference instead.

The size of the oscillation counter 23, that is to say, the upper limit of the number that can be counted by the oscillation counter 23, is determined according to the value indicating the ratio between the set value indicating the frequency of the high-speed clock signal S2 and the set value indicating the frequency of the low-speed clock signal S1. Taking into consideration that after beginning oscillation the high-speed oscillator temporarily generates a high-speed clock signal whose frequency exceeds the set frequency, in the present embodiment, the oscillation counter 23 is able to count up to a number that is a few percent larger than (e.g., 5% larger than) the value indicating the ratio between the two frequencies.

1.2.4.4. Supplementary Remarks on the Oscillation Counter 23

The size of the oscillation counter 23 is of course not limited to the above-described size. The size of the oscillation counter 23 may be determined taking into consideration the manner in which the high-speed oscillator oscillates (e.g., changes in frequency until oscillation stabilizes and amount of time before the oscillation stabilizes). For example, the size of the oscillation counter 23 does not need to be larger than necessary if the high-speed oscillator generates a relatively low rate of high-speed clock signals S2 that exceed (overshoot) the predetermined frequency, or there is a relatively low possibility of such signals being generated.

1.2.4.5. Oscillation Cycle Comparison Subunit 22

The oscillation cycle comparison subunit 22 is connected to the clock gating circuit 41, the counter number setting register 21, the oscillation counter 23, and the match counter 33.

The oscillation cycle comparison subunit 22 is a logical circuit that operates in synchronization with the low-speed clock G signal S3 output from the clock gating circuit 41. At the operation timing, the oscillation cycle comparison subunit 22 acquires the number counted by the oscillation counter 23 and the value stored in the counter number setting register 21, and compares the acquired number and value. If the number counted by the oscillation counter 23 and the value stored in the counter number setting register 21 match or have a difference that is less than or equal to a predetermined value, the oscillation cycle comparison subunit 22 outputs an oscillation cycle match signal S6 to the match counter 33.

Note that in the present embodiment, the oscillation cycle comparison subunit 22 outputs the oscillation cycle match signal S6 if the difference between the acquired number and value does not exceed a value that is a few percent larger than (e.g., 2% larger than) the value stored in the counter number setting register 21.

1.2.4.6. Supplementary Remarks on the Oscillation Cycle Judgment Unit 20

In the above description, the number counted by the oscillation counter 23 (in these supplementary remarks, called the "counter value") and the value stored in the counter number setting register 21 (in these supplementary remarks, called the "set value") are acquired, and the oscillation cycle match signal S6 is output if the difference between the counter value and set value is less than or equal to a predetermined value.

However, the output of the oscillation cycle match signal S6 may be controlled by various comparison methods that use the counter value or the set value instead of the above-stated difference therebetween. For example, the set value may be used as a reference, and the oscillation cycle comparison subunit 22 may output the oscillation cycle match signal S6 if the counter value is in a predetermined range. One specific example is whether the counter value satisfies a condition such as "97% of set value<counter value<103% of set value".

1.2.5. Oscillation Stability Judgment Unit 30

The oscillation stability judgment unit 30 judges whether the generation of the high-speed clock signal S2 by the high-speed oscillator is stable. In the present embodiment, the oscillation stability judgment unit 30 bases the judgment on the number of times that the frequency of the generated high-speed clock signal S2 has reached the predetermined frequency.

The following describes the specific structure of the oscillation stability judgment unit 30.

1.2.5.1. Judgment Number Setting Register 31

The judgment number setting register 31 is connected to the oscillation stability judgment subunit 32.

The judgment number setting register 31 is a register in which an arbitrary value can be set.

1.2.5.2. Supplementary Remarks on the Judgment Number Setting Register 31

Note that the value set in the judgment number setting register 31 is determined in consideration of the manner in which the high-speed oscillator oscillates. Specifically, when the high-speed oscillator generates the high-speed clock signal having the predetermined frequency, if a relatively long period of time passes before the output of the predetermined frequency signal stabilizes, a higher value is set in the register 31. If a relatively short period of time passes before the output of the predetermined frequency signal stabilizes, a smaller value is set in the register 31. This enables early detection of the fact that the oscillation of the high-speed oscillator is stable.

1.2.5.3. Match Counter 33

The match counter 33 is connected to the oscillation cycle comparison subunit 22 and the oscillation stability judgment subunit 32.

The match counter 33 receives the oscillation cycle match signal S6 output from the oscillation cycle comparison subunit 22, and counts a number of rising edges detected in the oscillation cycle match signal S6. In other words, the match counter 33 counts the number of oscillation cycle match signals S6 that have been output.

Also, the match counter 33 receives an input of the oscillation stability detection signal S7 output from the oscillation stability judgment subunit 32. The match counter 33 clears its counter value upon detecting a rising edge in the oscillation stability detection signal S7.

1.2.5.4. Supplementary Remarks on the Match Counter 33

Note that the size of the match counter 33 is determined according to the value set in the judgment number setting register 31. In other words, the match counter 33 must be of a sufficient size to be able to count up to a number equal to the value set in the judgment number setting register 31. Since as previously described the value set in the judgment number setting register 31 is preferably determined according to the manner in which the high-speed oscillator oscillates, the size of the match counter 33 is similarly determined according to the high-speed oscillator.

1.2.5.5. Oscillation Stability Judgment Subunit 32

The oscillation stability judgment subunit 32 is connected to the clock gating circuits 41, 42 and 43, the judgment number setting register 31, and the match counter 33.

The oscillation stability judgment subunit 32 is a logical circuit that performs predetermined comparison in synchronization with the low-speed clock G signal S3 output from the clock gating circuit 41. At the comparison timing, the oscillation stability judgment subunit 32 acquires the counter value counted by the match counter 33 (i.e., the number of times that the oscillation cycle match signal S6 has been output) and the value stored in the judgment number setting register 31, and compares the acquired values. If the acquired values match, the oscillation stability judgment subunit 32 outputs the oscillation stability detection signal S7 to the clock gating circuits 41, 42 and 43, and the match counter 33.

After beginning to output the oscillation stability detection signal S7, the oscillation stability judgment subunit 32 continues to output the oscillation stability detection signal S7 until the information processing system switches from normal mode to standby mode. When the information processing system switches to standby mode, the oscillation stability judgment subunit 32 stops outputting the oscillation stability detection signal S7. One example of this is, when software such as the OS (Operating System) of the information processing system performs processing for switching to standby mode, such software stops the output of the oscillation stability detection signal S7 by the oscillation stability judgment subunit 32.

1.2.6. CPU 10

The CPU 10 is connected to the clock gating circuit 43.

When the oscillation stability detection signal S7 is output from the oscillation stability judgment subunit 32, the CPU 10 receives the high-speed clock S signal S5 from the clock gating circuit 43. Upon receiving the high-speed clock S signal S5, the CPU 10 operates according to timing that is based on the received high-speed clock S signal S5.

Instead of clearing the value of the match counter 33 based on the oscillation stability detection signal S7 as in the above example, the value of the match counter 33 may be cleared when the information processing system switches from normal mode to standby mode, or when beginning detection processing.

Also, the information processing system may consider the output of the high-speed clock S signal S5 to be the completion of the detection processing performed by the semiconductor integrated circuit 1, complete the processing for switching from standby mode to normal mode, and begin operating with use of the high-speed clock signal S2.

1.3. Operations

The following describes operations of the semiconductor integrated circuit 1 having the structure described above.

Figure 2:
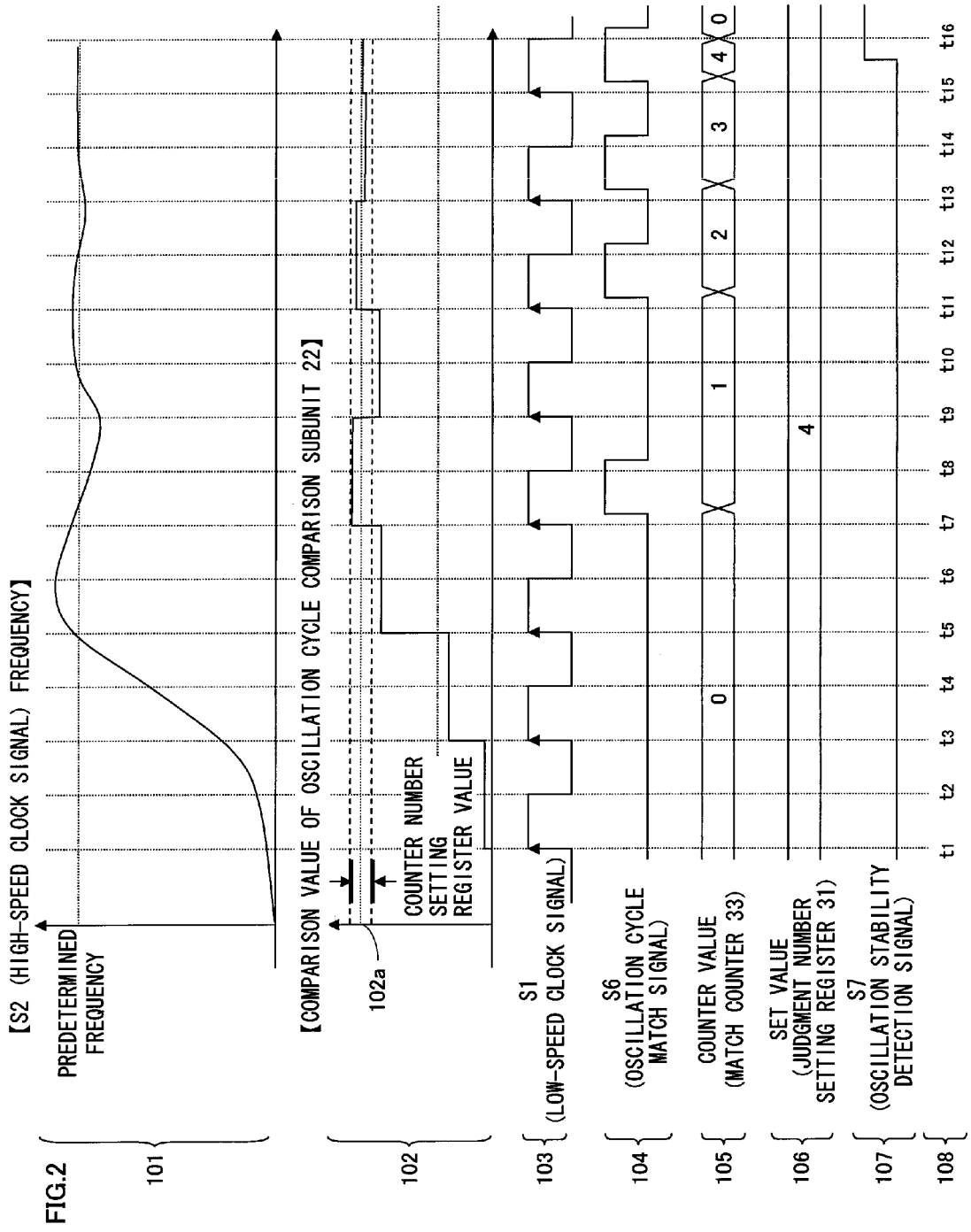
FIG. 2 shows an exemplary operation scenario of the semiconductor integrated circuit 1 of embodiment 1.

FIG. 2 shows an exemplary operation scenario of the semiconductor integrated circuit 1 in embodiment 1.

Beginning from the top, FIG. 2 shows a high-speed clock generation state 101, an oscillation cycle comparison operation 102, a low-speed clock generation state 103, an S6 output state 104, a match counter value 105, a judgment number setting register value 106, an S7 output state 107, and time 108.

In time 108, time is indicated by "t1", "t2", "t3" etc. at each half-cycle of the low-speed clock signal.

High-speed clock generation state 101 shows the state of generation of the high-speed clock signal S2 after the high-speed oscillator has begun oscillating. In FIG. 2, the frequency of the high-speed clock signal S2 is shown on the vertical axis, and time is shown on the horizontal axis. Also, "predetermined frequency" in FIG. 2 corresponds to the frequency of the high-speed clock signal S2 that should be generated by the high-speed oscillator. FIG. 2 shows that the oscillation of the high-speed oscillator gradually stabilizes as time passes.

Oscillation cycle comparison operation 102 shows the operation of the oscillation cycle comparison subunit 22 that, in synchronization with the low-speed clock G signal S3, compares the counter value acquired from the oscillation counter 23 and the value set in the counter value setting register 21. The vertical axis shows the counter value acquired from the oscillation counter 23. Note that in FIG. 2, the value set in the counter value setting register 21 is indicated as set value 102a. As previously described, the oscillation cycle comparison subunit 22 outputs the oscillation cycle match signal S6 if the counter value acquired from the oscillation counter 23 is in a predetermined range that includes the value indicated by set value 102a (e.g., as previously described, a range of a few percent of the set value 102a). In FIG. 2, this predetermined range is shown as broken lines.

Low-speed clock generation state 103 shows a pulse waveform of the low-speed clock signal S1 generated by the low-speed oscillator.

S6 output state 104 shows a relationship between the oscillation cycle match signal S6 output from the oscillation cycle comparison subunit 22 and time.

Match counter value 105 shows a relationship between the value counted by the match counter 33 and time.

Judgment number setting register value 106 shows a relationship between the value stored in the judgment number setting register 31 and time. Note that in the present example, the judgment number setting register 31 stores "4". Also, in the present example, the value stored in the judgment number setting register 31 does not change during the detection process (However, the value stored in the judgment number setting register 31 may be set to change during the detection processing. For example, if stable oscillation is not detected before a predetermined time period elapses, software etc. may dynamically change the value stored in the judgment number setting register 31. The reliability of detection can be increased by increasing the stored value, and detection can be made earlier by decreasing the stored value.).

S7 output state 107 shows a relationship between the oscillation stability detection signal S7 output from the oscillation stability judgment subunit 32 and time.

In synchronization with the low-speed clock G signal S3, the oscillation cycle comparison subunit 22 acquires the value counted by the oscillation counter 23. The oscillation cycle comparison subunit 22 then judges whether a difference between the acquired value and the value set in the counter number setting register 21 (the set value 102a) is in a predetermined range. If the difference is in the predetermined range, the oscillation cycle comparison subunit 22 outputs the oscillation cycle match signal S6 (e.g., see the time period from t7 to t8 in S6 output state 104).

Upon output of the oscillation cycle match signal S6 by the oscillation cycle comparison subunit 22, the match counter 33 increments its counter value (e.g., see the time period from t7 to t8 in match counter value 105).

Thereafter, if the value counted by the match counter 33 and the value stored in the judgment number setting register 31 match, the oscillation stability judgment subunit 32 outputs the oscillation stability detection signal S7 (see the time period from t15 to t16 in match counter value 105, judgment number setting register value 106, and S7 output state 107).

2. Embodiment 2

The following describes another embodiment of the present invention.

2.1. Overview

In the above-described technology, the semiconductor integrated circuit 1 detects that the high-speed clock signal is being generated stably, and thereafter the information processing system switches from standby mode to normal mode.

However, if an abnormality occurs in the high-speed clock signal after the switch to normal mode, there is a risk that the information processing system will become unstable. In view of this, the present embodiment further provides an oscillation cycle monitor circuit 50 as shown in FIG. 3.

After the semiconductor integrated circuit has made the detection, the oscillation cycle monitor circuit 50 checks, according to a predetermined timing (e.g., periodically), whether the oscillation of the high-speed oscillator is stable.

2.2. Structure

Figure 3:
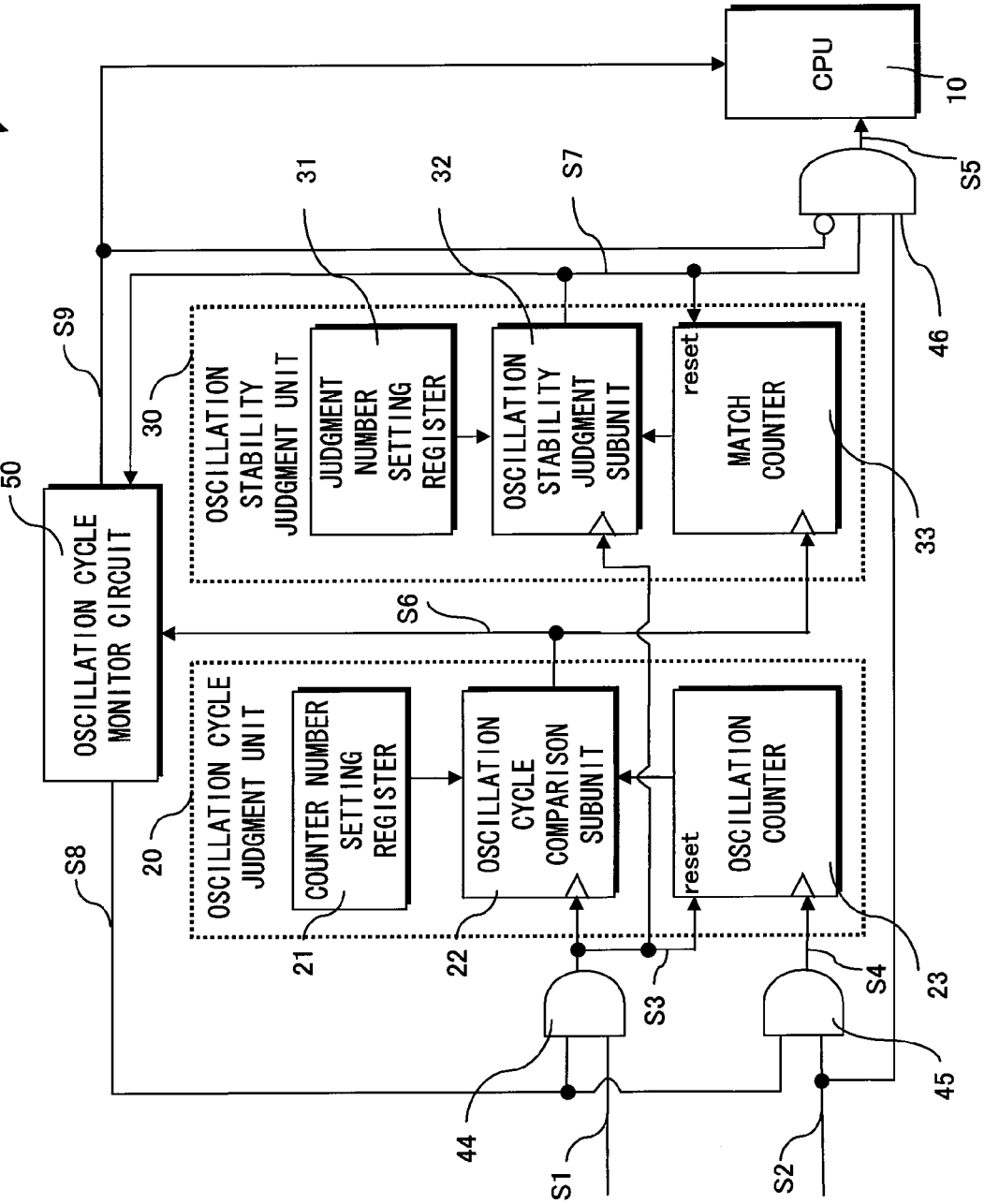
FIG. 3 is a functional block diagram showing a structure of a semiconductor integrated circuit 1b of embodiment 2.

FIG. 3 is a functional block diagram showing the structure of a semiconductor integrated circuit 1b of embodiment 2.

The following description focuses on differences between the structure of the present embodiment and embodiment 1.

As shown in FIG. 3, a large difference from embodiment 1 is the provision of the oscillation cycle monitor circuit 50.

Another difference from embodiment 1 is that clock gating circuits 44, 45 and 46 are provided instead of the clock gating circuits 41, 42 and 43. A description of the functions of the counter number setting register 21, the judgment number setting register 31, and the match counter 33 and the connections therebetween has been omitted since they are the same as in embodiment 1.

2.2.1. Clock Gating Circuit 44

The clock gating circuit 44 receives an input of the low-speed clock signal S1, and controls the output of the low-speed clock G signal S3. Also, the clock gating circuit 44 is connected to the oscillation cycle comparison subunit 22, the oscillation counter 23, the oscillation stability judgment subunit 32, and the oscillation cycle monitor circuit 50. The clock gating circuit 44 is an AND circuit that receives an oscillation stability detection EN signal S8 output from the oscillation cycle monitor circuit 50 and the low-speed clock signal S1.

While receiving the oscillation stability detection EN signal S8 output from the oscillation cycle monitor circuit 50, the clock gating circuit 44 supplies the low-speed clock G signal S3 to the oscillation cycle comparison subunit 22, the oscillation counter 23, and the oscillation stability judgment subunit 32. The clock gating circuit 44 does not supply the low-speed clock G signal S3 to the oscillation cycle comparison subunit 22 etc. if the oscillation stability detection EN signal S8 is not being output from the oscillation cycle monitor circuit 50.

2.2.2. Clock Gating Circuit 45

The clock gating circuit 45 receives an input of the high-speed clock signal S2, and controls the output of the high-speed clock G signal S4. Also, the clock gating circuit 45 is connected to the oscillation counter 23 and the oscillation cycle monitor circuit 50. The clock gating circuit 45 is an AND circuit that receives the oscillation stability detection EN signal S8 output from the oscillation cycle monitor circuit 50 and the high-speed clock signal S2.

While receiving the oscillation stability detection EN signal S8 output from the oscillation cycle monitor circuit 50, the clock gating circuit 45 supplies the high-speed clock G signal S4 to the oscillation counter 23. The clock gating circuit 45 does not supply the high-speed clock G signal S4 to the oscillation counter 23 if the oscillation stability detection EN signal S8 is not being output from the oscillation cycle monitor circuit 50.

2.2.3. Clock Gating Circuit 46

The clock gating circuit 46 receives an input of the high-speed clock signal S2, and controls the output of the high-speed clock S signal S5. Also, the clock gating circuit 46 is connected to the oscillation stability judgment subunit 32, the CPU 10, and the oscillation cycle monitor circuit 50. As shown in FIG. 3, an oscillation abnormality detection signal S9 output from the oscillation cycle monitor circuit 50 is inverted and input to the clock gating circuit 46. The clock gating circuit 46 is an AND circuit that receives an inversion of the oscillation abnormality detection signal S9 output from the oscillation cycle monitor circuit 50, the oscillation stability detection signal S7 from the oscillation stability judgment subunit 32, and the high-speed clock signal S2.

The clock gating circuit 46 does not supply the high-speed clock S signal S5 to the CPU 10 if the oscillation stability detection signal S7 is being output from the oscillation stability judgment subunit 32 but the oscillation abnormality detection signal S9 is not being output from the oscillation cycle monitor circuit 50.

2.2.4. Oscillation Counter 23

The oscillation counter 23 of the present embodiment is the same as the oscillation counter 23 described in embodiment 1, with the exception of replacing the clock gating circuits 41 and 42 with the clock gating circuits 44 and 45 respectively.

2.2.5. Oscillation Cycle Comparison Subunit 22

In embodiment 2, the oscillation cycle comparison subunit 22 is connected to the clock gating circuit 44 instead of the clock gating circuit 41. The oscillation cycle comparison subunit 22 is also connected to the oscillation cycle monitor circuit 50.

The oscillation cycle comparison subunit 22 outputs the oscillation cycle match signal S6 to the match counter 33 as well as the oscillation cycle monitor circuit 50.

2.2.6. Oscillation Stability Judgment Subunit 32

In embodiment 2, the oscillation stability judgment subunit 32 is connected to the clock gating circuit 44 instead of the clock gating circuit 41, to the clock gating circuit 46 instead of the clock gating circuit 43, and to the oscillation cycle monitor circuit 50.

In embodiment 2, the oscillation stability judgment subunit 32 operates in synchronization with the low-speed clock G signal S3 output from the clock gating circuit 44.

Also, the oscillation stability judgment subunit 32 outputs the oscillation stability detection signal S7 to the clock gating circuit 46 as well as the oscillation cycle monitor circuit 50.

2.2.7. Oscillation Cycle Monitor Circuit 50

The oscillation cycle monitor circuit 50 is connected to the clock gating circuits 44, 45 and 46, the oscillation cycle comparison subunit 22, the oscillation stability judgment subunit 32, and the CPU 10.

2.2.7.1. Overview of the Oscillation Cycle Monitor Circuit 50

The following is an overview of the oscillation cycle monitor circuit 50. From when the high-speed oscillator begins oscillating and the semiconductor integrated circuit 1b begins the detection processing until the oscillation stability judgment subunit 32 outputs the oscillation stability detection signal S7, the oscillation cycle monitor circuit 50 outputs the oscillation stability detection EN signal S8 to the clock gating circuits 44 and 45. According to this structure, clock signals are supplied to the oscillation cycle judgment unit 20 and the oscillation stability judgment unit 30, which are caused to operate.

Thereafter, when the oscillation stability detection signal S7 is output from the oscillation stability judgment subunit 32 of the oscillation stability judgment unit 30, the oscillation cycle monitor circuit 50 stops the supply of clock signals to the oscillation cycle judgment unit 20 etc. by stopping outputting the oscillation stability detection EN signal S8. After the supply of the clock signals has been stopped, at each re-detection timing, the oscillation cycle monitor circuit 50 outputs the oscillation stability detection EN signal S8 to cause the clock signals to be supplied to the oscillation cycle judgment unit 20 etc., and monitors whether the oscillation cycle comparison subunit 22 is outputting the oscillation cycle match signal S6. If the oscillation cycle match signal S6 is not being output, the oscillation cycle monitor circuit 50 outputs the oscillation abnormality detection signal S9 to the CPU 10 and the clock gating circuit 46. As a result, the CPU 10 is notified that an abnormality has occurred in the oscillation of the high-speed oscillator, and the supply of the high-speed clock signal to the CPU 10 is stopped.

2.2.7.2. Operations of the Oscillation Cycle Monitor Circuit 50

The following describes in detail the operations of the oscillation cycle monitor circuit 50 with reference to the drawings.

Figure 4:
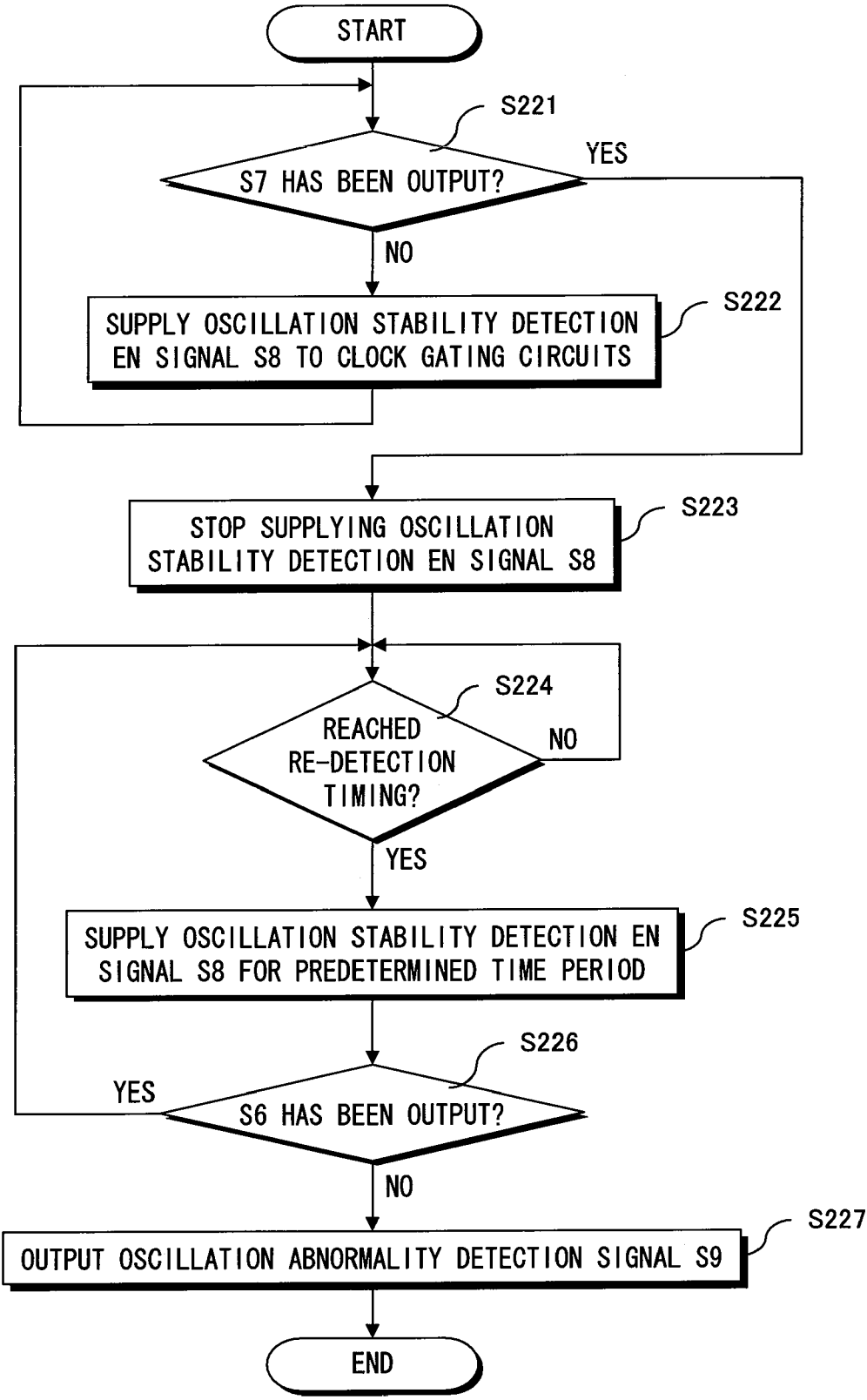
FIG. 4 is a flowchart showing operations of an oscillation cycle monitor circuit 50.

FIG. 4 is a flowchart showing operations of the oscillation cycle monitor circuit 50.

As shown in FIG. 4, after the semiconductor integrated circuit 1*b* begins detection processing, if the oscillation stability detection signal S7 is not being output from the oscillation stability judgment subunit 32 (step S221: NO), the oscillation cycle monitor circuit 50 supplies the oscillation stability detection EN signal S8 to the clock gating circuits 44 and 45 (step S222).

After the detection processing has begun, if the oscillation stability detection signal S7 is output from the oscillation stability judgment subunit 32 (step S221: YES), the oscillation cycle monitor circuit 50 stops outputting the oscillation stability detection EN signal S8 to the clock gating circuits 44 and 45 (step S223).

Thereafter, the oscillation cycle monitor 50 waits until a re-detection timing is reached (step S244: NO), and when the re-detection timing is reached (step S224: YES), outputs the oscillation stability detection EN signal S8 for a predetermined number of clock cycles of the low-speed clock signal (step S225).

The oscillation cycle monitor circuit 50 detects whether the oscillation cycle match signal S6 has been output from the oscillation cycle comparison subunit 22 in a predetermined time period from the output of the oscillation stability detection EN signal S8 (step S226). Upon detecting the oscillation cycle match signal S6 (step S226:YES), the oscillation cycle monitor circuit 50 repeats the processing of steps S224 to S226.

In step S226, if the oscillation cycle match signal S6 is not detected (step S226: NO), the oscillation cycle monitor circuit 50 outputs the oscillation abnormality detection signal S9 to the CPU 10 and the clock gating circuit 46 (step S227).

The following are supplementary remarks on steps S224 and S225. Specifically, the following describes the period of time for which the oscillation cycle monitor circuit 50 outputs the oscillation stability detection EN signal S8, the timing at which the oscillation cycle monitor circuit 50 performs re-detection, and when the oscillation cycle monitor circuit 50 outputs the oscillation abnormality detection signal S9.

As one example in the present embodiment, in step S225 the oscillation cycle monitor circuit 50 outputs the oscillation stability detection EN signal S8 to the clock gating circuits 43 and 44 for a time period that corresponds to two clock cycles of the low-speed clock signal S1. This time period is used in order to clear the counter value of the oscillation counter 23, cause the oscillation counter 23 to perform counting, and cause the oscillation cycle comparison subunit 22 to perform a comparison.

Also, the oscillation cycle monitor circuit 50 begins to supply the oscillation stability detection EN signal S8 at a timing that is before a rising edge in the low-speed clock G signal S3 (clock pulse) and after a falling edge in the immediately previously generated pulse. However, the length of the time period from a rising edge of the oscillation stability detection EN signal S8 to a rising edge in the low-speed clock G signal S3 is less than or equal to half of one clock cycle of the low-speed clock G signal S3.

Also, if the oscillation cycle match signal S6 is not output from the oscillation cycle comparison subunit 22 during a time period corresponding to two clock cycles of the low-speed clock signal S1 from when the output of the oscillation stability detection EN signal S8 began (i.e., if the oscillation cycle match signal S6 is not output while the oscillation stability detection EN signal S8 is being output), the oscillation cycle monitor circuit 50 outputs the oscillation abnormality detection signal S9 to the CPU 10 etc. in synchronization with the low-speed clock G signal s3.

Also, the oscillation cycle monitor circuit 50 periodically outputs the oscillation stability detection EN signal S8, where a time period corresponding to four clock cycles of the low-speed clock signal S1 is set as the length of one re-detection period of the oscillation cycle monitor circuit 50.

2.2.7.3. Supplementary Remarks on the Oscillation Cycle Monitor Circuit 50

Note that the above-described time period for which the oscillation stability detection EN signal S8 is output, timing at which the supply of the oscillation stability detection EN signal S8 is begun, timing of the output of the oscillation abnormality detection signal S9, and re-detection period of the oscillation cycle monitor circuit 50 are merely examples, and the present embodiment is not limited to these.

The following are supplementary remarks on the time period for which the oscillation stability detection EN signal S8 is output and the timing at which the supply of the oscillation stability detection EN signal S8 is begun.

(Time Period for which the Oscillation Stability Detection EN Signal S8 is Output)

Since the oscillation cycle comparison subunit 22 that operates based on the low-speed clock G signal S3 must perform a comparison, the oscillation cycle monitor circuit 50 must be outputting the oscillation stability detection EN signal S8 when the low-speed clock signal S1 is input to the clock gating circuit 44. However, the time period for which the oscillation stability detection EN signal S8 is output may be shorter than one clock cycle of the low-speed clock signal S1. This is because whether or not the oscillation cycle comparison subunit 22 outputs the oscillation cycle match signal S6 is determined based on the time period for which the high-speed clock G signal S4 is input to the oscillation counter 23 and the value stored in the counter number setting register 21.

For example, the oscillation cycle monitor circuit 50 may output the oscillation stability detection EN signal S8 for half of one clock cycle of the low-speed clock signal S1 after the counter value of the oscillation counter 23 has been cleared. This structure causes the end of the output of the oscillation stability detection EN signal S8 to overlap with the rising edge of the low-speed clock signal S1. As a result, the high-speed clock G signal S4 is input to the oscillation counter 23 for half of one clock cycle of the low-speed clock signal S1.

This structure is achieved by, for example, the following. First, the output of the oscillation stability detection EN signal S8 is suppressed, and at predetermined time the low-speed clock G signal S3 is input to the oscillation counter 23 to clear the counter value. Thereafter, the output of the oscillation stability detection EN signal S8 is begun at the timing of a falling edge of the low-speed clock signal S1, and then stopped at the timing of the subsequent rising edge of the low-speed clock signal S1. Note that in this case, the above structure can be achieved using only the low-speed clock signal S1, without the provision of circuits etc. Here, the length of a low (LO) period and the length of a high (HI) period in clock pulses of the low-speed clock signal S1 are substantially the same.

The number of high-speed clock signals that are generated in half of one clock cycle of the low-speed clock signal S1 when the oscillation of the high-speed oscillation has stabilized is stored in the counter number setting register 21. Note that if the ratio between the lengths of the low and high periods of clock pulses in the low-speed clock signal S1 is known, the value stored in the counter number setting register 21 may be set according to the ratio, and the oscillation cycle monitor circuit 50 may output the oscillation stability detection EN signal S8 between the rising and falling edges of the low-speed clock signal S1.

This structure enables the oscillation cycle comparison subunit 22 to output the oscillation cycle match signal S6 when the oscillation of the high-speed oscillator has stabilized. In other words, the oscillation cycle monitor circuit 50 can perform re-detection. The time period for which the oscillation stability detection EN signal S8 is output is of course not limited to half of one clock cycle of the low-speed clock signal S1.

As is clear in the above description, the value stored in the counter number setting register 21 when switching from standby mode to normal mode may be different from the value stored in the counter number setting register 21 when the oscillation cycle monitor circuit 50 performs re-detection. The value stored in the counter number setting register 21 when the oscillation cycle monitor circuit 50 performs re-detection is determined according to the time period for which the oscillation cycle monitor circuit 50 supplies the high-speed clock G signal S4 to the oscillation cycle judgment unit 20.

When re-detection is performed, the low-speed clock G signal S3 and high-speed clock G signal S4 are supplied to the oscillation cycle judgment unit 20, thereby consuming power. It is therefore desirable to adjust the time period for which the oscillation cycle monitor circuit 50 outputs the oscillation stability detection EN signal S8 to the clock gating circuits 44 and 45 during re-detection, without causing any negative effects on the precision of the re-detection.

When the oscillation cycle monitor circuit 50 performs re-detection, the value stored in the counter number setting register 21 is determined in accordance with the time period for which the high-speed clock G signal S4 is supplied to the oscillation cycle judgment unit 20. There are various timings at which this value may be stored in the counter number setting register 21. For example, this value may be stored in the counter number setting register 21 when stopping the supply of the oscillation stability detection EN signal S8 to the clock gating circuits 44 and 45 in step S223.

Also, the value stored in the counter number setting register 21 when re-detection is performed may be a pre-determined value. In this case, the time period for which the oscillation stability detection EN signal S8 is supplied to the clock gating circuits 44 and 45 during re-detection is also determined. Processing for storing this value in the counter number setting register 21 and processing for determining the time period for which the oscillation stability detection EN signal S8 is supplied to the clock gating circuits 44 and 45 may be performed by the oscillation cycle monitor circuit 50, by another circuit, or by software.

Also, the oscillation cycle monitor circuit 50 may be structured so as to receive an input of the low-speed clock signal S1 from the low-speed oscillator. This structure enables the oscillation cycle monitor circuit 50 to acquire the timing of the generation of the low-speed clock signal S1. In this case, using the rising and falling edges of the low-speed clock signal S1 (i.e., the HI sections and LO sections of the low-speed clock signal S1) enables the oscillation cycle monitor circuit 50 to easily obtain the time period corresponding to half of one clock cycle of the low-speed clock signal S1. Using a PLL (Phase-Locked Loop) circuit or the like enables the oscillation cycle monitor circuit 50 to obtain various time periods other than half of one clock cycle of the low-speed clock signal S1.

(Timing at which the Oscillation Stability Detection EN Signal S8 is Output)

The following are supplementary remarks on the timing at which the oscillation abnormality detection signal S9 is output.

Instead of being limited to the exemplary timing described above, the oscillation cycle monitor circuit 50 may output the oscillation abnormality detection signal S9 if the oscillation cycle match signal S6 is not output from the oscillation cycle comparison subunit 22 in a predetermined time period from when the low-speed clock G signal S3 is input to the oscillation cycle comparison subunit 22 during re-detection.

The predetermined time period referred to here is determined in consideration of a time period corresponding to a time lag from when the oscillation cycle comparison subunit 22 receives the low-speed clock G signal S3 until when the oscillation cycle match signal S6 is output. In other words, since the oscillation cycle match signal S6 is not output during a time period corresponding to the time lag from when the low-speed clock G signal S3 is received by the oscillation cycle comparison subunit 22, the predetermined time period must be longer than the time lag.

Note that if the predetermined time period is too short, before the oscillation cycle match signal S6 is actually output, there is a possibility of the oscillation cycle monitor circuit 50 judging too quickly that there is no output of the oscillation cycle match signal S6, and the oscillation cycle monitor circuit 50 would therefore output the oscillation abnormality detection signal S9. The predetermined time period must therefore be determined in consideration of precision in re-detection.

(Timing of Re-Detection)

As described above, in the semiconductor integrated circuit 1b of embodiment 2, after the oscillation of the high-speed oscillator has been detected as being stable, the oscillation cycle monitor circuit 50 performs re-detection at a predetermined interval. Although the re-detection is performed periodically in the above-described example, the timing of the re-detection is not limited to this.

For example, if an abnormal operation is detected after the information processing system has begun operating in normal mode, software etc. may cause the oscillation cycle monitor circuit 50 to perform re-detection. One example of an abnormal operation is the abnormal termination of a program due to the occurrence of an error. This structure enables a user etc. of the information processing system to find out whether the program abnormally terminated due to a bug etc. or due to instability in the oscillation of the high-speed oscillator.

(After Output of the Oscillation Abnormality Detection Signal S9)

In the above example, the oscillation cycle monitor circuit 50 is described as ending operations after outputting the oscillation abnormality detection signal S9. However, since the oscillation abnormality detection signal S9 is output to the CPU 10, the semiconductor integrated circuit 1b may again perform processing for detecting whether the oscillation of the high-speed oscillator has stabilized. For example, after the oscillation cycle monitor circuit 50 outputs the oscillation abnormality detection signal S9 to the CPU 10, the CPU 10 may receive the oscillation abnormality detection signal S9, cause the information processing system to switch to standby mode, and cause the oscillation cycle monitor circuit 50 to start the processing of FIG. 4.

2.3. Operations

The following describes operations of the semiconductor integrated circuit 1b having the structure described above.

Figure 5:
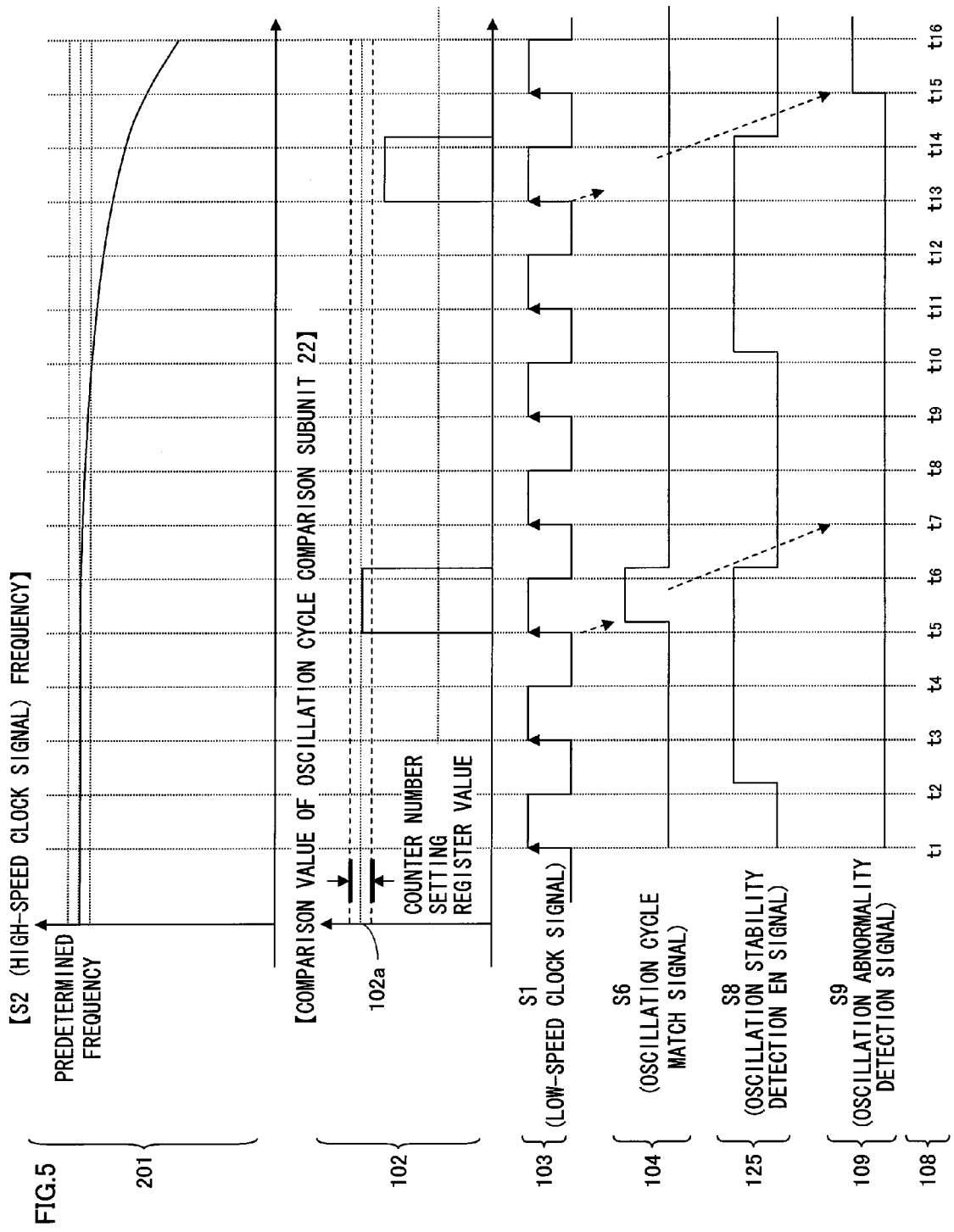
FIG. 5 shows an exemplary operation scenario of the semiconductor integrated circuit 1b in embodiment 2.

FIG. 5 shows an exemplary operation scenario of the semiconductor integrated circuit 1b in embodiment 2.

Beginning from the top, FIG. 5 shows a high-speed clock generation state 201, the oscillation cycle comparison operation 102, the low-speed clock generation state 103, the S6 output state 104, an S8 output state 125, an S9 output state 109, and time 108.

Note that the same reference numbers have been used for portions that are the same as in FIG. 2 of embodiment 1, and descriptions thereof have been omitted.

High-speed clock generation state 201 shows the state of generation of the high-speed clock signal S2 by the high-speed oscillator after the oscillation thereof has stabilized and the information processing system has switched from standby mode to normal mode.

S8 output state 125 shows a relationship between the oscillation stability detection EN signal S8 output from the oscillation cycle monitor circuit 50 and time.

S9 output state 109 shows a relationship between the oscillation abnormality detection signal S9 output from the oscillation cycle monitor circuit 50 and time.

Note that in FIG. 5, re-detection is performed by the oscillation cycle monitor circuit 50 in a period of four clock cycles of the low-speed clock signal S1. For example, the oscillation cycle monitor circuit 50 performs re-detection from t1 to t8 as one period.

During the section from t1 to t8, the oscillation cycle monitor circuit 50 begins outputting the oscillation stability detection EN signal S8 before the rising edge of the low-speed clock signal S1 at t3. In FIG. 5, the oscillation cycle monitor circuit 50 begins outputting the oscillation stability detection EN signal S8 between t2 and t3. The oscillation cycle monitor circuit 50 continues to output the oscillation stability detection EN signal S8 for a time period corresponding to two clock cycles of the low-speed clock signal S1 (see t2 to t7 in S8 output state 125).

The oscillation counter 23 detects the rising edge of the low-speed clock signal S1 at time t3, clears the counted number, and begins to count the high-speed clock signal S2.

The oscillation cycle comparison subunit 22 performs a comparison, and according to the result of the comparison, outputs the oscillation cycle match signal S6 (see t5 to t6 in S6 output state 104).

If an input of the oscillation cycle match signal S6 is received, the oscillation cycle monitor circuit 50 does not output the oscillation abnormality detection signal S9 (see t7 to t9 in S9 output state 109).

During t8 to t16, the oscillation cycle monitor circuit 50 performs re-detection. In this case, the high-speed clock signal S2 is not being generated stably, and the oscillation cycle match signal S6 is not output from the oscillation cycle comparison subunit 22 (see t13 to t14 in S6 output state 104).

The oscillation cycle monitor circuit 50 therefore outputs the oscillation abnormality detection signal S9 (see t15 onward in S9 output state 109).

3. Embodiment 3

The following describes another embodiment of the present invention.

3.1. Overview

Figure 6:
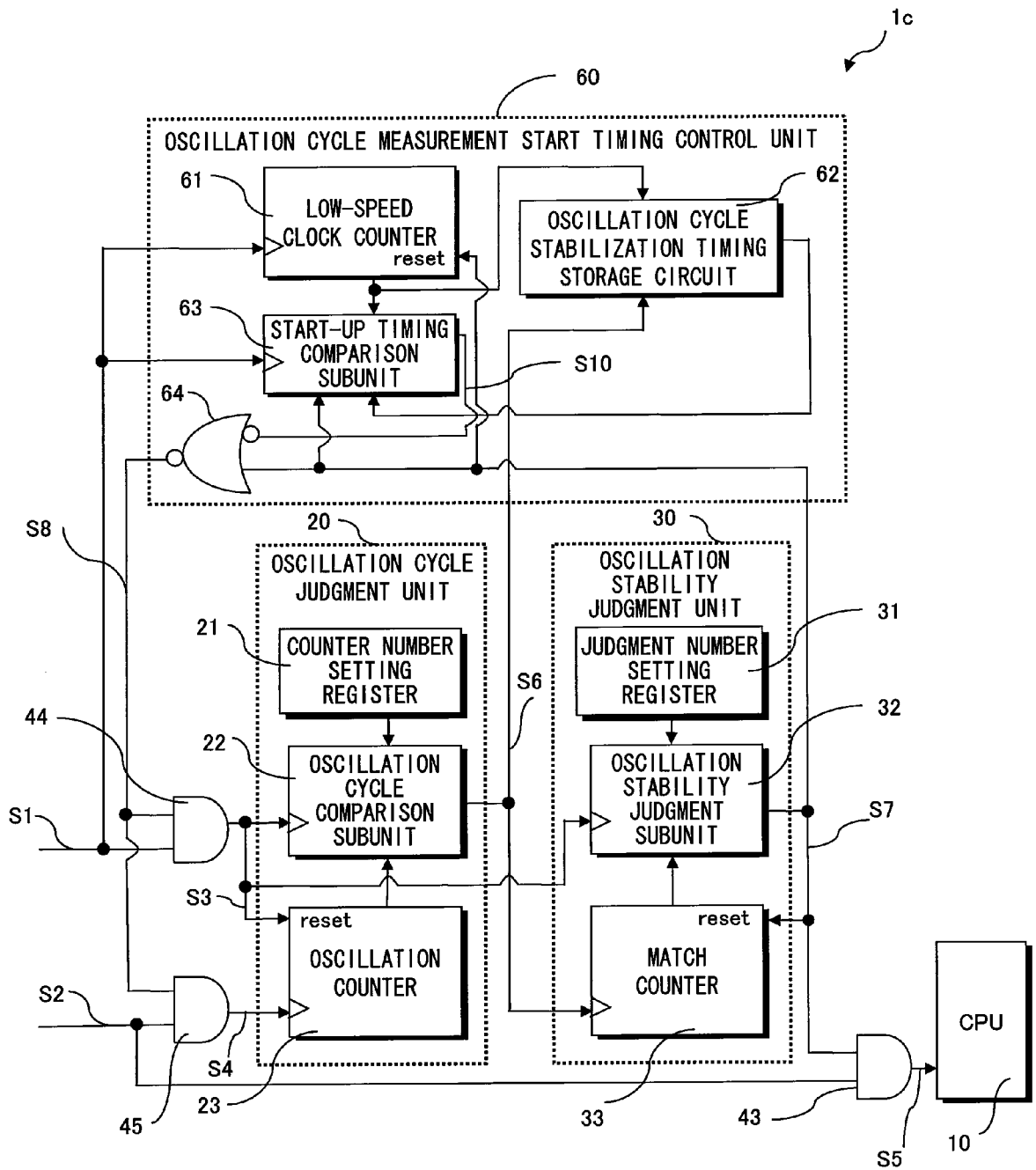
FIG. 6 is a functional block diagram showing a structure of a semiconductor integrated circuit 1c of embodiment 3.

FIG. 6 is a functional block diagram showing the structure of a semiconductor integrated circuit 1c of embodiment 3.

The following description focuses on differences from embodiment 1.

Embodiment 3 differs from embodiment 1 in that the semiconductor integrated circuit 1c includes an oscillation cycle measurement start timing control unit 60.

Also, the semiconductor integrated circuit 1c includes a clock gating circuit 44 instead of the clock gating circuit 41, and a clock gating circuit 45 instead of the clock gating circuit 42.

A description of the functions of the counter number setting register 21, the judgment number setting register 31, and the match counter 33 and the connections therebetween has been omitted since they are the same as in embodiment 1.

The oscillation cycle measurement start timing control unit 60 counts and stores the number of low-speed clock signals S1 that are received between when the semiconductor integrated circuit 1c begins performing detection processing and when the oscillation cycle comparison subunit 22 of the oscillation cycle judgment unit 20 outputs the oscillation cycle match signal S6.

When the semiconductor integrated circuit 1c again performs the detection processing after the detection processing has already been performed, the oscillation cycle measurement start timing control unit 60 delays the supply of the low-speed clock signal S1 and high-speed clock signal S2 to the oscillation cycle judgment unit 20 until the number of low-speed clock signals S1 input to the semiconductor integrated circuit 1c reaches the number stored in the oscillation cycle measurement start timing control unit 60. In other words, the operation of the oscillation cycle judgment unit 20 is suppressed from when the oscillation of the high-speed oscillator begins oscillating until the frequency of the high-speed clock signal S2 first reaches the predetermined frequency (a time period corresponding to from when the detection processing begins until when the oscillation cycle judgment unit 20 outputs the oscillation cycle match signal S6), thereby realizing low power consumption in the semiconductor integrated circuit 1c.

3.2. Structure

The following describes a specific structure of the semiconductor integrated circuit 1c of embodiment 3.

As shown in FIG. 6, the oscillation cycle measurement start timing control unit 60 includes a low-speed clock counter 61, an oscillation cycle stabilization timing storage circuit 62, a start-up timing comparison subunit 63, and a clock gating control circuit 64.

3.2.1. Low-Speed Clock Counter 61

The low-speed clock counter 61 receives the low-speed clock signal S1. Also, the low-speed clock counter 61 is connected to the start-up timing comparison subunit 63, the oscillation cycle stabilization timing storage circuit 62, and the oscillation stability judgment subunit 32.

After the semiconductor integrated circuit 1c has begun detection processing, the low-speed clock counter 61 receives the low-speed clock signal S1 and counts the number of low-speed clock signals S1. Also, upon detecting the reception of the oscillation stability detection signal S7 output from the oscillation stability judgment subunit 32, the low-speed clock counter 61 resets the counter value.

3.2.2. Oscillation Cycle Stabilization Timing Storage Circuit 62

The oscillation cycle stabilization timing storage circuit 62 is connected to the low-speed clock counter 61, the start-up timing comparison subunit 63, and the oscillation cycle comparison subunit 22.

The oscillation cycle stabilization timing storage circuit 62 receives an input of the oscillation cycle match signal S6 output from the oscillation cycle comparison subunit 22. Upon detecting a rising edge in the oscillation cycle match signal S6, the oscillation cycle stabilization timing storage circuit 62 acquires and stores the counter value of the low-speed clock counter 61.

Note that the oscillation cycle stabilization timing storage circuit 62 may periodically clear the value stored therein. Also, when the semiconductor integrated circuit 1c first performs detection processing, a value of "0", for example, is pre-stored in the oscillation cycle stabilization timing storage circuit 62.

3.2.3. Start-Up Timing Comparison Subunit 63

The start-up timing comparison subunit 63 receives an input of the low-speed clock signal S1. Also, the start-up timing comparison subunit 63 is connected to the low-speed clock counter 61, the oscillation cycle stabilization timing storage circuit 62, the oscillation stability judgment subunit 32, and the clock gating control circuit 64.

The start-up timing comparison subunit 63 operates in synchronization with the low-speed clock signal S1, and compares the value stored in the oscillation cycle stabilization timing storage circuit 62 and the counter value of the low-speed clock counter 61. If the compared values match, or a difference between the two is less than or equal to a predetermined value, the start-up timing comparison subunit 63 begins to output a start-up timing match signal S10 to the clock gating control circuit 64. In the present embodiment, the start-up timing comparison subunit 63 begins to output the start-up timing match signal S10 if the difference between the value stored in the oscillation cycle stabilization timing storage circuit 62 and the counter value of the low-speed clock counter 61 is less than or equal to 1.

Also, upon receiving an input of the oscillation stability detection signal S7, the start-up timing comparison subunit 63 stops outputting the start-up timing match signal S10. Note that although the trigger here for stopping the output of the start-up timing match signal S10 is the input of the oscillation stability detection signal S7, the present embodiment is not limited to this. Instead, the output of the start-up timing match signal S10 may be stopped when the information processing system switches to standby mode.

3.2.4. Clock Gating Control Circuit 64

The clock gating control circuit 64 is connected to the start-up timing comparison subunit 63, the oscillation stability judgment subunit 32, the clock gating circuit 44, and the clock gating circuit 45. The clock gating control circuit 64 receives an input of an inversion of the start-up timing match signal S10 output from the start-up timing comparison subunit 63.

The clock gating control circuit 64 is a NOR circuit that receives the oscillation stability detection signal S7 output from the oscillation stability judgment subunit 32 and an inversion of the output start-up timing match signal S10. Depending on the result of a logical operation performed by the NOR circuit, the oscillation stability detection EN signal S8 is output to the clock gating circuits 44 and 45. More specifically, if the oscillation stability detection signal S7 is received, if the start-up timing match signal S10 is not received, or if both of the above are true, the clock gating control circuit 64 does not output the oscillation stability detection EN signal S8 to the clock gating circuits 44 and 45. If the oscillation stability detection signal S7 is not received, and furthermore the start-up timing match signal S10 is received, the clock gating control circuit 64 outputs the oscillation stability detection EN signal S8 to the clock gating circuits 44 and 45.

3.2.5. Oscillation Counter 23

The oscillation counter 23 of the present embodiment is the same as the oscillation counter 23 described in embodiment 1, with the exception of replacing the clock gating circuits 41 and 42 with the clock gating circuits 44 and 45 respectively.

3.2.6. Oscillation Cycle Comparison Subunit 22

In embodiment 3, the oscillation cycle comparison subunit 22 is connected to the clock gating circuit 44 instead of the clock gating circuit 41. The oscillation cycle comparison subunit 22 is also connected to the oscillation cycle stabilization timing storage circuit 62.

The oscillation cycle comparison subunit 22 outputs the oscillation cycle match signal S6 to the match counter 33 as well as the oscillation cycle stabilization timing storage circuit 62.

3.2.7. Oscillation Stability Judgment Subunit 32

In embodiment 3, the oscillation stability judgment subunit 32 is connected to the clock gating circuits 43 and 44, the clock gating control circuit 64, the start-up timing comparison subunit 63, the low-speed clock counter 61, and the match counter 33.

In embodiment 3, the oscillation stability judgment subunit 32 operates in synchronization with the low-speed clock G signal S3 output from the clock gating circuit 44.

Also, the oscillation stability judgment subunit 32 outputs the oscillation stability detection signal S7 to clock gating circuit 43, the clock gating control circuit 64, the start-up timing comparison subunit 63, the low-speed clock counter 61, and the match counter 33

3.2.8. Clock Gating Circuit 44

As shown in FIG. 6, the clock gating circuit 44 receives an input of the low-speed clock signal S1, and controls the output of the low-speed clock G signal S3. Also, a difference from the clock gating circuit 41 of embodiment 1 is that the clock gating circuit 44 is connected to the clock gating control circuit 64. The clock gating circuit 44 is an AND circuit that receives the oscillation stability detection EN signal S8 and the low-speed clock signal S1.

3.2.9. Clock Gating Circuit 45

As shown in FIG. 6, the clock gating circuit 45 receives an input of the high-speed clock signal S2, and controls the output of the high-speed clock G signal S4. Also, the clock gating circuit 45 is connected to the oscillation counter 23 and the clock gating control circuit 64. The clock gating circuit 45 is an AND circuit that receives the oscillation stability detection EN signal S8 and the high-speed clock signal S2.

3.3. Operations

The following describes operations of the semiconductor integrated circuit 1c having the structure described above.

Figure 7:
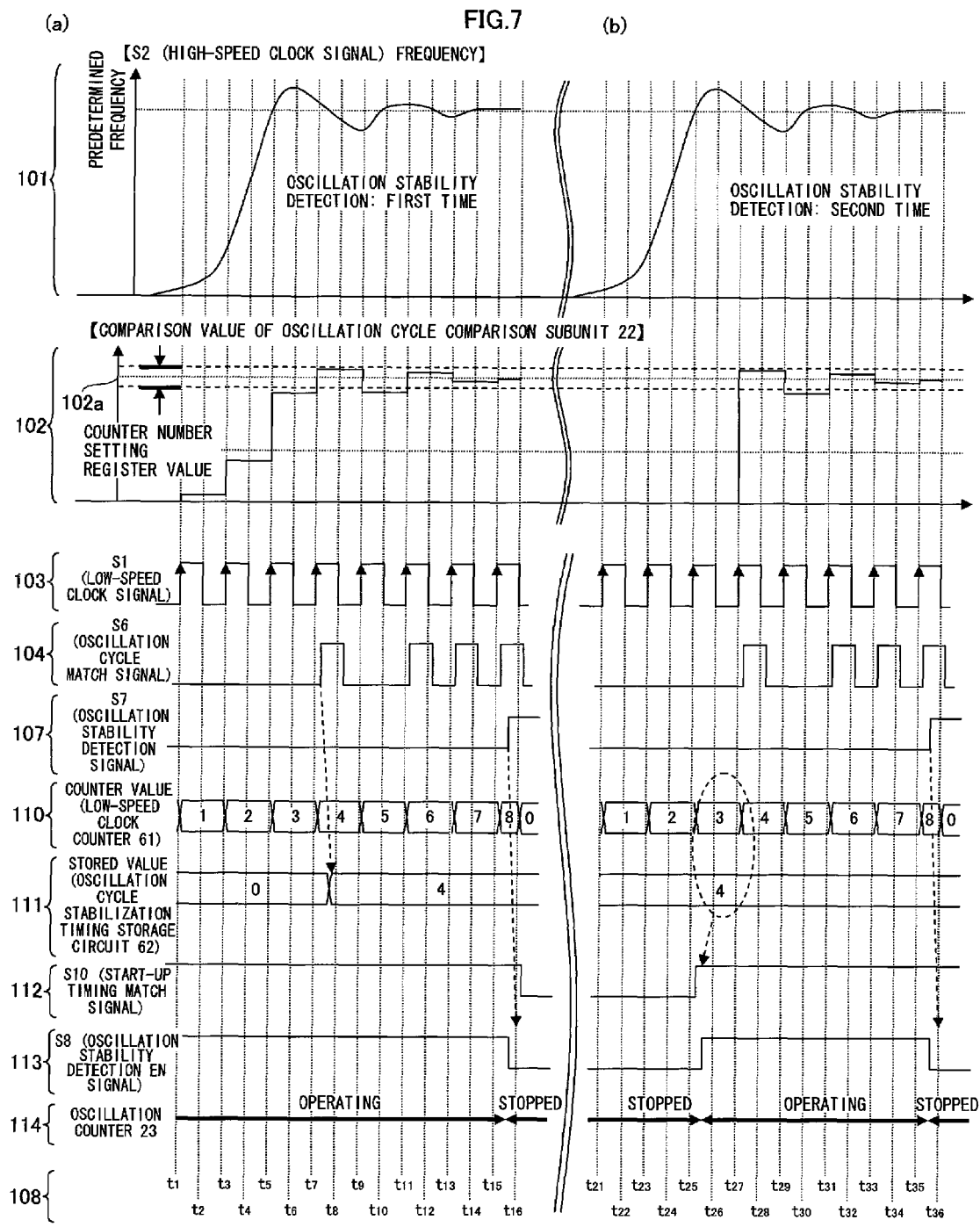
FIG. 7 shows exemplary operation scenarios of the semiconductor integrated circuit 1c in embodiment 3.

FIG. 7 shows exemplary operation scenarios of the semiconductor integrated circuit 1c in embodiment 3.

Beginning from the top, FIG. 7 shows the high-speed clock generation state 101, the oscillation cycle comparison operation 102, the low-speed clock generation state 103, the S6 output state 104, the S7 output state 107, a low-speed clock counter value 110, an oscillation cycle stabilization timing stored value 111, an S10 output state 112, an S8 output state 113, an oscillation counter operation state 114, and time 108.

Note that the same reference numbers have been used for portions that are the same as in embodiment 1, and descriptions thereof have been omitted.

Low-speed clock counter value 110 shows a relationship between the counter value of the low-speed clock counter 61 and time.

Oscillation cycle stabilization timing stored value 111 shows a relationship between the value stored in the oscillation cycle stabilization timing storage circuit 62 and time.

S10 output state 112 shows a relationship between the start-up timing match signal S10 output from the start-up timing comparison subunit 63 and time.

S8 output state 113 shows a relationship between the output of the oscillation stability detection EN signal S8 by the clock gating control circuit 64 and time.

Oscillation counter operation state 114 shows whether or not the oscillation counter 23 is operating, in correspondence with time. The above operating refers to the oscillation counter 23 counting the high-speed clock G signal S4 due to receiving a supply of the oscillation stability detection EN signal S8 from the clock gating circuit 45.

FIG. 7(a) shows an exemplary operation scenario in which the semiconductor integrated circuit 1c performs a first instance of detection processing or the stored value of the oscillation cycle stabilization timing storage circuit 62 has been cleared.

In this exemplary operation scenario, the oscillation cycle stabilization timing storage circuit 62 stores a value of "0" (see t1 to t8 in oscillation cycle stabilization timing stored value 111). Since a difference between the stored value of the oscillation cycle stabilization timing storage circuit 62 and the counter value of the low-speed clock counter 61 is less than or equal to 1, the startup timing comparison subunit 63 outputs the start-up timing match signal S10.

Upon the oscillation cycle comparison subunit 22 outputting the oscillation cycle match signal S6, the oscillation cycle stabilization timing storage circuit 62 acquires and stores the counter value of the low-speed clock counter 61 (see t7 to t8 in oscillation cycle stabilization timing stored value 111).

Thereafter, upon the oscillation stability judgment subunit 32 outputting the oscillation stability detection signal S7 (see t15 to t16 in S7 output state 107), the low-speed clock counter 61 resets the counter value (see t15 onward in low-speed clock counter value 110), and the start-up timing comparison subunit 63 stops outputting the start-up timing match signal S10 (see t15 onward in S10 output state 112). Also, the clock gating control circuit 64 stops supplying the oscillation stability detection EN signal S8 to the clock gating circuits 44 and 45 (see t15 onward in S8 output state 113). Since the supply of the oscillation stability detection EN signal S8 has stopped, the oscillation counter 23 stops operating (see t15 onward in oscillation counter operation state 114).

The following describes a second or later instance of detection processing.

FIG. 7(b) shows an exemplary operation scenario in which the semiconductor integrated circuit 1c performs a second or later instance of detection processing.

Note that as described above, the start-up timing comparison subunit 63 begins outputting the start-up timing match signal S10 if a difference between the value stored in the oscillation cycle stabilization timing storage circuit 62 and the counter value of the low-speed clock counter 61 is less than or equal to 1. Also, as shown in FIG. 7(a), the oscillation cycle stabilization timing storage circuit 62 stores a value of "4".

After detection processing has begun, the low-speed clock counter 61 counts the number of low-speed clock signals S, and if a difference between the counted value and the value stored in the oscillation cycle stabilization timing storage circuit 62 is less than or equal to 1, the start-up timing comparison subunit 63 begins outputting the start-up timing match signal S10 (see t25 to t26 in low-speed clock counter value 110, oscillation cycle stabilization timing stored value 111, and S10 output state 112). Upon the start-up timing comparison subunit 63 outputting the start-up timing match signal S10, the clock gating control circuit 64 supplies the oscillation stability detection EN signal S8 to the clock gating circuits 44 and 45 (see t25 to t26 of S8 output state 113). As a result, the oscillation counter 23 begins operating (see t25 to t26 of oscillation counter operation state 114).

Thereafter, the oscillation cycle judgment unit 20 and oscillation stability judgment unit 30 begin operation. Upon the oscillation stability judgment subunit 32 outputting the oscillation stability detection signal S7, the clock gating control circuit 64 stops supplying the oscillation stability detection EN signal S8, as a result of which the oscillation counter 23 stops operating (see t35 to t36 of S8 output state 113 and oscillation counter operation state 114).

4. Embodiment 4

The following describes another embodiment of the present invention.

4.1. Overview

Figure 8:
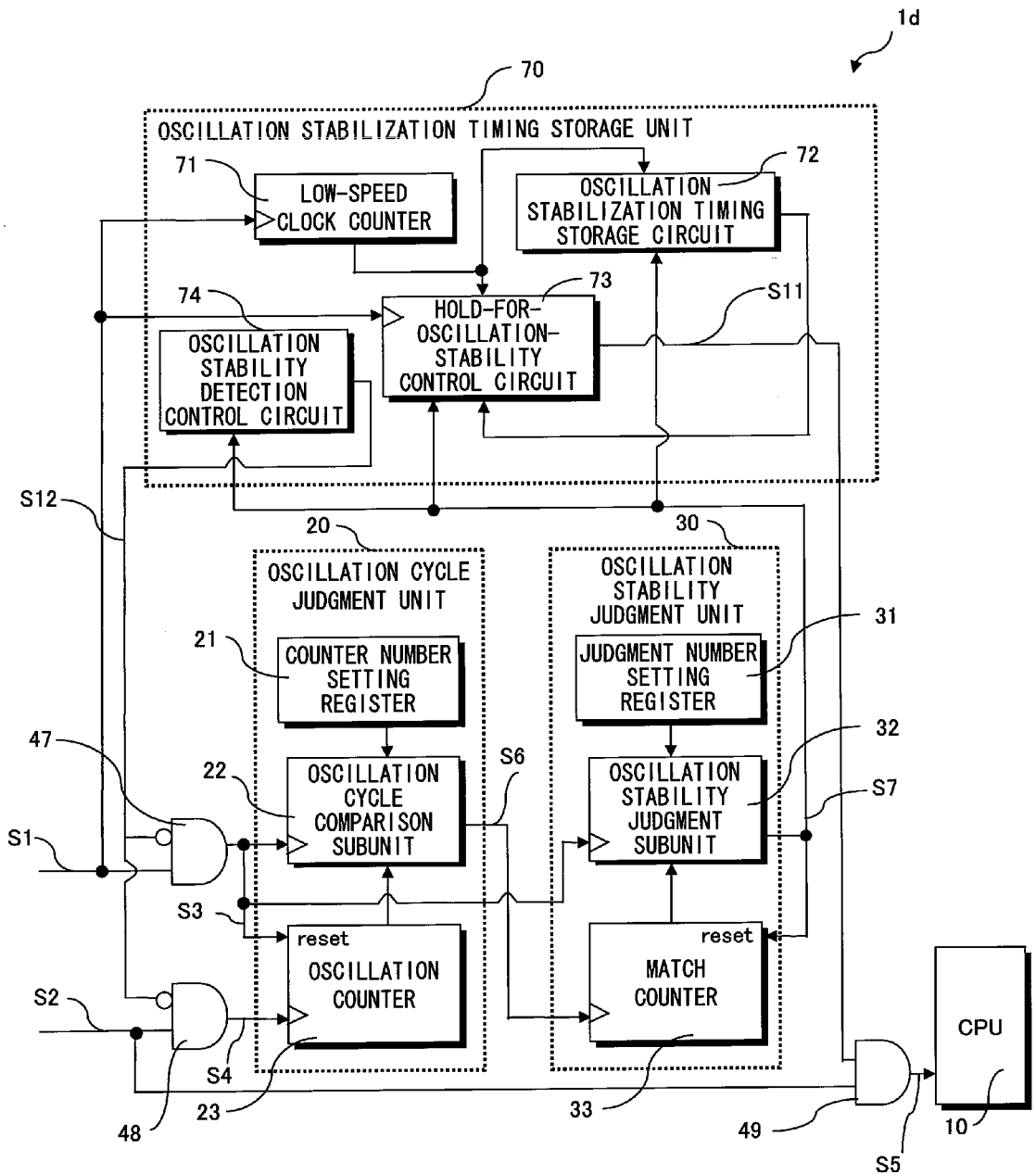
FIG. 8 is a functional block diagram showing a structure of a semiconductor integrated circuit 1d of embodiment 4.

FIG. 8 is a functional block diagram showing the structure of a semiconductor integrated circuit 1d of embodiment 4.

The following description focuses on differences from embodiment 1.

Embodiment 4 differs from embodiment 1 in that the semiconductor integrated circuit 1d includes an oscillation stabilization timing storage unit 70.

Also, the semiconductor integrated circuit 1d includes a clock gating circuit 47 instead of the clock gating circuit 41, a clock gating circuit 48 instead of the clock gating circuit 42, and a clock gating circuit 49 instead of the clock gating circuit 43.

A description of the functions of the counter number setting register 21, the judgment number setting register 31, and the match counter 33 and the connections therebetween has been omitted since they are the same as in embodiment 1.

The oscillation stabilization timing storage unit 70 counts and stores the number of low-speed clock signals S1 generated between when the semiconductor integrated circuit 1d begins detection processing and when the oscillation stability judgment subunit 32 of the oscillation stability judgment unit 30 outputs the oscillation stability detection signal S7.

When the semiconductor integrated circuit 1d again performs the detection processing after the detection processing has already been performed, the oscillation stabilization timing storage unit 70 suppresses the supply of the low-speed clock G signal S3 and the high-speed clock G signal S4 to the oscillation cycle judgment unit 20 and the oscillation stability judgment subunit 30. Also, the oscillation stabilization timing storage unit 70 counts the low-speed clock signal S1, and when the counted number reaches the stored number, the oscillation stabilization timing storage unit 70 outputs a cancel hold-for-oscillation-stability signal S11 to the clock gating circuit 49. Upon receiving the cancel hold-for-oscillation-stability signal S11, the clock gating circuit 49 outputs the high-speed clock S signal S5 to the CPU 10.

In other words, a characteristic feature of embodiment 4 of the present invention is that after the semiconductor integrated circuit 1*d* has performed detection processing once, the next and later instances of detection processing can be performed without supplying clock signals to the oscillation cycle judgment unit 20 and oscillation stability judgment unit 30. This structure realizes low power consumption in the semiconductor integrated circuit 1*d* since the high-speed clock G signal S4 and low-speed clock G signal S3 are not supplied to the oscillation cycle judgment unit 20 and oscillation stability judgment unit 30.

Note that in the present embodiment, power consumption related to oscillation stability detection can be significantly reduced since detection is performed using only the low-speed clock signal S1.

4.2. Structure

The following describes a specific structure of the semiconductor integrated circuit 1*d* of embodiment 4.

As shown in FIG. 8, the oscillation stabilization timing storage unit 70 includes a low-speed clock counter 71, an oscillation stabilization timing storage circuit 72, a hold-for-oscillation-stability control circuit 73, and an oscillation stability detection control circuit 74.

4.2.1. Low-Speed Clock Counter 71

The low-speed clock counter 71 receives an input of the low-speed clock signal S1. Also, the low-speed clock counter 71 is connected to the oscillation stabilization timing storage circuit 72 and the hold-for-oscillation-stability control circuit 73.

When the semiconductor integrated circuit 1*d* begins detection processing, the counter value of the low-speed clock counter 71 is reset. For example, a predetermined circuit for detecting that the information processing system has begun switching from standby mode to normal mode may reset the counter value of the low-speed clock counter 71 when a switch from standby mode to normal mode has been detected.

After the semiconductor integrated circuit 1*d* has begun detection processing, the low-speed clock counter 71 receives the low-speed clock signal S1 and counts the number of low-speed clock signals S1.

4.2.2. Oscillation Stabilization Timing Storage Circuit 72

The oscillation stabilization timing storage circuit 72 is connected to the low-speed clock counter 71, the hold-for-oscillation-stability control circuit 73, and the oscillation stability judgment subunit 32.

The oscillation stabilization timing storage circuit 72 receives an input of the oscillation stability detection signal S7 output from the oscillation stability judgment subunit 32. Upon detecting a rising edge in the oscillation stability detection signal S7, the oscillation stabilization timing storage circuit 72 acquires and stores the counter value of the low-speed clock counter 71. Note that in the present embodiment, the oscillation stabilization timing storage circuit 72 initially stores a value of "0".

Also, the oscillation stabilization timing storage circuit 72 may clear the value stored therein at a predetermined interval (e.g., periodically).

4.2.3. Hold-for-Oscillation-Stability Control Circuit 73

The hold-for-oscillation-stability control circuit 73 receives an input of the low-speed clock signal S1. Also, the hold-for-oscillation-stability control circuit 73 is connected to the low-speed clock counter 71, the oscillation stabilization timing storage circuit 72, the oscillation stability judgment subunit 32, and the clock gating circuit 49.

The hold-for-oscillation-stability control circuit 73 operates in synchronization with the low-speed clock signal S1, and compares the value stored in the oscillation stabilization timing storage circuit 72 and the counter value of the low-speed clock counter 71. If the two compared values match, or a difference therebetween is less than or equal to a predetermined value, the hold-for-oscillation-stability control circuit 73 outputs the cancel hold-for-oscillation-stability signal S11 to the clock gating circuit 49.

Also, upon receiving an input of the oscillation stability detection signal S7 output from the oscillation stability judgment subunit 32, the hold-for-oscillation-stability control circuit 73 outputs the cancel hold-for-oscillation-stability signal S11 to the clock gating circuit 49. In the present embodiment, the cancel hold-for-oscillation-stability signal S11 is output if there is a match between the value stored in the oscillation stabilization timing storage circuit 72 and the counter value of the low-speed clock counter 71.

4.2.4. Oscillation Stability Detection Control Circuit 74

The oscillation stability detection control circuit 74 is connected to the oscillation stability judgment subunit 32 and the clock gating circuits 47 and 48.

When the semiconductor integrated circuit 1*d* performs a first instance of detection processing, or performs detection processing after the stored value of the oscillation stabilization timing storage circuit 72 has been cleared, the oscillation stability detection control circuit 74 receives the oscillation stability detection signal S7 output from the oscillation stability judgment subunit 32, and thereafter outputs the stability detection circuit stop signal S12 to the clock gating circuits 47 and 48. As shown in FIG. 8, an inversion of the stability detection circuit stop signal S12 is input to the clock gating circuits 47 and 48.

The oscillation stability detection control circuit 74 holds, in a storage unit such as a register, a value indicating whether the oscillation stability detection signal S7 has been received from the oscillation stability judgment subunit 32. For example, a value of "1" in the register indicates that the oscillation stability detection signal S7 has been received, and a value of "0" in the register indicates that the oscillation stability detection signal S7 has not been received. If the oscillation stability detection signal S7 has been received, the oscillation stability detection control circuit 74 outputs the stability detection circuit stop signal S12. Note that after the stored value in the oscillation stabilization timing storage circuit 72 has been cleared, the value in the register indicates that the oscillation stability detection signal S7 has not been received. Also, in a first instance of detection processing, the value of the register indicates that the oscillation stability detection signal S7 has not been received.

If the oscillation stability detection signal S7 has been received, the oscillation stability detection control signal 74 outputs the stability detection circuit stop signal S12.

4.2.5. Clock Gating Circuit 47

The clock gating circuit 47 receives an input of the low-speed clock signal S1, and controls the output of the low-speed clock G signal S3. Also, a difference from the clock gating circuit 41 of embodiment 1 is that the clock gating circuit 47 is connected to the oscillation stability detection control circuit 74. The clock gating circuit 47 is an AND circuit that receives the low-speed clock signal S1 and in inversion of the stability detection circuit stop signal S12.

4.2.6. Clock Gating Circuit 48

The clock gating circuit 48 receives an input of the high-speed clock signal S2, and controls the output of the high-speed clock G signal S4. Also, the clock gating circuit 48 is connected to the oscillation counter 23 and the oscillation stability detection control circuit 74. The clock gating circuit 48 is an AND circuit that receives the high-speed clock signal S2 and an inversion of the stability detection circuit stop signal S12.

4.2.7. Clock Gating Circuit 49

The clock gating circuit 49 receives an input of the high-speed clock S signal S2, and controls the output of the high-speed clock S signal S5. Also, the clock gating circuit 49 is connected to the hold-for-oscillation-stability control circuit 73 and the CPU 10. The clock gating circuit 49 outputs the high-speed clock S signal S5 to the CPU 10 until the cancel hold-for-oscillation-stability signal S11 is output from the hold-for-oscillation-stability control circuit 73. The clock gating circuit 49 is an AND circuit that receives the cancel hold-for-oscillation-stability signal S11 and the high-speed clock signal S2.

4.3. Operations

The following describes operations of the semiconductor integrated circuit 1d having the structure described above.

Figure 9:
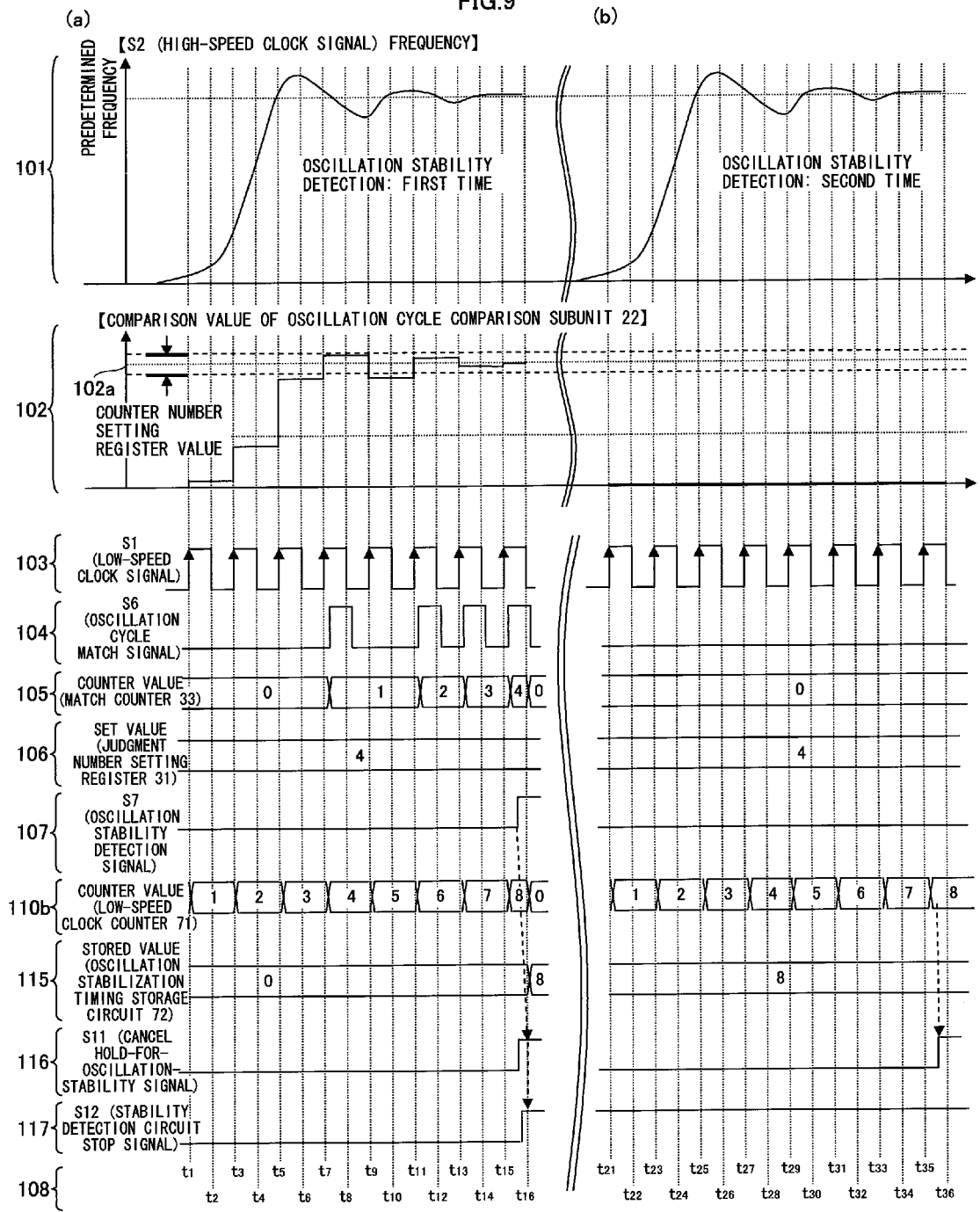
FIG. 9 shows exemplary operation scenarios of the semiconductor integrated circuit 1d in embodiment 4.

FIG. 9 shows exemplary operation scenarios of the semiconductor integrated circuit 1d in embodiment 4.

Beginning from the top, FIG. 7 shows the high-speed clock generation state 101, the oscillation cycle comparison operation 102, the low-speed clock generation state 103, the S6 output state 104, the match counter value 105, the judgment number setting register value 106, the S7 output state 107, a low-speed clock counter value 110b, an oscillation stabilization timing stored value 115, an S11 output state 116, an S12 output state 117, and time 108.

Note that the same reference numbers have been used for portions that are the same as in embodiment 1, and descriptions thereof have been omitted.

Low-speed clock counter value 110b shows a relationship between the counter value of the low-speed clock counter 71 and time.

Oscillation stabilization timing stored value 115 shows a relationship between the value stored in the oscillation stabilization timing storage circuit 72 and time.

S11 output state 116 shows a relationship between the cancel hold-for-oscillation-stability signal S11 output from the hold-for-oscillation-stability control circuit 73 and time.

S12 output state 117 shows a relationship between the stability judgment circuit stop signal S12 output from the oscillation stability detection control circuit 74 and time.

FIG. 9(a) shows an exemplary operation scenario in which the semiconductor integrated circuit 1d performs a first instance of detection processing or the stored value of the oscillation stabilization timing storage circuit 72 has been cleared.

In this exemplary operation scenario, the oscillation stabilization timing storage circuit 72 stores a value of "0" (see t1 onward in oscillation stabilization timing stored value 115).

Since the stability detection circuit stop signal S12 is not being output from the oscillation stability detection control circuit 74, the low-speed clock G signal S3 and high-speed clock G signal S4 are supplied to the oscillation cycle judgment unit 20 and oscillation stability judgment unit 30, and thereafter the oscillation stability judgment subunit 32 outputs the oscillation stability detection signal S7 (see t15 to t16 in S7 output state 107).

Upon receiving an input of the oscillation stability detection signal S7, the oscillation stabilization timing storage circuit 72 acquires and stores the counter value of the low-speed clock counter 71 (see t15 onward in oscillation stabilization timing stored value 115). In this example, a value of "8" is acquired and stored as the counter value. Also, the hold-for-oscillation-stability control circuit 73 receives the oscillation stability detection signal S7, and outputs the cancel hold-for-oscillation-stability signal S11 (see t15 onward in S11 output state 116). Accordingly, the clock gating circuit 49 outputs the high-speed clock S signal S5 to the CPU 10.

Also, the oscillation stability detection control circuit 74 receives the oscillation stability detection signal S7, and outputs the stability detection circuit stop signal S12 (see t15 onward in S12 output state 117). This stops the supply of the low-speed clock G signal S3 and high-speed clock G signal S4 to the oscillation cycle judgment unit 20 and oscillation stability judgment unit 30.

FIG. 9(b) shows an exemplary operation scenario in which the semiconductor integrated circuit 1d performs a second or later instance of detection processing.

Note that as described above, the hold-for-oscillation-stability control circuit 73 outputs the cancel hold-for-oscillation-stability signal S11 if there is a match between the value stored in the oscillation stabilization timing storage circuit 72 and the counter value of the low-speed clock counter 71.

In the second and later instances of detection processing, the low-speed clock G signal S3 and high-speed clock G signal S4 are not supplied to the oscillation cycle judgment unit 20 and oscillation stability judgment unit 30 since the stability detection circuit stop signal S12 is output (see t21 onward in S12 output state 117). Therefore, the oscillation cycle match signal S6 and oscillation stability detection signal S7 are not output, and the match counter 33 does not perform counting (see t21 onward in S6 output state 104, match counter value 105, and S7 output state 107).

If there is a match between the counter value of the low-speed clock counter 71 and the value stored in the oscillation stabilization timing storage circuit 72, the hold-for-oscillation-stability control circuit 73 outputs the cancel hold-for-oscillation-stability signal S11 (see t35 to t36 in S11 output state 116).

5. Embodiment 5

The following describes another embodiment of the present invention.

5.1. Overview

Figure 10:
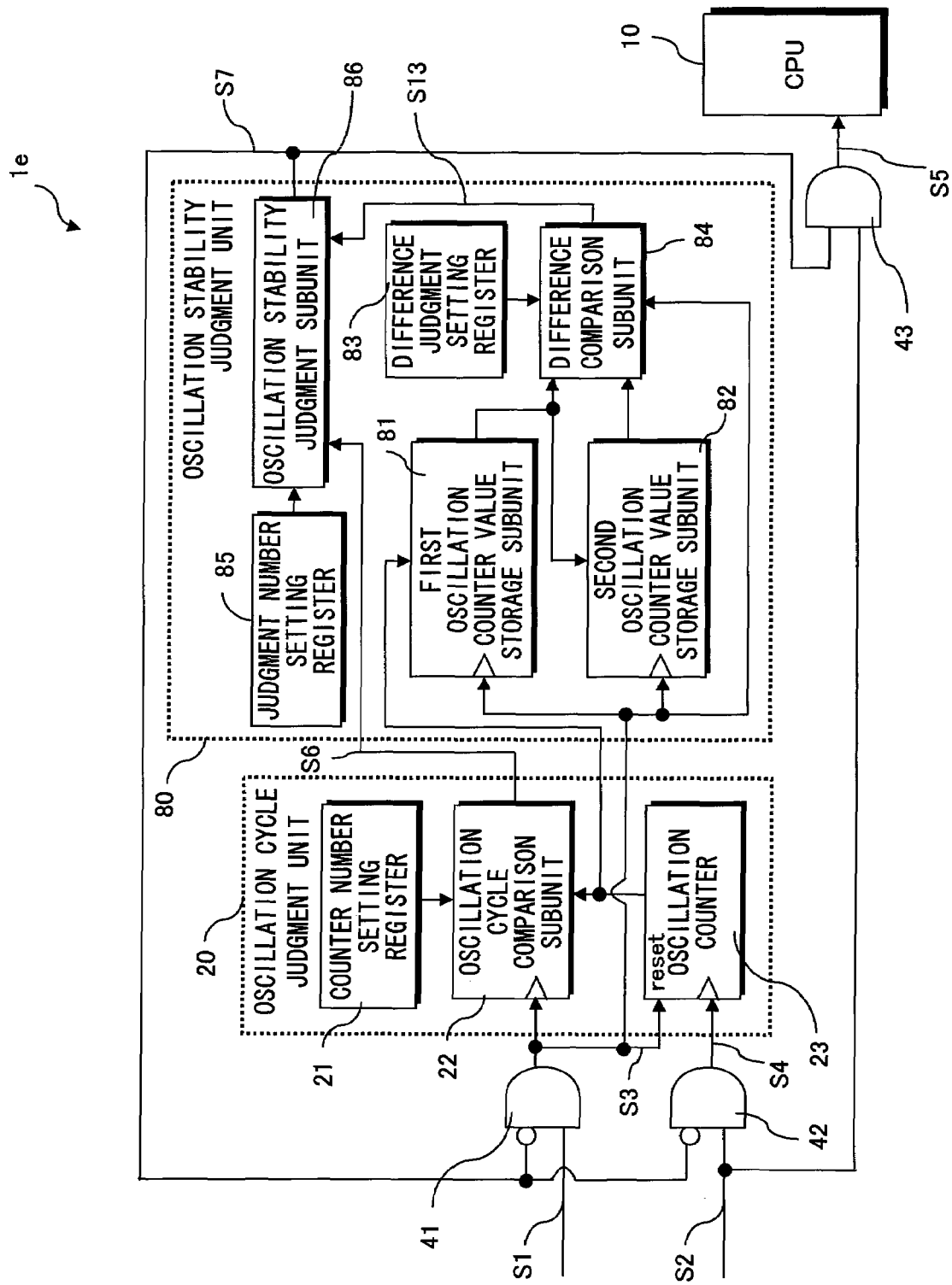
FIG. 10 is a functional block diagram showing a structure of a semiconductor integrated circuit 1e of embodiment 5.

FIG. 10 is a functional block diagram showing the structure of a semiconductor integrated circuit 1e of embodiment 5.

The following description focuses on differences from embodiment 1.

Embodiment 5 differs from embodiment 1 in that the semiconductor integrated circuit 1e includes an oscillation stability judgment unit 80 instead of the oscillation stability judgment unit 30.

The oscillation stability judgment unit 80 of embodiment 5 judges whether the variation in the frequency of the high-speed clock signal S2 is large or small, and detects that the oscillation has stabilized if the variation is small. Specifically, the fact that the frequency of the high-speed clock signal S2 has reached a predetermined frequency does not necessarily mean that the oscillation of the high-speed oscillator has stabilized. There are cases in which there is a large amount of variation in the frequency. However, the present embodiment enables judging whether the variation in the frequency is large or small, thereby improving detection precision.

Also, the semiconductor integrated circuit 1e solves the problem in which, if the frequency of the high-speed clock signal S2 has not reached the predetermined frequency due to, for example, an abnormality in the high-speed oscillator, detection cannot be performed by counting at least a predetermined number of clock pulses, such as in conventional technology. This is because the semiconductor integrated circuit 1e performs detection processing based on variations in the high-speed clock signal S2 that has reached the predetermined frequency, that is to say, the frequency of the high-speed clock signal is assumed to have reached the predetermined frequency.

Specifically, in order to judge the amount of variation in the frequency of the high-speed clock signal S2, the oscillation stability judgment unit 80 stores a history of counter values in the oscillation counter 23 that counts the high-speed clock signal S2. When the oscillation of the high-speed oscillator has stabilized, the differences between the values stored in the history should be small. The oscillation stability judgment 80 judges whether the frequency of the high-speed clock signal S2 has stabilized based on the sizes of these differences.

5.2. Structure

The above technology is realized as described below with reference to FIG. 10.

The oscillation stability judgment unit 80 includes a first oscillation counter value storage subunit 81, a second oscillation counter value storage subunit 82, a difference judgment setting register 83, a difference comparison subunit 84, a judgment number setting register 85, and an oscillation stability judgment subunit 86.

5.2.1. First Oscillation Counter Value Storage Subunit 81

The first oscillation counter value storage subunit 81 is connected to the clock gating circuit 41, the oscillation counter 23, the second oscillation counter value storage subunit 82, and the difference comparison subunit 84.

The first oscillation counter value storage subunit 81 operates in synchronization with the low-speed clock G signal S3, and acquires and stores the counter value of the oscillation counter 23. Note that the first oscillation counter value storage subunit 81 acquires and stores the counter value before the oscillation counter 23 receives an input of the low-speed clock G signal S3 and resets its counter value.

5.2.2. Second Oscillation Counter Value Storage Subunit 82

The second oscillation counter value storage subunit 82 is connected to the clock gating circuit 41, the first oscillation counter value storage subunit 81, and the difference comparison subunit 84.

The second oscillation counter value storage subunit 82 operates in synchronization with the low-speed clock G signal S3, and acquires and stores the value stored in the first oscillation counter value storage subunit 81. Note that the value that the second oscillation counter value storage subunit 82 acquires from the first oscillation counter value storage subunit 81 is the counter value that the first oscillation counter value storage subunit 81 acquired from the oscillation counter 23 in synchronization with the immediately previous clock cycle of the low-speed clock G signal S3 to which the second oscillation counter value storage subunit 82 is synchronized. In other words, the second oscillation counter value storage subunit 82 stores the value acquired from the oscillation counter 23 by the first oscillation counter value storage subunit 81 at the immediately previous clock cycle of the low-speed clock G signal S3. For example, even if the low-speed clock G signal S3 is input to the first and second oscillation counter value storage subunits 81 and 82 at substantially the same time, the time period from when the first oscillation counter value storage subunit 81 receives the low-speed clock G signal S3 until the subunit 81 acquires the counter value of the oscillation counter 23 may be delayed by inserting a buffer etc. into the logical circuit.

In other words, the first and second oscillation counter value storage subunits 81 and 82 store a history of the counter values of the oscillation counter 23.

5.2.3. Difference Judgment Setting Register 83

The difference judgment setting register 83 is connected to the difference comparison subunit 84.

The difference judgment setting register 83 is a register in which an arbitrary value can be set. The set value may be a reference value that is several percent of a value indicating the ratio between the frequencies of the high-speed clock signal S2 and the low-speed clock signal S2 (taking the example of embodiment 1, the ratio between the two frequencies is 625, and the set value would be 12, which is approximately 2% of 625). Note that the reference value set in the difference judgment setting register 83 may be increased or decreased in consideration of the amount of variation in the high-speed clock signal S2 after the oscillation of the high-speed oscillator has stabilized. For example, if there is a relatively small amount of variation, a reduced reference value may be set in the difference judgment setting register 83.

5.2.4. Difference Comparison Subunit 84

The difference comparison subunit 84 is connected to the clock gating circuit 41, the first oscillation counter value storage subunit 81, the second oscillation counter value storage subunit 82, the difference judgment setting register 83, and the oscillation stability judgment subunit 86.

The difference comparison subunit 84 operates in synchronization with the low-speed clock G signal S3, and compares the value stored in the first oscillation counter value storage subunit 81 and the value stored in the second oscillation counter value storage subunit 82. If a difference between the compared values is less than or equal to the value stored in the difference judgment setting register 83, the difference comparison subunit 84 outputs the oscillation cycle stability signal S13 to the oscillation stability judgment subunit 86. Note that the difference comparison subunit 84 performs the above comparison after the values stored in the first and second oscillation counter value storage subunits 81 and 82 have been updated due to the reception of the low-speed clock G signal S3.

5.2.5. Judgment Number Setting Register 85

The judgment number setting register 85 is connected to the oscillation stability judgment subunit 86.

The judgment number setting register 85 is a register in which an arbitrary value can be set. In the present embodiment, a value of "2" is set in the judgment number setting register 85.

5.2.6. Oscillation Stability Judgment Subunit 86

The oscillation stability judgment subunit 86 is connected to the oscillation cycle comparison subunit 22, the difference comparison subunit 84, the judgment number setting register 85, and the clock gating circuits 41, 42, and 43.

The oscillation stability judgment subunit 86 receives the oscillation cycle match signal S6 output from the oscillation cycle comparison subunit 22 and the oscillation cycle stability signal S13 output from the difference comparison subunit 84. If the number of oscillation cycle match signals S6 and oscillation cycle stability signals S13 that are received at the same time matches the number set in the judgment number setting register 85, the oscillation stability judgment subunit 86 outputs the oscillation stability detection signal S7.

For example, the oscillation stability judgment subunit 86 includes an AND circuit that receives an input of the oscillation cycle match signal S6 and the oscillation cycle stability signal S13, and a counter that counts the number of pulses that pass through the AND circuit. If the counter value of the counter matches the value stored in the judgment number setting register 85, the oscillation stability judgment subunit 86 outputs the oscillation stability detection signal S7 to the clock gating circuits 41, 42, and 43. Note that the counter value of the counter is cleared when the information processing system switches to normal mode.

5.2.7. Clock Gating Circuit 41

The clock gating circuit 41 of the present embodiment is connected to different constituents than in embodiment 1. As shown in FIG. 10, the clock gating circuit 41 of embodiment 5 is connected to the oscillation cycle comparison subunit 22, the oscillation counter 23, the first oscillation counter value storage subunit 81, the second oscillation counter value storage subunit 82, the difference comparison subunit 84, and the oscillation stability judgment subunit 86. As shown in FIG. 10, the clock gating circuit 41 receives an inversion of the signal output from the oscillation stability judgment subunit 86. The clock gating circuit 41 is an AND circuit that receives the low-speed clock signal S1 and an inversion of the oscillation stability detection signal S7 output from the oscillation stability judgment subunit 86.

5.2.8. Other Remarks

The clock gating circuits 42 and 43 are the same as the clock gating circuits described in embodiment 1, with the exception of replacing the oscillation stability judgment subunit 32 with the oscillation stability judgment subunit 86.

The oscillation cycle comparison subunit 22 is connected to different constituents than in embodiment 1. As shown in FIG. 10, the oscillation cycle comparison subunit 22 is connected to the clock gating circuit 41, the counter number setting register 21, the oscillation counter 23, and the oscillation stability judgment subunit 86. The oscillation cycle comparison subunit 22 outputs the oscillation cycle match signal S6 to the oscillation stability judgment subunit 86.

Also, the oscillation counter 23 is connected to different constituents than in embodiment 1. As shown in FIG. 10, the oscillation counter 23 is connected to the clock gating circuits 41 and 42, the oscillation cycle comparison subunit 22, and the first oscillation counter value storage subunit 81.

The counter number setting register 21 is the same as in embodiment 1.

This structure enables an improvement in detection precision over embodiment 1 to the extent that detection is performed with consideration being given to variations in the frequency of the high-speed clock signal S2.

In the above description, a history of counter values of the oscillation counter 23 that counts the high-speed clock signal S2 is stored by the first oscillation counter value storage subunit 81 and the second oscillation counter value storage subunit 82. However, the number of storage devices that store the counter values of the oscillation counter 23 is not limited to two.

In the above description, the difference comparison subunit 84 outputs the oscillation cycle stability signal S13 depending on a difference between the stored values of the first and second oscillation counter value storage subunits 81 and 82. Since this can be performed by subtraction and does not require any other complicated calculation, the difference comparison subunit 84 can be realized by a simple structure. Note that the difference comparison subunit 84 may control output of the oscillation cycle stability signal S13 using a method other than calculation of a difference between values. For example, the difference comparison subunit 84 may perform a predetermined operation based on the stored values of storage devices such as the first oscillation counter value storage subunit 84, and control output of the oscillation cycle stability signal S13 based on a result of the operation. Examples of the predetermined operation include calculating an average, a distribution, or a standard deviation. The predetermined operation is desirably an operation that can quantify the degree of variation in the frequency of the high-speed clock signal S2. For example, the difference comparison subunit 84 may output the oscillation cycle stability signal S13 if an average of the stored values in the first oscillation counter value storage subunit 81 etc. is in a predetermined range (e.g., a range centered around 625, which indicates a ratio between the frequencies of the high-speed clock signal S2 and the low-speed clock signal S1, where a range varying 1% from the center would be a range of 619 to 631 inclusive). Instead of calculating an average, the difference comparison subunit 84 may obtain a total of the stored values in the first oscillation counter value storage subunit 81 etc., compare the total with a predetermined value, and control output of the oscillation cycle stability signal S13 based on a result of the comparison. Instead of calculating an average, the difference comparison subunit 84 may obtain a distribution, standard deviation, etc. of the stored values, and control output of the oscillation cycle stability signal S13 based on a result of the distribution, standard deviation, etc.

5.3. Operations

The following describes operations of the semiconductor integrated circuit 1e having the structure described above.

Figure 11:
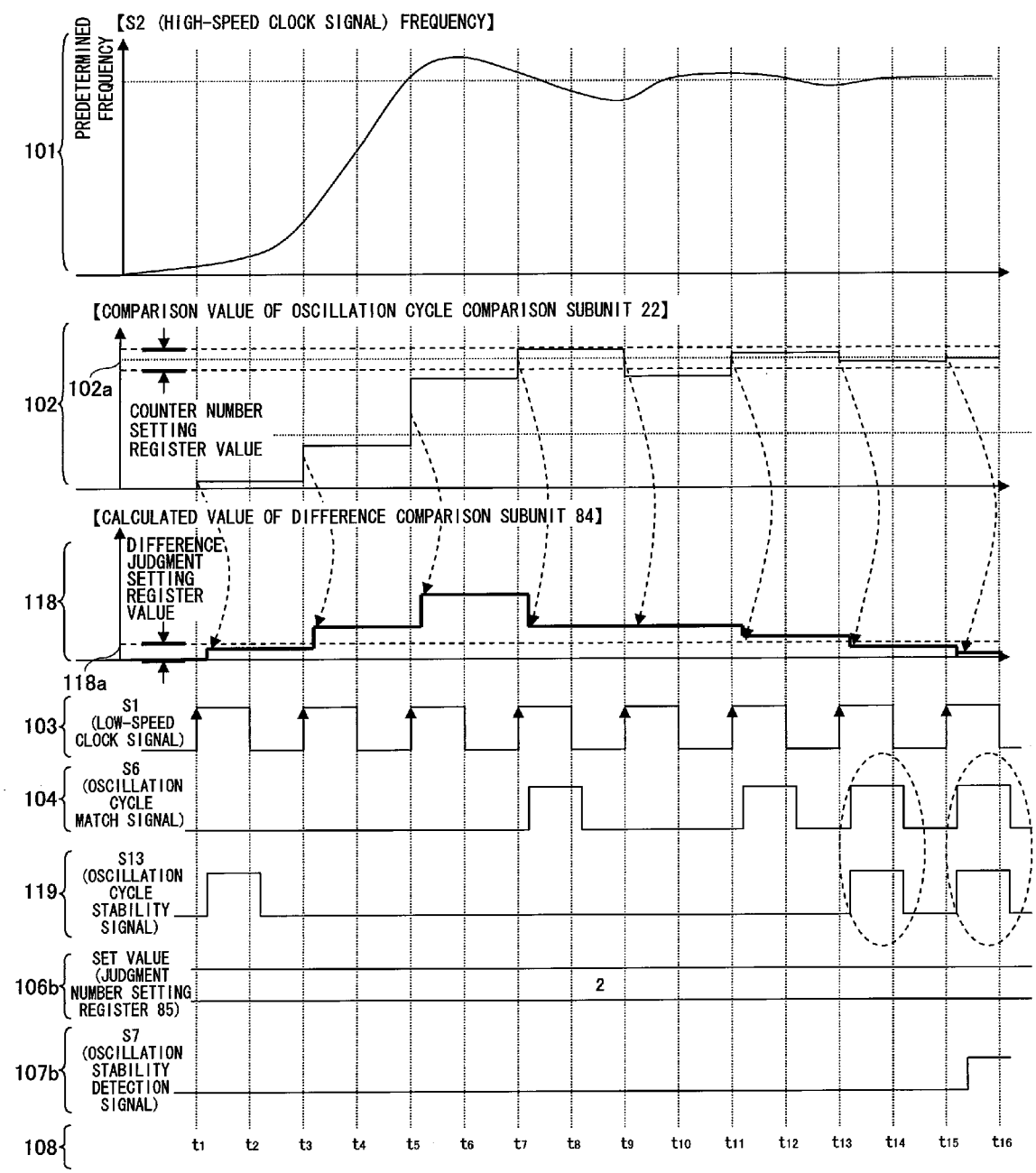
FIG. 11 shows an exemplary operation scenario of the semiconductor integrated circuit 1e in embodiment 5.

FIG. 11 shows an exemplary operation scenario of the semiconductor integrated circuit 1e in embodiment 5.

Beginning from the top, FIG. 11 shows the high-speed clock generation state 101, the oscillation cycle comparison operation 102, a difference comparison operation 118, the low-speed clock generation state 103, the S6 output state 104, an S13 output state 119, a judgment number setting register value 106b, an S7 output state 107b, and time 108.

Note that the same reference numbers have been used for portions that are the same as in embodiment 1, and descriptions thereof have been omitted.

Difference comparison operation 118 shows operations of the difference comparison subunit 84 that compares the value stored in the difference judgment setting register 83 and a difference between the values stored in the first and second oscillation counter value storage subunits 81 and 82. The vertical axis indicates difference values. In FIG. 11, stored value 118a, which is shown as a broken line, indicates the value stored by the difference judgment setting register 83.

S13 output state 119 shows a relationship between the oscillation cycle stability signal S13 output from the difference comparison subunit 84 and time.

Judgment number setting register value 106b shows a relationship between the value stored in the judgment number setting register 85 and time. As described above, the judgment number setting register 85 stores a value of "2".

S7 output state 107b shows a relationship between the oscillation stability detection signal S7 output from the oscillation stability judgment subunit 86 and time.

As shown in FIG. 11, if the difference between the values stored in the first and second oscillation value storage subunits 81 and 82 is less than or equal to the value indicated by the stored value 118a, the difference comparison subunit 84 outputs the oscillation cycle stability signal S13 (e.g., see t1 to t2, t13 to t14, and t15 to t16 in difference comparison operation 118 and S13 output state 119).

The oscillation cycle match signal S6 and oscillation cycle stability signal S13 are generated in the same time period (see t13 to t16 in S6 output state 104 and S13 output state 119), and if the number of generated signals S6 and S13 matches the value stored in the judgment number setting register 95, the oscillation stability judgment subunit 86 outputs the oscillation stability detection signal S7 (see t15 to t16 in S7 output state 107b).

6. Embodiment 6

The following describes another embodiment of the present invention.

6.1. Overview

Figure 12:
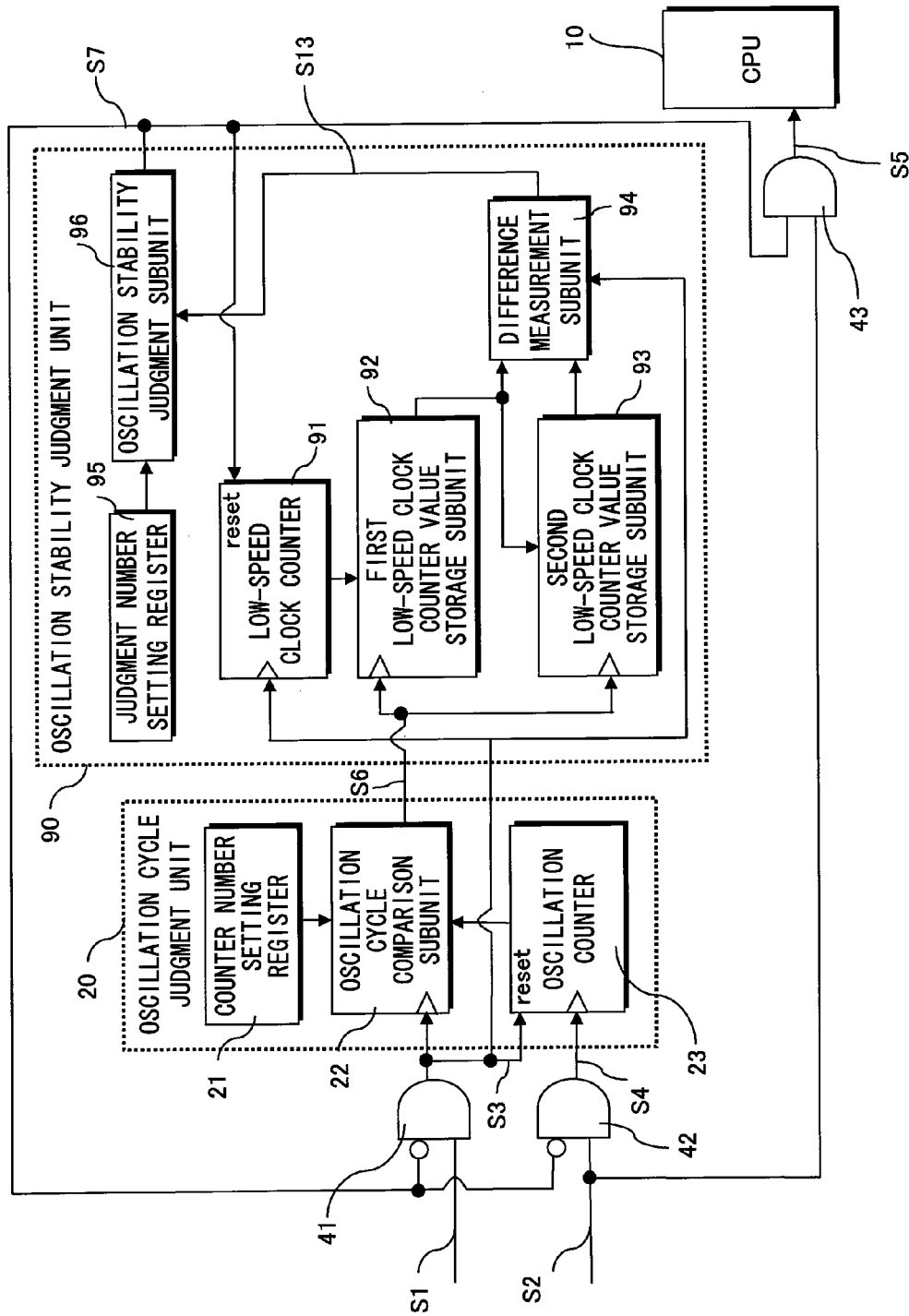
FIG. 12 is a functional block diagram showing a structure of a semiconductor integrated circuit 1f of embodiment 6.

FIG. 12 is a functional block diagram showing the structure of a semiconductor integrated circuit 1f of embodiment 6.

The following description focuses on differences from embodiment 1.

Embodiment 6 differs from the embodiment 1 in that the semiconductor integrated circuit 1f includes an oscillation stability judgment unit 90 instead of the oscillation stability judgment unit 30.

The semiconductor integrated circuit 1f of embodiment 6 basically performs detection by judging whether the high-speed clock signal S2 is continuously generated at substantially a predetermined frequency. In other words, even if the frequency of the high-speed clock signal S2 reaches the predetermined frequency at one point in time, the semiconductor integrated circuit 1f does not detect that the oscillation of the high-speed oscillator has stabilized if the high-speed clock signal S2 is not being continuously generated at the predetermined frequency.

Specifically, the oscillation stability judgment unit 90 includes a clock counter 91 that counts the low-speed clock G signal S3. Also, the oscillation stability judgment unit 90 acquires a counter value of the low-speed clock counter 91 when the oscillation cycle match signal S6 is output from the oscillation cycle comparison subunit 22. The oscillation stability judgment unit 90 stores a history of each acquired counter value. In other words, the oscillation stability judgment unit 90 stores a history of the counter values of the low-speed clock counter 91 when the frequency of the high-speed clock signal S2 has reached the predetermined frequency. When the frequency of the high-speed clock signal S2 stabilizes, the oscillation cycle comparison subunit 22 should output the oscillation cycle match signal S6 each time the low-speed clock G signal S3 is received. Accordingly, in the history of counter values of the low-speed clock counter 91, the differences between the values should become smaller as the frequency of the high-speed clock signal S2 stabilizes and the amount of variation in the frequency decreases. The oscillation stability judgment unit 90 judges whether the frequency of the high-speed clock signal S2 has stabilized based on the size of the differences between the values in the stored history.

According to the above structure, the oscillation cycle stability judgment unit 90 performs the judgment based on the low-speed clock G signal S3, thereby enabling the size of the low-speed clock counter 91 to be relatively small. The semiconductor integrated circuit 1f of the embodiment 6 therefore realizes a reduction in size and improves the precision of detection based on judging the amount of variation in the frequency of the high-speed clock signal S2.

6.2. Structure

The above technology is realized as described below with reference to FIG. 12.

Specifically, the oscillation stability judgment unit 90 includes the low-speed clock counter 91, a first low-speed clock counter value storage subunit 92, a second low-speed clock counter value storage subunit 93, a difference measurement subunit 94, a judgment number setting register 95, and an oscillation stability judgment subunit 96.

6.2.1. Low-Speed Clock Counter 91

The low-speed clock counter 91 is connected to the clock gating circuit 41, the first low-speed clock counter value storage subunit 92, and the oscillation stability judgment subunit 96.

The low-speed clock counter 91 receives the low-speed clock G signal S3 from the clock gating circuit 41, and counts the received signal S3.

Upon receiving the oscillation stability detection signal S7 output from the oscillation stability judgment subunit 96, the low-speed clock counter 91 resets its counter value.

6.2.2. First Low-Speed Clock Counter Value Storage Subunit 92

The first low-speed clock counter value storage subunit 92 is connected to the oscillation cycle comparison subunit 22, the low-speed clock counter 91, the second low-speed clock counter value storage subunit 93, and the difference measurement subunit 94.

Upon receiving the oscillation cycle match signal S6 output from the oscillation cycle comparison subunit 22, the first low-speed clock counter value storage subunit 92 acquires and stores the counter value of the low-speed clock counter 91.

6.2.3. Second Low-Speed Clock Counter Value Storage Subunit 93

The second low-speed clock counter value storage subunit 93 is connected to the oscillation cycle comparison subunit 22, the first low-speed clock counter value storage subunit 92, and the difference measurement subunit 94.

Upon receiving the oscillation cycle match signal S6 output from the oscillation cycle comparison subunit 22, the second low-speed clock counter value storage subunit 93 acquires and stores the value stored by the first low-speed clock counter value storage subunit 92. Note that when both the first and second low-speed clock counter value storage subunits 92 and 93 receive the oscillation cycle match signal S6, the second clock counter value storage subunit 93 acquires and stores the stored content of the first low-speed clock counter value storage subunit 92 before the subunit 92 updates its stored content. In other words, when the oscillation cycle match signal S6 is output, the second low-speed clock counter value storage subunit 93 acquires and stores the value that was stored by the first low-speed clock counter value storage subunit 92 when the immediately previous oscillation cycle match signal S6 was output. For example, even if the oscillation cycle match signal S6 is input to both the first and second low-speed clock counter value storage subunits 92 and 93 at substantially the same time, the timing at which the first low-speed clock counter value storage subunit 92 acquires the value of the low-speed clock counter 91 may be delayed.

6.2.4. Difference Measurement Subunit 94

The difference measurement subunit 94 is connected to the clock gating circuit 41, the first low-speed clock counter value storage subunit 92, the second low-speed clock counter value storage subunit 93, and the oscillation stability judgment subunit 96.

The difference measurement subunit 94 operates in synchronization with the low-speed clock G signal S3 output from the clock gating circuit 41. The difference measurement subunit 94 acquires and compares a value stored by the first low-speed clock counter value storage subunit 92 and a value stored by the second low-speed clock counter value storage subunit 93, and if a difference between the compared values is less than or equal to a predetermined value, the difference measurement subunit 94 outputs the oscillation cycle stability signal S13 to the oscillation stability judgment subunit 96. In embodiment 6, the difference measurement subunit 94 outputs the oscillation cycle stability signal S13 if the difference between the compared values is 1.

In other words, the difference measurement subunit 94 controls output of the oscillation cycle stability signal S13 based on the history of the counter values of the low-speed clock counter 91 when the oscillation cycle match signal S6 was output.

6.2.5. Judgment Number Setting Register 95

The judgment number setting register 95 is connected to the oscillation stability judgment subunit 96.

The judgment number setting register 95 is a register in which an arbitrary value can be set. In the present embodiment, the judgment number setting register 95 stores a value of "2".

6.2.6. Oscillation Stability Judgment subunit 96

The oscillation stability judgment subunit 96 is connected to the difference measurement subunit 94, the judgment number setting register 95, the low-speed clock counter 91, and the clock gating circuits 41, 42 and 43.

The oscillation stability judgment subunit 96 receives the oscillation cycle stability signal S13 output from the difference measurement subunit 94. When the number of received oscillation cycle stability signals S13 reaches the value stored by the judgment number setting register 95, the oscillation stability judgment subunit 96 outputs the oscillation stability detection signal S7 to the clock gating circuits 41, 42 and 43, and the low-speed clock counter 91.

For example, the oscillation stability judgment subunit 96 includes a counter that receives and counts the oscillation cycle stability signal S13. The oscillation stability judgment subunit 96 compares the counter value of the counter and the value stored by the judgment number setting register 95, and outputs the oscillation stability detection signal S7 if the compared values match. Note that the counter value of the counter is cleared when the information processing system completes a switch to normal mode.

6.2.7. Clock Gating Circuit 41

The clock gating circuit 41 of the present embodiment is connected to different constituents than in embodiment 1. As shown in FIG. 12, the clock gating circuit 41 of embodiment 6 is connected to the oscillation cycle comparison subunit 22, the oscillation counter 23, the low-speed clock counter 91, the difference measurement subunit 94, and the oscillation stability judgment subunit 96. As shown in FIG. 12, the clock gating circuit 41 receives an inversion of the signal output from the oscillation stability judgment subunit 96. The clock gating circuit 41 is an AND circuit that receives the low-speed clock signal S1 and an inversion of the oscillation stability detection signal S7 output from the oscillation stability judgment subunit 96.

6.2.8. Other Remarks

The clock gating circuits 42 and 43 are the same as the clock gating circuits described in embodiment 1, with the exception of replacing the oscillation stability judgment subunit 32 with the oscillation stability judgment subunit 96.

The oscillation cycle comparison subunit 22 is connected to different constituents than in embodiment 1. As shown in FIG. 12, the oscillation cycle comparison subunit 22 is connected to the clock gating circuit 41, the first low-speed clock counter value storage subunit 92, the second low-speed clock counter value storage subunit 93, the counter number setting register 21, and the oscillation counter 23. The oscillation cycle comparison subunit 22 outputs the oscillation cycle match signal S6 to the first and second low-speed clock counter value storage subunits 92 and 93.

The oscillation counter 23 and counter number setting register 21 are the same as in embodiment 1.

6.3. Operations

The following describes operations of the semiconductor integrated circuit 1f having the structure described above.

Figure 13:
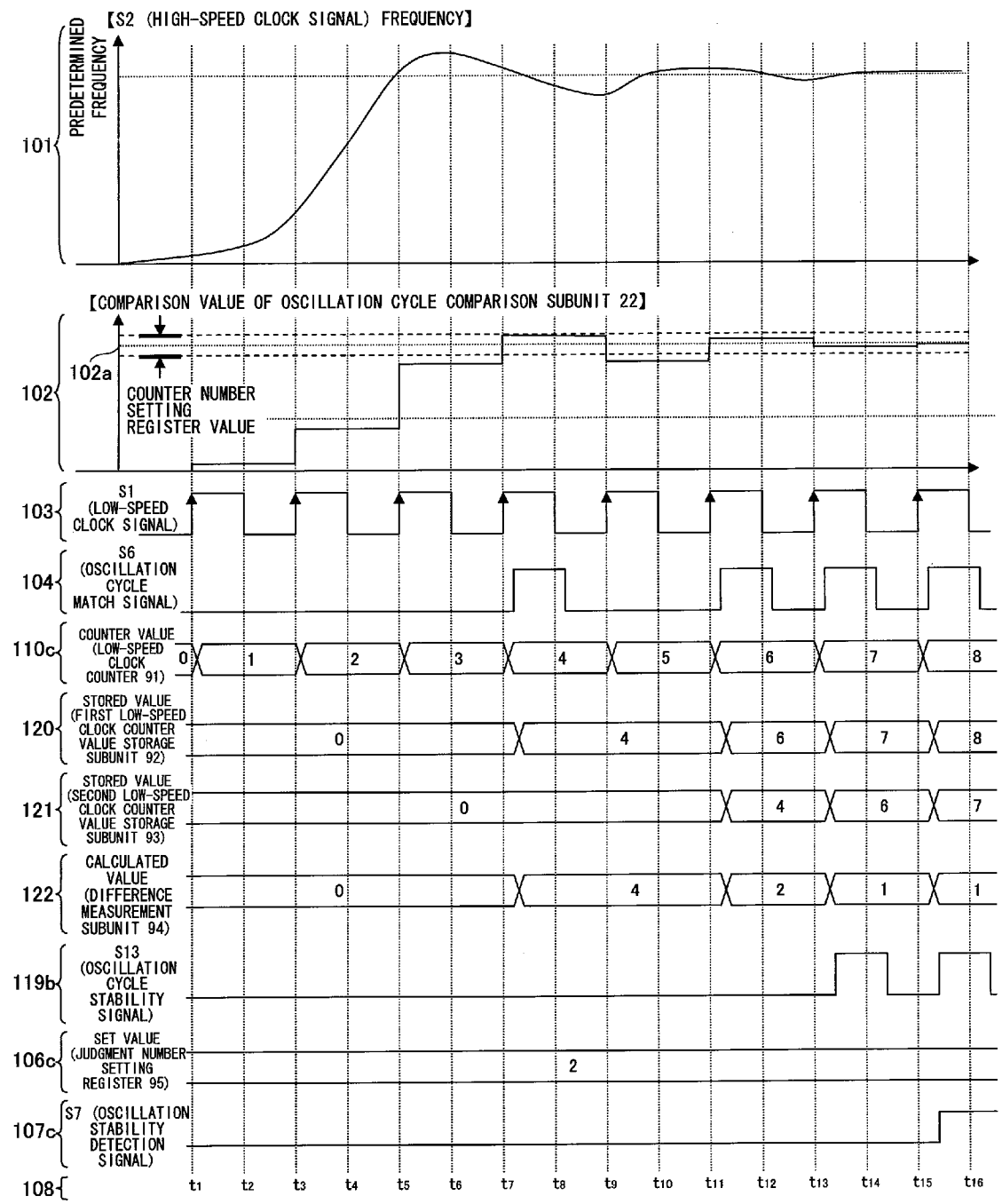
FIG. 13 shows an exemplary operation scenario of the semiconductor integrated circuit 1f in embodiment 6.

FIG. 13 shows an exemplary operation scenario of the semiconductor integrated circuit 1f in embodiment 6.

Beginning from the top, FIG. 13 shows the high-speed clock generation state 101, the oscillation cycle comparison operation 102, the low-speed clock generation state 103, the S6 output state 104, a low-speed clock counter value 110c, a first low-speed clock counter stored value 120, a second low-speed clock counter stored value 121, a difference measurement operation 122, an S13 output state 119b, a judgment number setting register value 106c, an S7 output state 107c, and time 108.

Note that the same reference numbers have been used for portions that are the same as in embodiment 1, and descriptions thereof have been omitted.

Low-speed clock counter stored value 110c shows a relationship between the value counted by the low-speed clock counter 91 and time.

First low-speed clock counter stored value 120 shows a relationship between the value stored by the first low-speed clock counter value storage subunit 92 and time.

Second low-speed clock counter value stored value 121 shows a relationship between the value stored by the second low-speed clock counter value storage subunit 93 and time.

Difference measurement operation 122 shows a value of a difference between the values stored in the first and second low-speed clock counter value storage subunits 92 and 93, which are compared by the difference measurement subunit 94.

S13 output state 119b shows a relationship between the oscillation cycle stability signal S13 output from the difference measurement subunit 94 and time.

Judgment number setting register value 106c shows the value stored in the judgment number setting register 95. As previously described, the judgment number setting register 95 stores a value of "2".

S7 output state 107c shows a relationship between the oscillation stability detection signal S7 output from the oscillation stability judgment subunit 96 and time.

As shown in FIG. 13, each time the oscillation cycle match signal S6 is output, the second low-speed clock counter value storage subunit 93 acquires and stores the value stored in the first low-speed clock counter value storage subunit 92. Also, the first low-speed clock counter value storage subunit 92 acquires and stores the counter value of the low-speed clock counter 91 (see t11 to t12 etc. of first low-speed clock counter stored value 120 and second low-speed clock counter stored value 121).

The difference measurement subunit 94 calculates a difference between the stored values of the first and second low-speed clock counter value storage subunits 92 and 93, and if the calculated difference is "1", outputs the oscillation cycle stability signal S13 to the oscillation stability judgment subunit 96 (see t13 to t14 etc. of S13 output state 119b).

The oscillation stability judgment subunit 96 counts the number of received oscillation cycle stability signals S13, and when the counted number reaches the value stored in the judgment number setting register 95, outputs the oscillation stability detection signal S7 (see t15 to t16 of S7 output state 107c).

7. Embodiment 7

The following describes another embodiment of the present invention.

Embodiment 7 describes an information processing system that includes the semiconductor integrated circuit described in any of the above embodiments 1 to 6. Although the following description uses the example of a wireless communication apparatus as the information processing system, the information processing system is not limited to being a wireless communication apparatus. The information processing system may have any structure that includes a high-speed oscillator, a low-speed oscillator, and a semiconductor integrated circuit that includes an oscillation stability detection circuit that detects whether the oscillation of the high-speed oscillator has stabilized by any of the methods described in embodiments 1 to 6 (e.g., a circuit that includes the oscillation cycle judgment unit 20 and the oscillation stability judgment unit 30). Also, the information processing system may include, as a separate chip, an oscillation stability detection circuit that performs detection by any of the methods described in embodiments 1 to 6.

7.1. Structure

Figure 14:
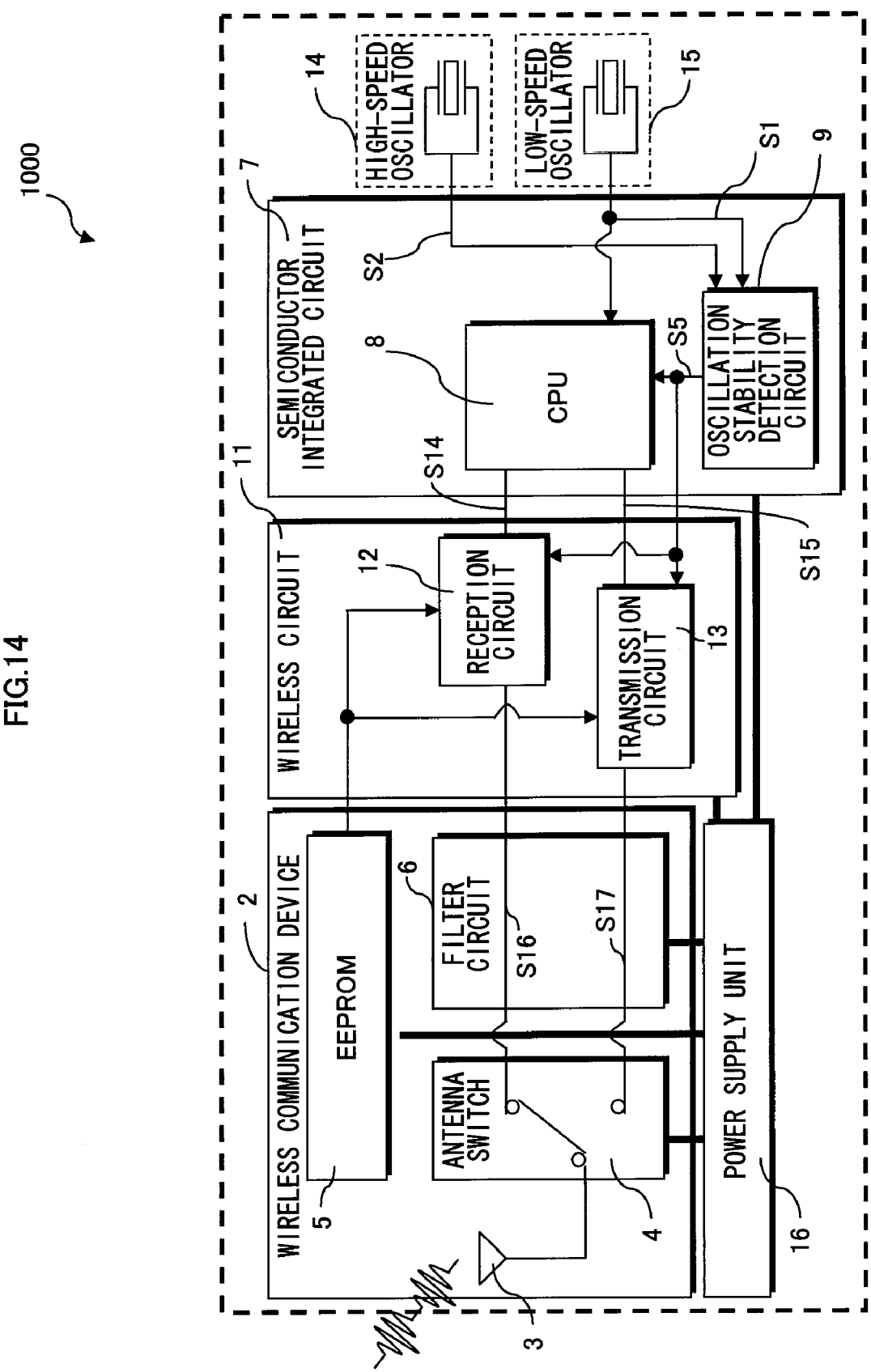
FIG. 14 is a functional block diagram showing a structure of a wireless communication device 1000 of embodiment 7 of the present invention.

FIG. 14 is a functional block diagram showing the structure of a wireless communication apparatus 1000 pertaining to embodiment 7 of the present invention.

As shown in FIG. 14, the wireless communication apparatus 1000 includes a wireless communication device 2, a wireless circuit 11, a semiconductor integrated circuit 7, a high-speed oscillator 14, and a low-speed oscillator 15.

The wireless communication device 2 includes an antenna 3, an antenna switch 4, an EEPROM (Electrically Erasable Programmable Read Only Memory) 5, and a filter circuit 6. Power is supplied from a power supply circuit 16 to the antenna switch 4, EEPROM 5, and filter circuit 6.

7.1.1. Antenna 3

The antenna 3 transmits and receives wireless waves.

7.1.2. Antenna Switch 4

The antenna switch 4 is a switch that switches between the transmission and reception of communication waves. The antenna switch 4 is connected to the antenna 3, a reception circuit 12, and a transmission circuit 13.

7.1.3. EEPROM 5

The EEPROM 5 stores, for example, a set value used in the wireless communication performed by the reception circuit 12 and transmission circuit 13 (e.g., a wireless signal frequency band).

7.1.4. Filter Circuit 6

The filter circuit 6 includes, for example, a BPF (Band-Pass Filter), and performs filter processing on wireless transmission signals and wireless reception signals.

7.1.5. Oscillation Stability Detection Circuit 9

The semiconductor integrated circuit 7 includes a CPU 8 and an oscillation stability detection circuit 9.

The oscillation stability detection circuit 9 is a circuit that detects whether the oscillation of the high-speed oscillator 14 has stabilized by any of the methods described in embodiments 1 to 6. The oscillation stability detection circuit 9 outputs the stabilized high-speed clock S signal S5 to the CPU 8, reception circuit 12, transmission circuit 13, etc.

7.1.6. CPU 8

The CPU 8 operates with use of the high-speed clock S signal S5 supplied from the oscillation stability detection circuit 9 and the low-speed clock signal S1 received from the low-speed oscillator 15. The CPU 8 controls operations of the wireless communication apparatus 1000 in accordance with a predetermined program.

The CPU 8 receives a reception data signal S14 from the reception circuit 12, and performs predetermined processing. Also, the CPU 8 outputs a transmission data signal S15 to the transmission circuit 13 in order to transmit data.

7.1.7. Reception Circuit 12

A wireless circuit 11 includes the reception circuit 12 and the transmission circuit 13.

The reception circuit 12 operates with use of the high-speed clock S signal S5 supplied from the oscillation stability detection circuit 9, and performs processing pertaining to the reception of wireless signals. For example, the reception circuit 12 performs carrier detection for detecting whether a wireless signal having a desired frequency band exists, performs demodulation processing for demodulating a wireless reception signal S16 output from the wireless communication device 2, retrieves reception data, and outputs a reception data signal S14 to the CPU 8.

7.1.8. Transmission Circuit 13

The transmission circuit 13 operates with use of the high-speed clock S signal S5 supplied from the oscillation stability detection circuit 9, and performs processing pertaining to the transmission of the wireless signals to be transmitted from the wireless communication apparatus 1000. The transmission circuit 13 performs processing such as modulation of the transmission data signal S15 output from the CPU 8, and outputs a wireless transmission signal S17 to the antenna 3 via the filter circuit 6.

7.1.9. High-Speed Oscillator 14

The high-speed oscillator 14 outputs the high-speed clock signal S2 to the oscillation stability detection circuit 9.

7.1.10. Low-Speed Oscillator 15

The low-speed oscillator 15 outputs the low-speed clock signal S1 to the CPU 8 and oscillation stability detection circuit 9.

7.1.11. Power Supply Unit 16

The power supply unit 16 supplies power to the wireless communication device 2, wireless circuit 11, semiconductor integrated circuit 7, etc.

7.2. Operations

The following describes operations of the wireless communication apparatus 1000.

Figure 15:
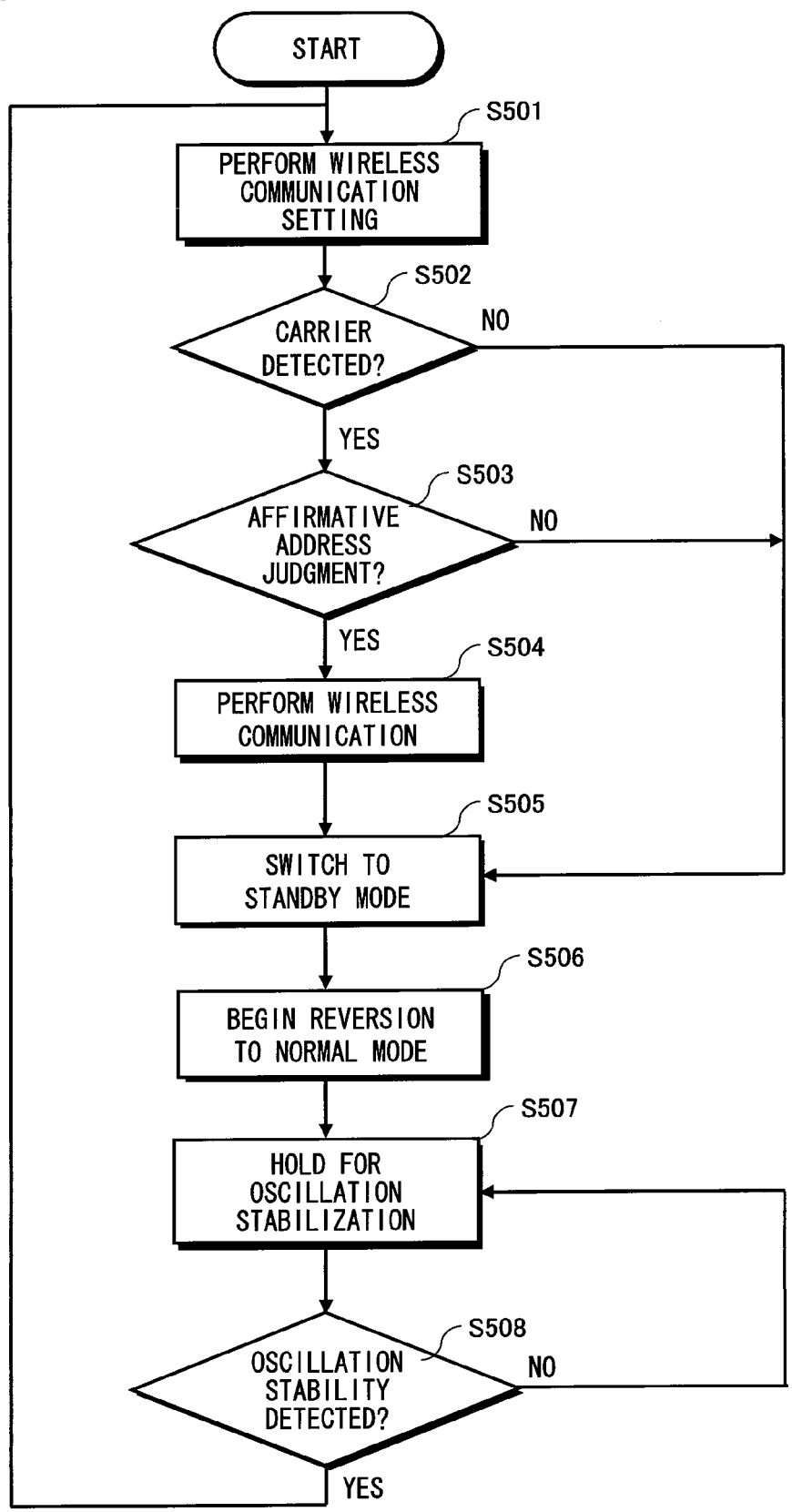
FIG. 15 is a flowchart showing operations of the wireless communication device 1000.

FIG. 15 is a flowchart showing operations of the wireless communication apparatus 1000.

When the wireless communication apparatus 1000 begins operations, the power supply unit 16 begins supplying power to the wireless communication device 2 etc. When the power supply begins, various settings required for wireless communication are performed (step S501). For example, the set value stored by the EEPROM 5 is set in the reception circuit 12 and transmission circuit 13 of the wireless circuit 11.

In the wireless communication apparatus 1000, the reception circuit 12 performs carrier detection to detect whether a wireless signal having a desired frequency band exists (step S502). If a wireless signal having a desired frequency band does not exist (step S502: NO), the wireless communication apparatus 1000 switches to standby mode (step S505).

In step S502, if the a wireless signal having a desired frequency band exists (step S502: YES), the wireless communication apparatus 1000 judges whether the wireless signal is addressed thereto by referencing a destination address included in the wireless signal and comparing the destination address with the wireless communication apparatus's own address (step S503). If the wireless signal is not addressed to the wireless communication apparatus 1000 (step S503: NO), the wireless communication apparatus 1000 switches to standby mode (step S505).

In step S503, if the wireless signal is addressed to the wireless communication apparatus 1000 (step S503: YES), the wireless communication apparatus 1000 performs reception processing on the wireless signal. The reception circuit 12 performs reception processing on the wireless signal as the wireless reception signal S16, and outputs a reception data signal S14 to the CPU 8. The CPU 8 receives the reception data signal S14, performs predetermined processing, and if necessary, outputs a transmission data signal S15 to the transmission circuit 13. The transmission circuit 13 receives the transmission data signal S15, and when the antenna 4 switches to the transmission circuit 13 side, the transmission circuit 13 outputs the wireless transmission signal S17 to the antenna 3, after which the antenna 3 transmits wireless waves (step S504). When wireless communication has been completed, the wireless communication apparatus 1000 switches to standby mode (step S505).

When the wireless communication apparatus 1000 switches to standby mode, the CPU 8 stops the oscillation of the high-speed oscillator 14.

After a certain time period has elapsed, the wireless communication apparatus 1000 begins reverting to normal mode by a timer interrupt or the like (step S506).

When beginning reversion to normal mode, the wireless communication apparatus 1000 waits until the oscillation of the high-speed oscillator 14 has stabilized, and causes the oscillation stability detection circuit 9 to detect whether the oscillation of the high-speed oscillator 14 is stable (step S507).

The oscillation stability detection circuit 9 performs detection processing by any of the methods described in embodiments 1 to 6. The wireless communication apparatus 1000 waits until the oscillation stability detection circuit 9 has detected that the oscillation of the high-speed oscillator 14 has stabilized (step S508: NO), and when stable oscillation has been detected (step S508: YES), the wireless communication apparatus 1000 completes the switch to normal mode and returns to the processing of step S501.

7.3. Summary

In the above structure, performing detection processing enables avoiding the danger of operating with use of an unstable clock, and early detection of whether the oscillation of the high-speed oscillator has stabilized enables shorting the amount of time spent waiting for the oscillation of the high-speed oscillator to stabilize. This reduces power consumption over conventional technology. The above structure also enables extending battery lifetime if the information processing system is operating on battery power.

Particularly in an information processing system that periodically switches between normal mode and standby mode while operating, early and precise detection of stable oscillation of the high-speed oscillator enables reducing power consumption while raising the reliability of operations. The present invention can be applied to, for example, a wireless communication apparatus that performs intermittent reception, a fire alarm device that periodically receives power supply and checks whether an operation has been performed, and anticrime apparatus, and mobile terminals such as notebook computers and PDAs that perform power-saving control.

8. Supplementary Remarks

The following describes other variations of the present invention.

8.1. Variations of the Oscillation Cycle Comparison Subunit 22

In the above embodiments, the oscillation cycle comparison subunit 22 compares the counter value of the oscillation counter 23 and the value stored in the counter number setting register 21, and if a difference between the compared values is less than or equal to a predetermined value, the oscillation cycle comparison subunit 22 outputs the oscillation cycle match signal S6 to the match counter 33.

Alternatively, in embodiments 1 to 4, the oscillation cycle comparison subunit 22 may output the oscillation cycle match signal S6 if the compared values are the same or a difference therebetween is less than or equal to a predetermined value, and output an oscillation cycle mismatch signal S99 to the match counter 33 etc. if the difference between the compared values is greater than the predetermined value. Furthermore, in this case, the match counter 33 may perform counting up when the oscillation cycle match signal S6 is received, and perform counting down when the oscillation cycle mismatch signal S99 is received.

The following describes operations of the semiconductor integrated circuit in this case.

Figure 18:
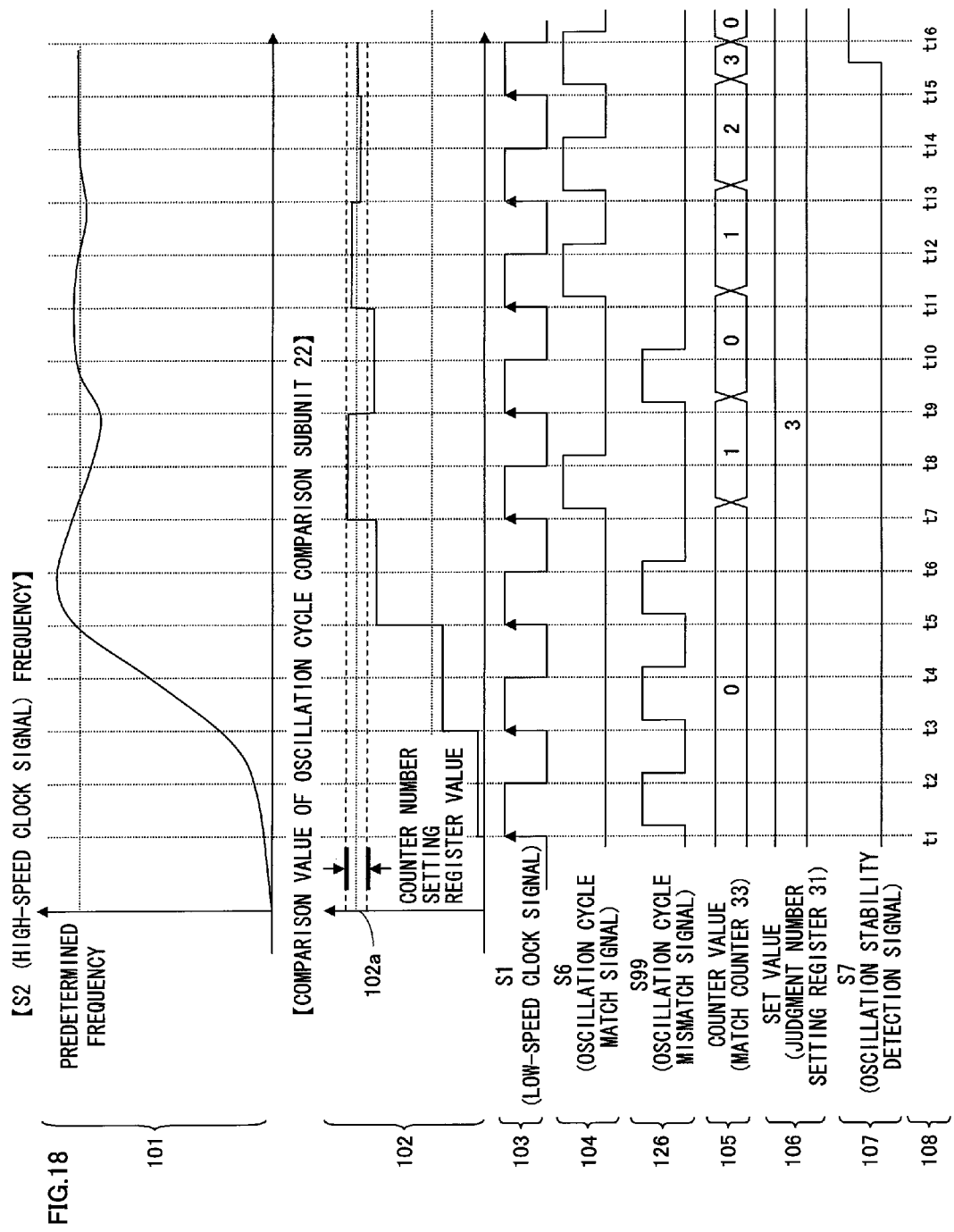
FIG. 18 shows an exemplary operation scenario of a semiconductor integrated circuit pertaining to a variation.

FIG. 18 shows an exemplary operation scenario of the semiconductor integrated circuit pertaining to the present variation.

Note that FIG. 18 shows an exemplary operation sequence in which the oscillation cycle comparison subunit 22 of embodiment 1 has the structure of the present variation. The same reference numbers have been used for portions of FIG. 18 that are the same as in FIG. 2, and descriptions thereof have been omitted. In this exemplary operation scenario, a value of "3" is set in the judgment number setting register 31.

In FIG. 18, an S99 output state 126 is shown below S6 output state 104.

S99 output state 126 shows a relationship between the oscillation cycle mismatch signal S99 output from the oscillation cycle comparison subunit 22 of the present variation and time.

As shown in FIG. 18, the oscillation cycle comparison subunit 22 outputs either the oscillation cycle match signal S6 or the oscillation cycle mismatch signal S99 (see from t1 onward in S6 output state 104 and S99 output state 126).

When the oscillation cycle mismatch signal S99 is output from the oscillation cycle comparison subunit 22, the match counter 33 decrements the counter value by one (see t9 to t0 in match counter value 105). Note that if the counter value is "0", the counter value remains "0" even if the oscillation cycle mismatch signal S99 is output.

In this way, the value of the match counter 33 increases and decreases in accordance with the oscillation cycle match signal S6 and the oscillation cycle mismatch signal S99 while the semiconductor integrated circuit is performing detection processing.

According to this structure, the counter value of the match counter 33 increases and decreases if the oscillation of the high-speed oscillator is unstable, thereby reducing the risk of detecting stable oscillation even if the oscillation of the high-speed oscillator has not stabilized, which is a higher risk in a case of waiting for a predetermined number of oscillation cycle match signals S6 to be counted.

8.2. Other Variations

Although a semiconductor integrated circuit of the present invention has been described based on the above embodiments, variations such as the following are also applicable, and the present invention is of course not limited to the semiconductor integrated circuits described in the above embodiments.

Figure 16:
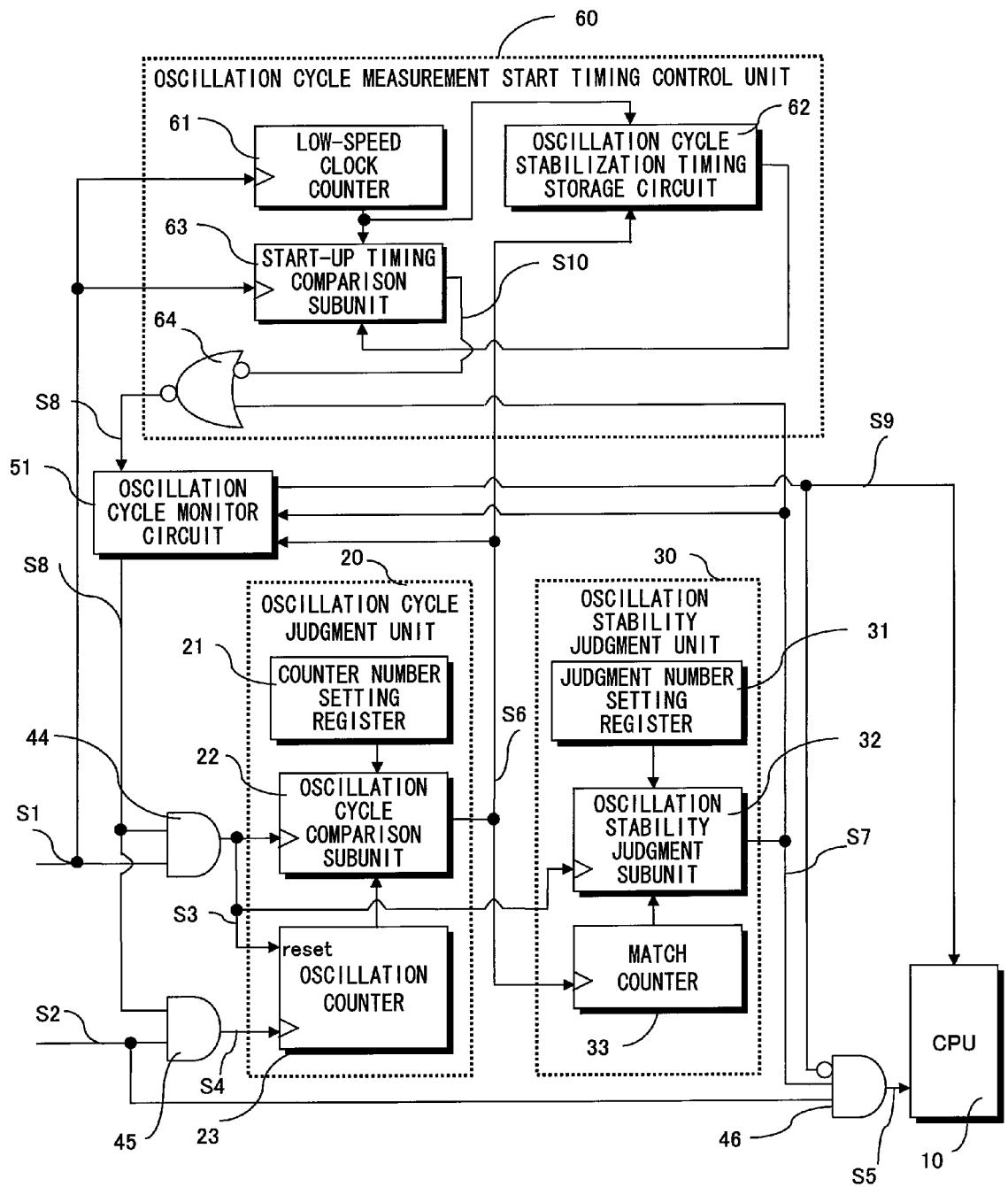
FIG. 16 shows a structure of a semiconductor integrated circuit of embodiment 3 to which an oscillation cycle monitor circuit 51 has been added.

(1) The oscillation stability monitor circuit of embodiment 2 may be combined with other embodiments. For example, FIG. 16 shows a structure in which an oscillation stability monitor circuit 51 has been added to the semiconductor integrated circuit of embodiment 3. In FIG. 16, the clock gating circuit 43 of embodiment 3 has been replaced with a clock gating circuit 46.

As shown in FIG. 16, the oscillation stability monitor circuit 51 is connected to the clock gating control circuit 64, the clock gating circuits 44, 45 and 46, the CPU 10, the oscillation cycle comparison subunit 22, and the oscillation stability judgment subunit 32.

The following describes operations of the oscillation stability monitor circuit 51 having the structure described above.

Figure 17:
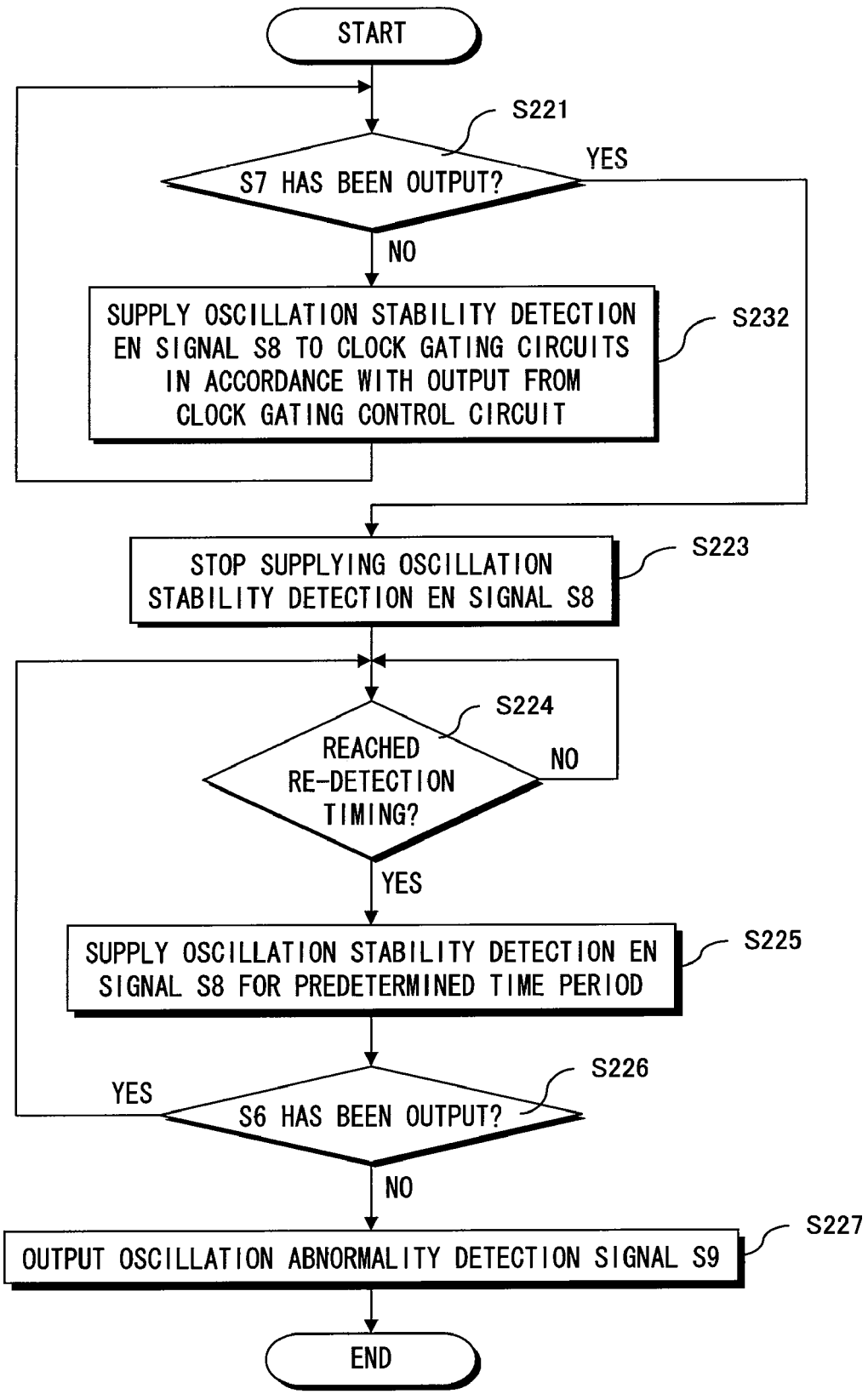
FIG. 17 is a flowchart showing operations of the oscillation cycle monitor circuit 51.

FIG. 17 is a flowchart showing operations of the oscillation cycle monitor circuit 51. FIG. 17 is the same as FIG. 4 that was used to describe the operations of the oscillation cycle monitor circuit 50 of embodiment 2, with the exception of performing step S232 instead of step S222. Note that the same reference numbers have been given to the processing that is the same as in FIG. 4, and descriptions thereof have been omitted.

After the semiconductor integrated circuit has begun performing detection processing, upon receiving the oscillation stability detection signal S7 in step S221 (step S221: YES), the oscillation cycle monitor circuit 51 outputs the oscillation stability detection EN signal S8 to the clock gating circuits 41 and 42 depending on whether the oscillation stability detection EN signal S8 has been output from the clock gating control circuit 64. In other words, if the clock gating control circuit 64 outputs the oscillation stability detection EN signal S8, the oscillation cycle monitor circuit 51 outputs the oscillation stability detection EN signal S8, and if the clock gating control circuit 64 does not output the oscillation stability detection EN signal S8, the oscillation cycle monitor circuit 51 does not output the oscillation stability detection EN signal S8 (step S232).

Note that the processing performed in the other steps is the same as shown in FIG. 4, and descriptions thereof have been omitted.

Note that although the above example describes a case of using the oscillation cycle monitor circuit of embodiment 3, the oscillation cycle monitor circuit of embodiment 4 etc. may be used. In other words, when detection processing has begun, the oscillation cycle monitor circuit may, supply a predetermined signal to the clock gating circuit 44 etc. instead of the oscillation stability detection control circuit 74, the oscillation stability judgment subunit 86, the oscillation stability judgment subunit 87, etc. Upon receiving an input of the oscillation stability detection signal S7 (step S221), that is to say, upon detection of stable oscillation, the oscillation cycle monitor may stop the supply of clocks to the oscillation cycle judgment unit 20, the oscillation stability judgment unit 30, etc. Thereafter, upon reaching a re-detection timing (step S224), the oscillation cycle monitor circuit may restart the supply of a clock to the oscillation cycle judgment unit 20 (step S225).

Figure 19:
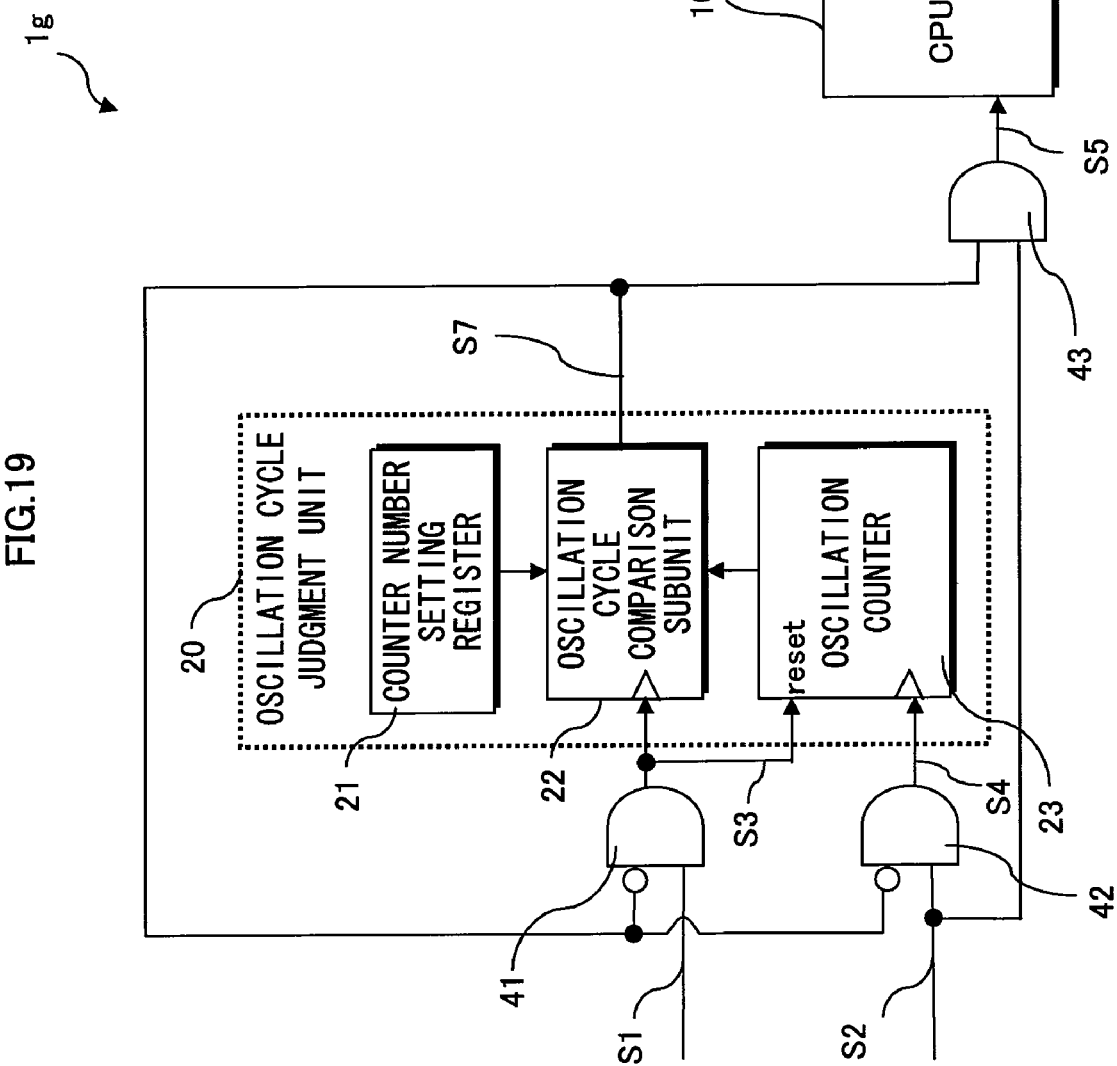
FIG. 19 is a functional block diagram showing a structure of a semiconductor integrated circuit 1g.

(2) In FIG. 1, for example, the oscillation stability judgment unit 30 outputs the oscillation stability detection signal S7 upon judging that the number of oscillation cycle match signals S6 output from the oscillation cycle judgment unit 20 has reached a predetermined number. However, the semiconductor integrated circuit of the present invention is not limited to this structure. For example, the oscillation stability judgment unit 30 may be excluded from this structure. In this case, the oscillation cycle comparison subunit 22 may compare the counter value of the oscillation counter 23 and the value stored in the counter number setting register 21, and output the oscillation stability detection signal S7 instead of the oscillation cycle match signal S6. FIG. 19 is a functional block diagram showing the structure of a semiconductor integrated circuit 1g. A large difference from the semiconductor integrated circuit 1 of FIG. 1 is that the semiconductor integrated circuit 1g of FIG. 19 does not include the oscillation cycle judgment unit 30.

In the semiconductor integrated circuit 1g, the oscillation cycle comparison subunit 22 outputs the oscillation stability detection signal S7 instead of the oscillation cycle match signal S6. A description of the connections between constituent elements has been omitted since it is readily understandable from FIG. 19.

(3) In the above embodiments, the oscillation cycle comparison subunit 22 of the oscillation cycle judgment unit 20 performs a comparison and controls output of the oscillation cycle match signal S6 in an interval of one clock cycle of the low-speed clock signal S1. However, the comparison is not limited to being performed in an interval of one clock cycle of the low-speed clock signal S1. For example, the oscillation cycle comparison subunit 22 may compare the value stored in the counter number setting register 21 and the number of high-speed clock signals S1 that have been received in, for example, two clock cycles of the low-speed clock signal S1, and control output of the oscillation cycle match signal S6 based on a result of the comparison. This structure can be realized by, for example, inserting a programmable counter (frequency divider) between the clock gating circuit 41 and the oscillation cycle comparison subunit 22 etc. in order to supply the oscillation cycle comparison subunit 22 etc. with a low-speed clock G signal S3 whose frequency is 1/N of the frequency of the low-speed clock signal S1. This structure may of course be realized by another method.

In the above embodiments, the oscillation cycle comparison subunit 22 of the oscillation cycle judgment unit 20 performs a comparison each time the low-speed clock G signal S3 is received. However, timing of the comparison is not limited to this. For example, after detection processing has begun, the low-speed clock G signal S3 and the high-speed clock G signal S4 may be supplied to the oscillation cycle judgment unit 20 at an arbitrary time for a predetermined time period. In other words, after detection processing has begun, instead of the low-speed clock signal S1 being continuously supplied to the semiconductor integrated circuit of the present invention, the low-speed clock signal S1 may be supplied intermittently for a certain time period. This structure is particularly effective if it is desirable to design an information processing system with emphasis on detection precision and low power consumption. Taking the example of FIG. 3, such a structure can be realized by, after the high-speed oscillator has begun oscillating and the semiconductor integrated circuit 1b has begun performing detection processing, causing the oscillation stability detection EN signal S8 to be output at an arbitrary timing (e.g., using a timer interrupt etc. as a trigger) for a predetermined time period, instead of the operation period monitor circuit 50 outputting the oscillation stability detection EN signal S8 to the clock gating circuits 44 and 45. This structure enables reducing power consumption since clock signals are supplied at an arbitrary timing for a predetermined time period instead of being continuously supplied to the oscillation cycle judgment unit 20.

(4) The above-described functional blocks and semiconductor integrated circuit may be realized as an LSI which is typically an integrated circuit. The functional blocks and semiconductor integrated circuit may be constituted as separate chips, or all or a portion thereof may be constituted as a single chip.

Note that an integrated circuit generated as described above may also be referred to as an IC, a system LSI, a super LSI, or an ultra LSI, depending on the degree of integration.

The integration is also not limited to LSI implementation, but instead may be realized by a dedicated circuit or a general-purpose process. A field programmable gate array (FPGA) that can be reprogrammed after LSI manufacture, or a reconfigurable processor in which the connection and settings of circuit cells in the LSI can be restructured after LSI manufacture can also be used.

Furthermore, if integration technology is developed that replaces LSIs due to progressive or derivative semiconductor technology, integration of functional blocks using this technology is naturally possible. For example, the application of biotechnology is a possibility.

(5) The devices of the above embodiments and variations may be computer systems structured specifically from a microprocessor, a ROM, a RAM, a hard disk unit, a display unit, a keyboard, a mouse, etc. A computer program is stored in the RAM or the hard disk unit. The devices achieve their functions as the microprocessor operates in accordance with the computer program. Instruction code which indicates commands to the computer is structured as a combination of multiple instruction codes in order for the computer program to achieve predetermined functions.

(6) A portion or all of the constituent elements of the devices of the above embodiments and variations may be structured as a single system LSI (Large Scale Integration). A system LSI is a super multifunctional LSI manufactured by integrating a plurality of structural units onto a single chip. Specifically, it is a computer system including a microprocessor, a ROM, a RAM, and the like. A computer program is stored in the RAM. The system LSI achieves its functions as the microprocessor operates in accordance with the computer program.

(7) A portion or all of the constituent elements of the devices of the above embodiments and variations may be structured as a removable IC card or stand-alone module. The IC card or the module is a computer system including a microprocessor, a ROM, and a RAM. The IC card and the module may include the above super multifunctional LSI. The IC card and the module achieve their functions as the microprocessor operates in accordance with the computer program. This IC card or module may be tamper resistant.

(8) The present invention may be the methods shown above.

(9) The present invention may be any combination of the above embodiments and variations.

(10) The technology of the present invention is useful as a semiconductor integrated circuit that, when switching from a standby mode in which a high-speed oscillator is stopped and operation is performed with use of a low-speed clock signal supplied by a low-speed oscillator to a normal mode in which operation is performed with use of a high-speed clock signal supplied from the high-speed oscillator, the semiconductor integrated circuit detects with high precision when the oscillation of a high speed oscillator has stabilized, and furthermore can maximally suppress power consumption. The technology of the present invention is also useful in any system that includes a low-speed oscillator and a high-speed oscillator, and due to the ability to reduce power consumption, is particularly useful in a system that uses a battery as a power supply.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A semiconductor integrated circuit for detecting that a high-speed clock signal is being stably generated, comprising:
   a reception unit operable to periodically receive the high-speed clock signal and a low-speed clock signal;
   an oscillation cycle judgment unit operable to, each time the low-speed clock signal has been received a predetermined number of times by the reception unit, judge whether a number of times that the high-speed clock signal has been received by the reception unit in a predetermined time period is in a predetermined range, the predetermined time period being based on a reception period during which the low-speed clock signal was received the predetermined number of times; and
   a signal output unit operable to control output of a stability detection signal in accordance with a number of times that the oscillation cycle judgment unit has judged affirmatively.

2. The semiconductor integrated circuit of claim 1, wherein the oscillation cycle judgment unit includes:
   a counter number setting storage subunit storing therein a set value;
   a high-speed clock counter operable to count the number of times that the high-speed clock signal has been received by the reception unit in the predetermined time period to generate a high-speed clock counter value; and
   an oscillation cycle comparison subunit operable to perform the judgment of whether the number of times that the high-speed clock signal has been received by the reception unit in the predetermined time period is in the predetermined range, based on the high-speed clock counter value and the set value.

3. The semiconductor integrated circuit of claim 2, wherein the oscillation cycle comparison subunit is further operable to compare a predetermined value and a difference between the high-speed clock counter value and the set value, and if the difference is less than or equal to the predetermined value, the oscillation cycle comparison subunit judges that the number of times that the high-speed clock signal has been received by the reception unit in the predetermined time period is in the predetermined range.

4. The semiconductor integrated circuit of claim 3, wherein the counter number setting storage subunit is a register.

5. The semiconductor integrated circuit of claim 1, wherein the signal output unit outputs the stability detection signal if a number of times that the oscillation cycle judgment unit judged affirmatively has reached a fixed number.

6. The semiconductor integrated circuit of claim 5, wherein the oscillation cycle judgment unit includes:
   an oscillation cycle comparison subunit operable to perform the judgment of whether the number of times that the high-speed clock signal has been received by the reception unit in the predetermined time period is in the predetermined range, and output an oscillation cycle match signal upon judging affirmatively, and
   the signal output unit includes:
   a match counter operable to receive the oscillation cycle match signal output from the oscillation cycle comparison subunit, and count a number of times that the oscillation cycle match signal has been received to generate a match counter value;
   a judgment number setting storage subunit storing therein a judgment number value; and
   an oscillation stability judgment subunit operable to compare the match counter value and the judgment number value, and perform the output of the stability detection signal if the match counter value is greater than or equal to the judgment number value.

7. The semiconductor integrated circuit of claim 6, wherein the oscillation cycle judgment unit further includes:
   a counter number setting storage subunit storing therein a set value; and
   a high-speed clock counter operable to count the number of times that the high-speed clock signal has been received by the reception unit in the predetermined time period to generate a high-speed clock counter value, wherein each time the low-speed clock signal has been received the predetermined number of times by the reception unit, the oscillation cycle comparison subunit performs the judgment of whether the number of times that the high-speed clock signal has been received by the reception unit in the predetermined time period is in the predetermined range, based on the high-speed clock counter value and the set value, and outputs the oscillation cycle match signal upon judging affirmatively.

8. The semiconductor integrated circuit of claim 1, wherein the oscillation cycle judgment unit includes:

an oscillation cycle comparison subunit operable to perform the judgment of whether the number of times that the high-speed clock signal has been received by the reception unit in the predetermined time period is in the predetermined range, output an oscillation cycle match signal upon judging affirmatively, and output an oscillation cycle mismatch signal upon judging negatively, and the signal output unit includes:

a match counter operable to receive the oscillation cycle match signal and the oscillation cycle mismatch signal, and each time a signal is received, one of increment and decrement a match counter value in accordance with which of the oscillation cycle match signal and the oscillation cycle mismatch signal was received;

a judgment number setting storage subunit storing therein a judgment number value; and an oscillation stability judgment subunit operable to compare the match counter value and the judgment number value, and control the output of the stability detection signal based on a result of the comparison.

9. The semiconductor integrated circuit of claim 8, wherein the match counter increments the match counter value upon receiving the oscillation cycle match signal, and decrements the match counter value upon receiving the oscillation cycle mismatch signal, and the oscillation stability judgment subunit compares the match counter value and the judgment number value, and performs the output of the stability detection signal if the match counter value has reached the judgment number value.

10. The semiconductor integrated circuit of claim 9, wherein the oscillation cycle judgment unit further includes:

a counter number setting storage subunit storing therein a set value; and a high-speed clock counter operable to count the number of times that the high-speed clock signal has been received by the reception unit in the predetermined time period to generate a high-speed clock counter value, wherein each time the low-speed clock signal has been received the predetermined number of times by the reception unit, the oscillation cycle comparison subunit (i) performs the judgment of whether the number of times that the high-speed clock signal has been received by the reception unit in the predetermined time period is in the predetermined range, based on the high-speed clock counter value and the set value, (ii) outputs the oscillation cycle match signal upon judging affirmatively, and (iii) outputs the oscillation cycle mismatch signal upon judging negatively.

11. The semiconductor integrated circuit of claim 1, further comprising:

an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, wherein after causing the oscillation cycle judgment unit to perform the judgment in accordance with the predetermined timing, the oscillation cycle monitor unit outputs an oscillation abnormality detection signal if the oscillation cycle judgment unit judges negatively.

12. The semiconductor integrated circuit of claim 6, further comprising:

an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, the oscillation cycle monitor unit including:

a detection signal reception subunit operable to receive the oscillation cycle match signal and the stability detection signal;

a suppression subunit operable to, after the semiconductor integrated circuit has begun operating, cause the oscillation cycle comparison subunit to perform the judgment until the stability detection signal is received by the detection signal reception subunit, and suppress the judgment after the stability detection signal has been received by the detection signal reception subunit;

a judgment control subunit operable to, upon reaching the predetermined timing after the suppression subunit has suppressed the judgment performed by the oscillation cycle comparison subunit, for a fixed time period, stop the suppression performed by the suppression subunit and cause the oscillation cycle comparison subunit to perform the judgment; and an abnormality detection output subunit operable to output an abnormality detection signal if the oscillation cycle match signal has not been received by the detection signal reception subunit in a predetermined time period from when the fixed time period began.

13. The semiconductor integrated circuit of claim 8, further comprising:

an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, the oscillation cycle monitor unit including:

a detection signal reception subunit operable to receive the oscillation cycle mismatch signal and the stability detection signal;

a suppression subunit operable to, after the semiconductor integrated circuit has begun operating, cause the oscillation cycle comparison subunit to perform the judgment until the stability detection signal is received by the detection signal reception subunit, and suppress the judgment after the stability detection signal has been received by the detection signal reception subunit;

a judgment control subunit operable to, upon reaching the predetermined timing after the suppression subunit has suppressed the judgment performed by the oscillation cycle comparison subunit, for a fixed time period, stop the suppression performed by the suppression subunit and cause the oscillation cycle comparison subunit to perform the judgment; and an abnormality detection output subunit operable to output an abnormality detection signal if the oscillation cycle mismatch signal has been received by the detection signal reception subunit in a predetermined time period from when the fixed time period began.

14. The semiconductor integrated circuit of claim 1, further comprising:

a low-speed clock counter operable to count a number of times that the low-speed clock signal has been received by the reception unit after a predetermined timing pertaining to a beginning of operation of the semiconductor integrated circuit, to generate a low-speed clock counter value;

an oscillation stabilization timing storage unit storing therein a judgment commencement value; and a start-up timing control unit operable to suppress the judgment performed by the oscillation cycle judgment unit, until the low-speed clock counter value reaches the judgment commencement value.

15. The semiconductor integrated circuit of claim 1, further comprising:

a low-speed clock counter operable to count a number of times that the low-speed clock signal has been received by the reception unit after a predetermined timing pertaining to a beginning of operation of the semiconductor integrated circuit, to generate a low-speed clock counter value;

an oscillation stabilization timing storage unit storing therein a judgment commencement value; and a start-up timing comparison unit, wherein the oscillation stabilization timing storage unit performs the storing by, when the oscillation cycle judgment unit judges affirmatively, acquiring the low-speed clock counter value of the low-speed clock counter at a timing of the affirmative judgment, and storing the acquired low-speed clock counter value as the judgment commencement value, and if the judgment commencement value is stored in the oscillation stabilization timing storage unit, the start-up timing comparison unit compares the judgment commencement value and the low-speed clock counter value, suppresses the judgment performed by the oscillation cycle judgment unit until the low-speed clock counter value reaches the judgment commencement value, and stops the suppression when the low-speed clock counter value reaches the judgment commencement value.

16. The semiconductor integrated circuit of claim 1, further comprising:

a low-speed clock counter operable to count a number of times that the low-speed clock signal has been received by the reception unit after a predetermined timing pertaining to a beginning of operation of the semiconductor integrated circuit, to generate a low-speed clock counter value;

an oscillation stabilization timing storage unit storing therein a stabilization timing value;

a detection signal reception unit operable to receive the stability detection signal output from the signal output unit; and a hold-for-oscillation-stability control unit operable, (i) when the stability detection signal has been received by the detection signal reception unit, to acquire the low-speed clock counter value of the low-speed clock counter unit at a timing of an affirmative judgment that was performed by the oscillation cycle judgment unit pertaining to the output of the received stability detection signal, and store the acquired low-speed clock counter value in the oscillation stabilization timing storage unit as the stabilization timing value, and, (ii) if the stabilization timing value is stored in the oscillation stabilization timing storage unit, to suppress the judgment performed by the oscillation cycle judgment unit, compare the low-speed clock counter value and the stabilization timing value, and output the stability detection signal when the low-speed clock counter value reaches the stabilization timing value.

17. The semiconductor integrated circuit of claim 2, further comprising:

an oscillation cycle monitor unit operable to, if the stability detection signal has been output from the signal output unit, suppress the judgment performed by the oscillation cycle judgment unit, and thereafter cause the oscillation cycle judgment unit to perform the judgment in accordance with a predetermined timing, the oscillation cycle monitor unit including:

a detection signal reception subunit operable to receive the stability detection output from the signal output unit;

a suppression subunit operable to, after the semiconductor integrated circuit has begun operating, cause the oscillation cycle judgment unit to perform the judgment until the stability detection signal is received by the detection signal reception subunit, and suppress the judgment after the stability detection signal has been received by the detection signal reception subunit;

a judgment control subunit operable to, upon reaching the predetermined timing after the suppression subunit has suppressed the judgment performed by the oscillation cycle judgment unit, for a fixed time period, stop the suppression performed by the suppression subunit and cause the oscillation cycle judgment unit to perform the judgment;

a measurement period determination subunit operable to determine a length of the predetermined time period pertaining to the judgment that is performed by the oscillation cycle judgment unit under control of the judgment control subunit;

a set value control subunit operable to cause the counter number setting storage subunit to store the set value, which is in accordance with the length of the predetermined time period determined by the measurement period determination subunit; and an abnormality detection output subunit operable to output an abnormality detection signal if the stability detection signal has not been received by the detection signal reception subunit in a predetermined time period from when the fixed time period began, wherein the judgment control subunit causes the oscillation cycle judgment unit to perform the judgment in accordance with the length of the predetermined time period determined by the measurement period determination subunit.

18. The semiconductor integrated circuit of claim 1, wherein the predetermined time period pertaining to the judgment performed by the oscillation cycle judgment unit is one clock cycle of the low-speed clock signal.

19. The semiconductor integrated circuit of claim 1, wherein
the predetermined range pertaining to the judgment performed by the oscillation cycle judgment unit is based on a value indicating a ratio between a clock frequency of the high-speed clock signal and a clock frequency of the low-speed clock signal.

20. The semiconductor integrated circuit of claim 2, wherein
the set value stored in the counter number setting register is based on a value indicating a ratio between a clock frequency of the high-speed clock signal and a clock frequency of the low-speed clock signal.

21. The semiconductor integrated circuit of claim 1, being for detecting that the high-speed clock signal supplied to a predetermined circuit is being stably generated, and further comprising:
a first clock gating circuit operable to block the supply of the high-speed clock signal to the predetermined circuit until the stability detection signal is output, and stop the blocking after the stability detection signal has been output; and
a second clock gating circuit operable to allow the supply of the low-speed clock signal and the high-speed clock signal to the semiconductor integrated circuit until the stability detection signal is output, and block the supply of the low-speed clock signal and the high-speed clock signal after the stability detection signal has been output, wherein
the signal output unit outputs the stability detection signal to the first clock gating circuit and the second clock gating circuit.

22. A semiconductor integrated circuit for detecting that a high-speed clock signal is being stably generated, comprising:
a reception unit operable to periodically receive the high-speed clock signal and a low-speed clock signal;
an oscillation cycle judgment unit operable to, each time the low-speed clock signal has been received a predetermined number of times by the reception unit, judge whether a number of times that the high-speed clock signal has been received by the reception unit in a predetermined time period is in a predetermined range, the predetermined time period being based on a reception period during which the low-speed clock signal was received the predetermined number of times;
an oscillation stability judgment unit operable to (i) each time the low-speed clock signal has been received the predetermined number of times by the reception unit, store, as a stored value in a history, a number of times that the high-speed clock signal was received by the reception unit in the predetermined time period, and (ii) judge whether the numbers of times indicated in the history satisfy a predetermined condition; and
a signal output unit operable to output a stability detection signal if both the oscillation cycle judgment unit and the oscillation stability judgment unit judged affirmatively.

23. The semiconductor integrated circuit of claim 22, wherein
the predetermined condition is that a difference between a pair of numbers of times indicated in the history is less than or equal to a predetermined value.

24. The semiconductor integrated circuit of claim 23, wherein
the oscillation stability judgment unit includes:
a high-speed clock history storage subunit operable to, each time the low-speed clock signal has been received the predetermined number of times by the reception unit, perform the storing of, as a stored value in the history, a number of times that the high-speed clock signal was received by the reception unit in the predetermined time period; and
a difference judgment subunit operable to judge whether a difference between (i) a first stored value stored in the high-speed clock history subunit and (ii) a second stored value stored in the high-speed clock history subunit prior to the first stored value is less than or equal to the predetermined value, and
the signal output unit outputs the stability detection signal if both the difference judgment subunit and the oscillation cycle judgment unit judge affirmatively.

25. The semiconductor integrated circuit of claim 24, further comprising:
a high-speed clock counter operable to count the number of times that the high-speed clock signal has been received by the reception unit in the predetermined time period to generate a high-speed clock counter value, wherein
the high-speed clock history storage subunit performs the storing by, each time the low-speed clock signal has been received the predetermined number of times by the reception unit, acquiring the high-speed clock counter value of the high-speed clock counter, and storing the acquired high-speed clock counter value as a stored value in the history.

26. A semiconductor integrated circuit for detecting that a high-speed clock signal is being stably generated, comprising:
a reception unit operable to periodically receive the high-speed clock signal and a low-speed clock signal;
an oscillation cycle judgment unit operable to, each time the low-speed clock signal has been received a predetermined number of times by the reception unit, judge whether a number of times that the high-speed clock signal has been received by the reception unit in a predetermined time period is in a predetermined range, the predetermined time period being based on a reception period during which the low-speed clock signal was received the predetermined number of times;
a low-speed clock counter operable to count a number of times that the low-speed clock signal has been received by the reception unit to generate a low-speed clock counter value;
a low-speed clock history storage unit operable to, each time the oscillation cycle judgment unit judges affirmatively, acquire the low-speed clock counter value of the low-speed clock counter at a timing of the affirmative judgment, and store the acquired low-speed clock counter value in a history;
a low-speed clock history judgment unit operable to, with reference to the history stored in the low-speed clock history storage unit, judge whether each of a plurality of low-speed clock counter values in the history satisfies a predetermined condition; and
a signal output unit operable to output a stability detection signal if a number of times that the low-speed clock history judgment unit judged affirmatively has reached a fixed number.

27. The semiconductor integrated circuit of claim 26, wherein
the predetermined condition is that a difference between (i) a first counter value stored in the low-speed clock history subunit and (ii) a second counter value stored in the low-speed clock history subunit prior to the first counter value is less than or equal to a predetermined value.

28. An information processing system that switches between operations modes while operating, the operation modes including a normal mode in which the information processing system operates with use of a high-speed clock signal and a standby mode in which the information processing system operates with use of a low-speed clock signal, the information processing system including:
- a semiconductor integrated circuit operable to, each time the information processing system is to switch from the standby mode to the normal mode, detect whether the high-speed clock signal is being stably generated by a high-speed oscillator, wherein
- the information processing system completes the switch from the standby mode to the normal mode upon the semiconductor integrated circuit detecting that the high-speed clock signal is being stably generated, and
- the semiconductor integrated circuit comprising:
  - a reception unit operable to periodically receive the high-speed clock signal and the low-speed clock signal;
  - an oscillation cycle judgment unit operable to, each time the low-speed clock signal has been received a predetermined number of times by the reception unit, judge whether a number of times that the high-speed clock signal has been received by the reception unit in a predetermined time period is in a predetermined range, the predetermined time period being based on a reception period during which the low-speed clock signal was received the predetermined number of times; and
  - a signal output unit operable to control output of a stability detection signal in accordance with a number of times that the oscillation cycle judgment unit has judged affirmatively.

29. An oscillation stability detection method for detecting that a high-speed clock signal is being stably generated, comprising the steps of:
- periodically receiving the high-speed clock signal and a low-speed clock signal;
- judging, each time the low-speed clock signal has been received a predetermined number of times in the reception step, whether a number of times that the high-speed clock signal has been received in the reception step in a predetermined time period is in a predetermined range, the predetermined time period being based on a reception period during which the low-speed clock signal was received the predetermined number of times; and
- controlling output of a stability detection signal in accordance with a number of affirmative judgments in the judgment step.

* * * * *